(12) United States Patent
Marder et al.

(10) Patent No.: US 8,039,625 B2
(45) Date of Patent: Oct. 18, 2011

(54) CORONENE CHARGE-TRANSPORT MATERIALS, METHODS OF FABRICATION THEREOF, AND METHODS OF USE THEREOF

(75) Inventors: Seth Marder, Atlanta, GA (US);
Zesheng An, Smyrna, GA (US);
Jungsheng Yu, Atlanta, GA (US);
Bernard Kippelen, Decatur, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 724 days.

(21) Appl. No.: 11/817,156

(22) PCT Filed: Feb. 28, 2006

(86) PCT No.: PCT/US2006/007094
§ 371 (c)(1),
(2), (4) Date: Aug. 18, 2008

(87) PCT Pub. No.: WO2006/093965
PCT Pub. Date: Sep. 8, 2006

(65) Prior Publication Data
US 2009/0044863 A1 Feb. 19, 2009

Related U.S. Application Data

(60) Provisional application No. 60/657,612, filed on Mar. 1, 2005.

(51) Int. Cl.
*C07D 471/08* (2006.01)
*H01L 51/50* (2006.01)
(52) U.S. Cl. ............... 546/28; 313/504; 430/58; 430/78
(58) Field of Classification Search .................... 546/28; 430/78, 58; 313/504
See application file for complete search history.

(56) References Cited

U.S. PATENT DOCUMENTS
4,454,211 A 6/1984 Takase et al.

FOREIGN PATENT DOCUMENTS
JP 58-007145 1/1983

OTHER PUBLICATIONS

Franceschin, M., et al., New Hydrosoluble Perylene and Coronene Derivatives, Tetrahed. Ltr Oct. 2004, vol. 45, pp. 9015-9020.
Rohr, U., et al., Liquid Crystalline Coronene Derivatives with Extraordinary Fluorescence Properties, Angew. Chem. Int. Ed., 1998, vol. 37, pp. 1434-1437.
Samori, P.. et al, Epitaxial Composite Layers of Electron Donors and Acceptors from Very Large Polycyclic Aromatic Hydrocarbons, J. Am. Chem. Soc. 2002, vol. 124, pp. 9454-9494.

*Primary Examiner* — Charanjit Aulakh
(74) *Attorney, Agent, or Firm* — Thomas, Kayden, Horstemeyer & Risley, LLP

(57) ABSTRACT

Briefly described, embodiments of this disclosure include coronene charge-transport materials, methods of forming coronene charge-transport materials, and methods of using the coronene charge-transport materials.

20 Claims, 19 Drawing Sheets

Absorption and emission spectra of ZA-VI-79 in dichloromethane.
Excitation at 427 nm.

CORONENE CHARGE-TRANSPORT MATERIALS, METHODS OF FABRICATION THEREOF, AND METHODS OF USE THEREOF

CROSS-REFERENCE TO RELATED APPLICATION

This application claims priority to U.S. provisional patent application entitled "Coronene containing materials for use in organic electronics and optoelectronics" filed on Mar. 1, 2005 and accorded Ser. No. 60/657,612, which is entirely incorporated herein by reference.

STATEMENT REGARDING FEDERALLY SPONSORED RESEARCH OR DEVELOPMENT

The U.S. government may have a paid-up license in embodiments of this disclosure and the right in limited circumstances to require the patent owner to license others on reasonable terms as provided for by the terms of grants awarded by the Office of Naval Research (grant number N00014-04-1-0120) and the National Science Foundation (grant number ECS-0352627) of the U.S. Government.

BACKGROUND

Charge-transport molecular and polymeric materials are semiconducting materials in which charges can migrate under the influence of an electric field. These charges may be present due to doping with oxidizing or reducing agents, so that some fraction of the transport molecules or polymer repeat units is present as radical cations or anions. More usually, charges are introduced by injection from another material under the influence of an electric field. Charge-transport materials may be classified into hole- and electron-transport materials. In a hole-transport material, electrons are removed, either by doping or injection, from a filled manifold of orbitals to give positively charged molecules or polymer repeat units. Transport takes place by electron-transfer between a molecule or polymer repeat unit and the corresponding radical cation; this can be regarded as movement of a positive charge (hole) in the opposite direction to this electronic motion. In an electron-transport material, extra electrons are added, either by doping or injection; here the transport process includes electron-transfer from the radical anion of a molecule or polymer repeat unit to the corresponding neutral species. In addition, some material, referred to as ambi-polar materials, may transport both holes and electrons.

SUMMARY

Briefly described, embodiments of this disclosure include coronene charge-transport materials; polymers, co-polymers, and homopolymers including coronene charge-transport materials; polymer layers including coronene charge-transport materials; mixtures including coronene charge-transport monomers; and devices including coronene charge-transport materials.

One exemplary coronene charge-transport material, among others, is a coronene charge-transport material monomer having a structure of Formula 1:

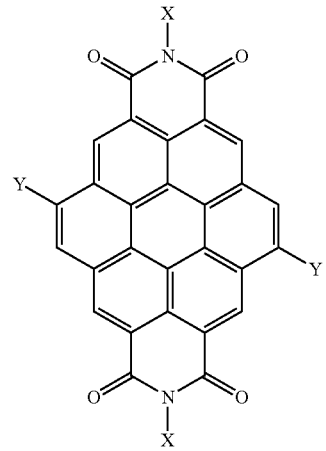

Formula 1 where Y in each instance can be independently selected from the following: H, CN, acceptors, donors, and a polymerizable group; and where X in each instance can be independently selected from the following: a polymerizable group; 3,4,5-trialkoxyphenyl; 3,4,5-trialkylphenyl; 3,4,5-tri-perfluorinated-alkylphenyl; 3,4,5-tri-perfluorinated-alkoxyphenyl; 3,4,5-tri-oligomeric-ether-substituted phenyl; 3,4,5-trialkoxybenzyl; 3,4,5-trialkylbenzyl; 3,4,5-tri-perfluorinated-alkyl benzyl; 3,4,5-tri-perfluorinated-alkoxy benzyl; 3,4,5-tri-oligomeric-ether-substituted benzyl; 3,4-dialkoxyphenyl, 3,4-dialkylphenyl; 3,4-di-perfluorinated-alkylphenyl; 3,4-di-perfluorinated-alkoxyphenyl; 3,4-di-oligomeric-ether-substituted phenyl; 3,4-dialkoxybenzyl; 3,4-dialkylbenzyl; 3,4-di-perfluorinated-alkylbenzyl; 3,4-di-perfluorinated-alkoxybenzyl; 3,4-di-oligomeric-ether-substituted benzyl; 3,5-dialkoxyphenyl; 3,5-dialkylphenyl; 3,5-di-perfluorinated-alkyl phenyl; 3,5-di-perfluorinated-alkoxy phenyl; 3,5-di-oligomeric-ether-substituted phenyl; 3,5-dialkoxybenzyl; 3,5-dialkylbenzyl; 3,5-di-perfluorinated-alkyl benzyl; 3,5-di-oligomeric-ether-substituted benzyl; or the following units:

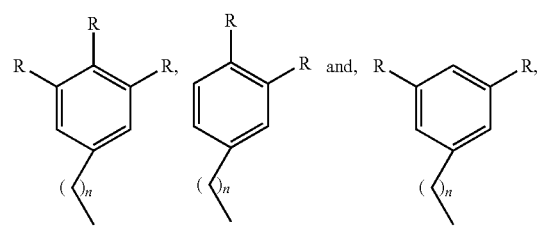

where R in each instance can be independently selected from the following: a polymerizable group, an alkyl, an alkoxy, a perfluorinated alkyl, a perfluorinated alkoxy, an oligomeric-ether, a dendritic group, and wherein the subscript n is a number from 0 to 20.

Another exemplary charge-transport material, among others, includes a coronene charge-transport material monomer having a structure of Formula 1 shown above: where Y in each instance can be independently selected from the following: H, CN, acceptors, donors, and a polymerizable group; and where X in each instance can be independently selected from the following: a polymerizable group, hydrogen, halogens, $C_1$-$C_{18}$-alkyl, aryloxy, arylthio, heteroaryloxy, and heteroarylthio, and wherein each can be independently substituted by the following: $C_1$-$C_{10}$-alkyl, $C_1$-$C_6$-alkoxy, cyano, and carboxyl.

An exemplary charge-transport material, among others, includes a coronene charge-transport material monomer having a structure of Formula 1 shown above: where Y in each instance can be independently selected from the following: H, CN, acceptors, donors, and a polymerizable group; and where X in each instance can be independently selected from the following: a polymerizable group, methyl, ethyl, propyl, isopropyl, butyl, isobutyl, sec-butyl, tert-butyl, pentyl, isopentyl, neopentyl, tert-pentyl, hexyl, 2-methylpentyl, heptyl, 1-ethylpentyl, octyl, 2-ethylhexyl, isooctyl, nonyl, isononyl, decyl, isodecyl, undecyl, dodecyl, tridecyl, isotridecyl, tetradecyl, pentadecyl, hexadecyl, heptadecyl, octadecyl, nonadecyl and eicosyl; 2-methoxyethyl, 2-ethoxyethyl, 2-propoxyethyl, 2-isopropoxyethyl, 2-butoxyethyl, 2-methoxypropyl, 3-methoxypropyl, 2-ethoxypropyl, 3-ethoxypropyl, 2-propoxypropyl, 3 propoxypropyl, 2-butoxypropyl, 3-butoxypropyl, 2-methoxybutyl, 4-methoxybutyl, 2-ethoxybutyl, 4-ethoxybutyl, 2-propoxybutyl, 4-propoxybutyl, 3,6-dioxaheptyl, 3,6-dioxaoctyl, 4,8-dioxanonyl, 3,7-dioxaoctyl, 3,7-dioxanonyl, 4,7-dioxaoctyl, 4,7-dioxanonyl, 2- and 4-butoxybutyl, 4,8-dioxadecyl, 3,6,9-trioxadecyl, 3,6,9-trioxaundecyl, 3,6,9-trioxadodecyl, 3,6,9,12-tetraoxatridecyl and 3,6,9,12-tetraoxatetradecyl; 2-methylthioethyl, 2-ethylthioethyl, 2-propylthioethyl, 2-isopropylthioethyl, 2-butylthioethyl, 2-methylthiopropyl, 3-methylthiopropyl, 2-ethylthiopropyl, 3-ethylthiopropyl, 2-propylthiopropyl, 3-propylthiopropyl, 2-butylthiopropyl, 3-butylthiopropyl, 2-methylthiobutyl, 4-methylthiobutyl, 2-butylthiopropyl, 4-ethylthiobutyl, 2-propylthiobutyl, 4-propylthiobutyl, 3,6-dithiaheptyl, 3,6-dithiaoctyl, 4,8-dithianonyl, 3,7-dithiaoctyl, 3,7-dithianonyl, 4,7-dithiaoctyl, 4,7-dithianonyl, 2-butylthiobutyl, 4-butylthiobutyl, 4,8-dithiadecyl, 3,6,9-trithiadecyl, 3,6,9-trithiaundecyl, 3,6,9-trithiadodecyl, 3,6,9, 12-tetrathiamidecyl, 3,6,9,12-tetrathiatetradecyl; 2-monomethylaminoethyl, 2-monoethylaminoethyl, 2-dimethylaminoethyl, 2-dimethylaminopropyl, 3-dimethylaminopropyl, 3-monoisopropylaminopropyl, 2-monopropylaminobutyl, 4-monopropylaminobutyl, 2-dimethylaminobutyl, 4-dimethylaminobutyl, 6-methyl-3,6-diazaheptyl, 3,6-dimethyl-3,6-diazaheptyl, 3,6-diazaoctyl, 3,6-dimethyl-3,6-diazaoctyl, 9-methyl-3,6,9-triazadecyl, 3,6,9-trimethyl-3,6,9-triazadecyl, 3,6,9-triazaundecyl, 3,6,9-trimethyl-3,6,9-triazaundecyl, 12-methyl-3,6,9,12-tetraazatridecyl and 3,6,9, 12-tetramethyl-3,6,9,12-tetraazatridecyl; propan-2-on-1-yl, butan-3-on-1-yl, butan-3-on-2-yl and 2-ethylpentan-3-on-1-yl; 2-methylsulfonylethyl, 2-ethylsulfonylethyl, 2-propylsulfonylethyl, 2-isopropylsulfonylethyl, 2-butylsulfonylethyl, 2-methylsulfonylpropyl, 3-methylsulfonylpropyl, 2-ethylsulfonylpropyl, 3-ethylsulfonylpropyl, 2-propylsulfonylpropyl, 3-propylsulfonylpropyl, 2-butylsulfonylpropyl, 3-butylsulfonylpropyl, 2-methylsulfonylbutyl, 4-methylsulfonylbutyl, 2-ethylsulfonylbutyl, 4-ethylsulfonylbutyl, 2-propylsulfonylbutyl, 4-propylsulfonylbutyl, and 4-butylsulfonylbutyl; carboxymethyl, 2-carboxyethyl, 3-carboxypropyl, 4-carboxybutyl, 5-carboxypentyl, 6-carboxyhexyl, 8-carboxyoctyl, 10-carboxydecyl, 12-carboxydodecyl and 14-carboxytetradecyl; sulfomethyl, 2-sulfoethyl, 3-sulfopropyl, 4-sulfobutyl, 5-sulfopentyl, 6-sulfohexyl, 8-sulfooctyl, 10-sulfodecyl, 12-sulfododecyl and 14-sulfotetradecyl; 2-hydroxyethyl, 2-hydroxypropyl, 1-hydroxyprop-2-yl, 2-hydroxybutyl, 4-hydroxybutyl, 1-hydroxybut-2-yl and 8-hydroxy-4-oxaoctyl, 2-cyanoethyl, 3-cyanopropyl, 2-methyl-3-ethyl-3-cyanopropyl, 7-cyano-7-ethylheptyl and 4-methyl-7-methyl-7-cyanoheptyl; methoxy, ethoxy, propoxy, isopropoxy, butoxy, isobutoxy, sec-butoxy, tert-butoxy, pentoxy, isopentoxy, neopentoxy, tert-pentoxy and hexoxy; carbamoyl, methylaminocarbonyl, ethylaminocarbonyl, propylaminocarbonyl, butylaminocarbonyl, pentylaminocarbonyl, hexylaminocarbonyl, heptylaminocarbonyl, octylaminocarbonyl, nonylaminocarbonyl, decylaminocarbonyl and phenylaminocarbonyl; formylamino, acetylamino, propionylamino and benzoylamino; chlorine, bromine and iodine; phenylazo, 2-naphthylazo, 2-pyridylazo and 2-pyrimidylazo; cyclopentyl, cyclohexyl, cycloheptyl, cyclooctyl, 2-dioxanyl, 4-morpholinyl, 2-tetrahydrofuryl, 3-tetrahydrofuryl, 1-pyrrolidinyl, 2-pyrrolidinyl, 3-pyrrolidinyl and 1-piperidyl, 2-piperidyl, 3-piperidyl, and 4-piperidyl; phenyl, 2-naphthyl, 2-pyrryl, and 3-pyrryl, 2-pyridyl, 3-pyridyl, 4-pyridyl, 2-pyrimidyl, 4-pyrimidyl, 5-pyrimidyl, 3-pyrazolyl, 4-pyrazolyl, 5-pyrazolyl, 2-imidazolyl, 4-imidazolyl, 5-imidazolyl, 2-thiazolyl, 4-thiazolyl, 5-thiazolyl, 3-(1,2,4-triazyl), 2-(1,3, 5-triazyl), 6-quinaldyl, 3-quinolinyl, 5-quinolinyl, 6-quinolinyl, 8-quinolinyl, 2-benzoxazolyl, 2-benzothiazolyl, 5-benzothiadiazolyl, 2-benzimidazolyl, 5-benzimidazolyl, and 1-isoquinolyl, and 5-isoquinolyl; 2-methylphenyl, 3-methylphenyl, 4-methylphenyl, 2,4-dimethylphenyl, 3,5-dimethylphenyl, 2,6-dimethylphenyl, 2,4,6-trimethylphenyl, 2-ethylphenyl, 3-ethylphenyl, 4-ethylphenyl, 2,4-diethylphenyl, 3,5-diethylphenyl, 2,6-diethylphenyl, 2,4,6-triethylphenyl, 2-propylphenyl, 3-propylphenyl, 4-propylphenyl, 2,4-, 3,5- and 2,6-dipropylphenyl, 2,4,6-tripropylphenyl, 2-isopropylphenyl, 3-isopropylphenyl, 4-isopropylphenyl, 2,4-diisopropylphenyl, 3,5-diisopropylphenyl, 2,6-diisopropylphenyl, 2,4,6-triisopropylphenyl, 2-butylphenyl, 3-butylphenyl, 4-butylphenyl, 2,4-dibutylphenyl, 3,5-dibutylphenyl, 2,6-dibutylphenyl, 2,4,6-tributylphenyl, 2-isobutylphenyl, 3-isobutylphenyl, 4-isobutylphenyl, 2,4-diisobutylphenyl, 3,5-diisobutylphenyl, 2,6-diisobutylphenyl, 2,4,6-triisobutylphenyl, 2-butylphenyl, 3-butylphenyl, 4-sec-butylphenyl, 2,4-, 3,5- and 2,6-di-sec-butylphenyl and 2,4,6-tri-sec-butylphenyl; 2-methoxyphenyl, 3-methoxyphenyl, 4-methoxyphenyl, 2,4-dimethoxyphenyl, 3,5-dimethoxyphenyl, 2,6-dimethoxyphenyl, 2,4,6-trimethoxyphenyl, 2-ethoxyphenyl, 3-ethoxyphenyl, 4-ethoxyphenyl, 2,4-diethoxyphenyl, 3,5-diethoxyphenyl, 2,6-diethoxyphenyl, 2,4,6-triethoxyphenyl, 2-propoxyphenyl, 3-propoxyphenyl, 4-propoxyphenyl, 2,4-dipropoxyphenyl, 3,5-dipropoxyphenyl, 2,6-dipropoxyphenyl, 2-isopropoxyphenyl, 3-isopropoxyphenyl, 4-isopropoxyphenyl, 2,4-diisopropoxyphenyl, 2,6-diisopropoxyphenyl, 2-butoxyphenyl, 3-butoxyphenyl, and 4-butoxyphenyl; 2-chlorophenyl, 3-chlorophenyl, 4-chlorophenyl, 2,4-dichlorophenyl, 3,5-dichlorophenyl, and 2,6-dichlorophenyl; 2-hydroxyphenyl, 3-hydroxyphenyl, 4-hydroxyphenyl, 2,4-dichlorophenyl, 3,5-dichlorophenyl, and 2,6-dichlorophenyl; 2-hydroxyphenyl, 3-hydroxyphenyl, 4-hydroxyphenyl, 2,4-dihydroxyphenyl, 3,5-dihydroxyphenyl, and 2,6-dihydroxyphenyl; 2-cyanophenyl, 3-cyanophenyl, and 4-cyanophenyl; 3-carboxyphenyl and 4-carboxyphenyl; 3-carboxyamidophenyl, 4-carboxyamidophenyl, 3-N-methylcarboxamidophenyl, 4-N-methylcarboxamidophenyl, 3-N-ethylcarboxamidophenyl, and 4-N-ethylcarboxamidophenyl; 3-acetylaminophenyl, 4-acetylaminophenyl, 3-propionylaminophenyl, 4-propionylaminophenyl, 3-butyrylaminophenyl, and 4-butyrylaminophenyl; 3-phenylaminophenyl, 4-N-phenylaminophenyl, 3-(o-tolyl)aminophenyl, 4-N-(o-tolyl)aminophenyl, 3-(m-tolyl)aminophenyl, 4-N-(m-tolyl)aminophenyl, 3-(p-tolyl)aminophenyl, and 4-(p-tolyl)aminophenyl; 3-(2-pyridyl)aminophenyl, 4-(2-pyridyl)aminophenyl, 3-(3-pyridyl)aminophenyl, 4-(3-pyridyl)aminophenyl, 3-(4-pyridyl)aminophenyl, 4-(4-pyridyl)aminophenyl, 3-(2-pyrimidyl)aminophenyl, 4-(2-pyrimidyl)aminophenyl, and 4-(4-pyrimidyl)aminophenyl; 4-phenylazophenyl, 4-(1-naphthylazo)phenyl, 4-(2-naphthylazo)phenyl, 4-(4-naphthylazo)phenyl, 4-(2-pyridylazo)phenyl, 4-(3-pyridylazo)phenyl, 4-(4-pyridylazo)phenyl, 4-(2-pyrimidylazo)phenyl, 4-(4-pyrimidylazo)phenyl and 4-(5-pyrimidylazo)phenyl; and phenoxy, phenylthio, 2-naphthoxy, 2-naphthylthio, 2-pyridyloxy, 3-pyridyloxy, 4-pyridyloxy, 2-pyridylthio, 3-pyridylthio, 4-pyridylthio, 2-pyrimidyloxy, 4-pyrimidyloxy, 5-pyrimidyloxy, 2-pyrimidylthio, 4-pyrimidylthio, and 5-pyrimidylthio.

Embodiments of the present disclosure also include a polymer, co-polymer, or a homopolymer, among others, that can include one or more of a monomer such as, but not limited to, a monomer having the structure of Formula 1 as described herein and combinations thereof.

Embodiments of the present disclosure also include a device, among others, that can include one or more of a monomer such as, but not limited to, a monomer including one or more of a monomer of Formula 1 described herein and combinations thereof.

Embodiments of the present disclosure also include a polymer layer, among others, that can include one or more of a monomer such as, but not limited to, a monomer selected from one or more of the monomers of Formula 1 described herein and combinations thereof.

Embodiments of the present disclosure also include a material, among others, that includes a mixture of components including a monomer, a polymer including the monomer, a co-polymer including the monomer, a homopolymer including the monomer, and combinations thereof. The monomer is one or more of monomers of Formula 1 as described above and combinations thereof. An amount of each monomer present in the mixture is selected to control at least one property of the mixture, where the property includes one of: volatility, solubility, crystallinity, melting point, phase transitions, shelf life, charge-transport ability, and combinations thereof.

Embodiments of the present disclosure also include a material, among others, that includes a mixture of components including a compound including one or more of the monomers of Formula 1 as described above and combinations thereof. An amount of each compound present in the mixture is selected to control at least one property of the mixture, where the property includes one of: volatility, solubility, crystallinity, melting point, phase transitions, shelf life, charge-transport ability, and combinations thereof.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
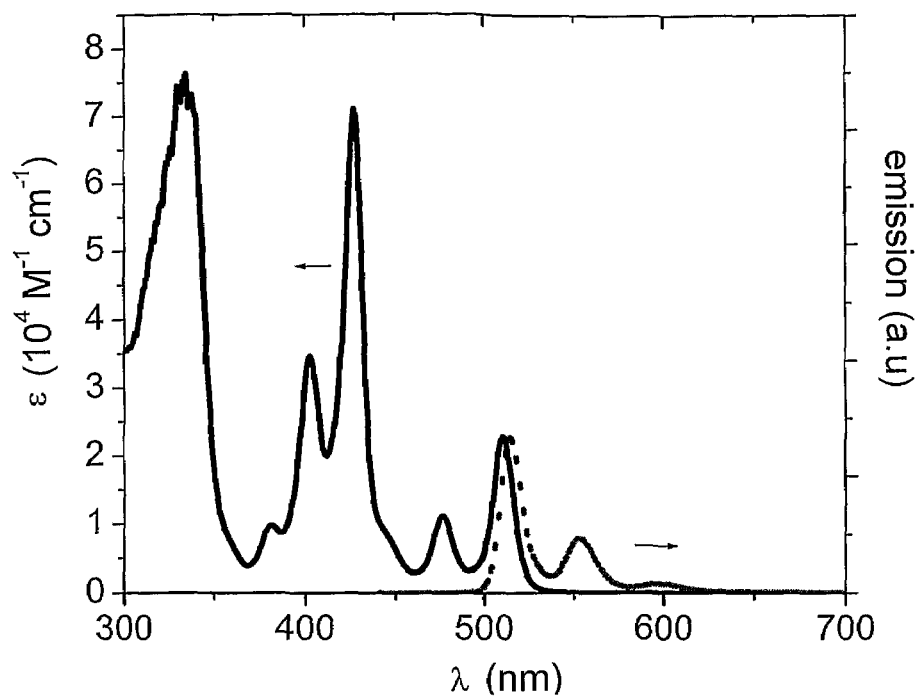
FIG. 1 illustrates the absorption and emission of ZA-VI-79 in dichloromethane, where the excitation is at about 427 nm.

In accordance with the purpose(s) of the present disclosure, as embodied and broadly described herein, embodiments of the present disclosure, in one aspect, relate to coronene (e.g., coronene diimide) charge-transport materials, methods of making coronene charge-transport materials, and methods of using and devices that include coronene charge-transport materials.

The coronene diimide charge-transport materials include a coronene diimide core having side chains (groups including groups to help make the molecule a mesogens) attached to the core. In general, coronene diimide charge-transport materials have strong intermolecular overlap and low reorganization energies, coupled with the tunability of redox potentials, of glass-, crystal-, and liquid-crystal-forming abilities, of the delocalization of electronic structure, and of the degree of molecular and materials anisotropy. In particular, the side chains of the coronene diimide charge-transport cores can be selected to provide charge-transport materials having various volatilities, solubilities, crystallinity, and/or charge transport ability, as well as being a hole-transport material or an electron-transport material. In other words, the side chains can be selected to "tune" the characteristics of the coronene diimide charge-transport materials as needed.

The coronene diimide charge-transport materials described herein can be used in a wide variety of electronic applications that include, but are not limited to, active electronic components, passive electronic components, electroluminescent (EL) devices (e.g., organic light emitting devices (OLEDs)), photovoltaic cells, light-emitting diodes, field-effect transistors, phototransistors, radio-frequency ID tags, semiconductor devices, photoconductive diodes, metal-semiconductor junctions (e.g., Schottky barrier diodes), p-n junction diodes, p-n-p-n switching devices, photodetectors, optical sensors, phototransducers, bipolar junction transistors (BJTs), heterojunction bipolar translators, switching transistors, charge-transfer devices, thin-film transistors, organic radiation detectors, infra-red emitters, tunable microcavities for variable output wavelength, telecommunications devices and applications, optical computing devices, optical memory devices, chemical detectors, combinations thereof, and the like.

In addition, the coronene diimide charge-transport materials can also be used to modify the surfaces of other material components, with the aim of improving mechanical contact between materials and/or improving charge-transport from one material to another.

The disclosed coronene diimide charge-transport materials can exist as crystals, mesoscopic phases, polymers, glasses, liquids, gases, and combinations thereof. The state of coronene diimide charge-transport materials can be altered by processing the coronene diimide charge-transport materials, mixing the coronene diimide charge-transport materials with other materials, using different side chains in the coronene diimide charge-transport materials relative to other coronene diimide charge-transport materials, combinations thereof, and the like. One skilled in the art could modify embodiments of the present disclosure to alter the state of the coronene diimide charge-transport materials, and these modifications are intended to be covered in this disclosure.

In general the coronene diimide charge-transport material compounds can be processed to produce a highly ordered mesophase morphology. When the coronene diimide charge-transport materials are used to form a layered thin film, the molecules have a preferential orientation in space. In particular, the coronene diimide charge-transport materials can have a certain degree of long-range orientational molecular order and long-range translational molecular order. The mesophase ordering allows close packing of molecular pi-electron systems (e.g., closely packed conjugated aromatic rings, in which very close pi-pi stacking can occur). Pi-pi stacking allows intermolecular charge transport to occur more easily, leading to high charge-carrier mobilities, which increases intermolecular charge transfer that occurs through a hopping mechanism between adjacent molecules. In particular, the coronene diimide charge-transport material compounds can stack (e.g., in parallel planes) in the form of well-defined columns (e.g., the aromatic cores in one layer are substantially aligned with the aromatic cores in adjacent layers) forming one dimensional paths for charge transport along the stacked conjugated cores due to the good intermolecular overlap within the stacks.

This ordered and oriented microstructure can be made substantially permanent by polymerizing the coronene diimide charge-transport materials, which can also create a structure with long-range order, or a "monodomain." Formation of a monodomain also maximizes charge transfer by eliminating charge trap sites at grain boundaries, while the polymerization also improves the mechanical properties of the film. Further, by cross-linking the charge-transport material compounds, a highly stable structure results, which has an additional advantage of being substantially impervious to subsequent processing solvents during device fabrication, thus allowing a wider range of solvents to be used in deposition of the next layer of the device by solution techniques. In addition, cross-linking may increase the density of the film, leading to smaller intermolecular distances and improved charge transport.

The disclosed coronene diimide charge-transport materials can be in a liquid-crystalline phase or can show liquid crystal phase behavior in mixtures with other compounds. Additionally, when the compounds or materials, or the mixtures thereof, are polymerized, they are in a liquid-crystalline phase. As used herein, a "liquid-crystalline phase" or "liquid crystal phase" includes a phase that is intermediate to a liquid phase and a crystalline phase. In the liquid crystalline phase, the orientations of a portion of the coronene diimide charge-transport material compounds are correlated to each other (e.g., the orientation of each individual coronene diimide charge-transport material compound is affected and is affecting the orientation of the neighboring coronene diimide charge-transport material compound), and the correlation can extend to a large scale (e.g., equal to or larger than 1 micron) so that a substantial portion of the coronene diimide charge-transport material compounds are orientated (e.g., the central aromatic cores are substantially aligned in subsequent layers to form a one-dimensional column for charge transport). The orientation-correlation in liquid crystals allows one to control the orientations of the coronene diimide charge-transport material compounds with the aid of an electrical field, a magnetic field, or a pre-treated surface, so that one can switch the orientation or diminish the unwanted effect of the local environment (e.g., impurities).

The alignment of the molecules of the liquid crystals is conventionally regarded as being in alignment with respect to a vector called the director. Unlike in the solid phase, in the crystalline state the positions of the molecules in the liquid crystal phase do not have long-range order in at least one direction. For example, discotic liquid-crystalline mesophases include quasi-two-dimensional molecules, which include a rigid conjugated core and flexible side chains (e.g., coronene diimide charge-transport molecules). The coronene diimide charge-transport material compounds in the discotic liquid-crystalline mesophase can stack in the form of well-defined columns, forming one dimensional paths for charge transport along the stacked conjugated cores due to the good intermolecular overlap within the stacks.

Alignment of the liquid crystal material can be achieved, for example, by application of a magnetic and/or electric field (e.g., oscillating electromagnetic radiation), by treatment of the substrate onto which the material is coated, by shearing the material during or after coating, by application of a magnetic and/or electric field (e.g., oscillating electromagnetic radiation) to the coated material, and/or by the addition of surface-active compounds to the liquid crystal material. Reviews of alignment techniques are given, for example by, I. Sage in "Thermotropic Liquid Crystals", edited by G. W. Gray, John Wiley & Sons, 1987, pages 75-77, and by T. Uchida and H. Seki in "Liquid Crystals—Applications and Uses Vol. 3", edited by B. Bahadur, World Scientific Publishing, Singapore 1992, pages 1-63. A review of alignment materials and techniques is given by J. Cognard, Mol. Cryst. Liq. Cryst. 78, Supplement. (1981), pages 1-77.

Embodiments of compounds of the coronene diimide charge-transport materials are represented by Formula (1):

Formula 1

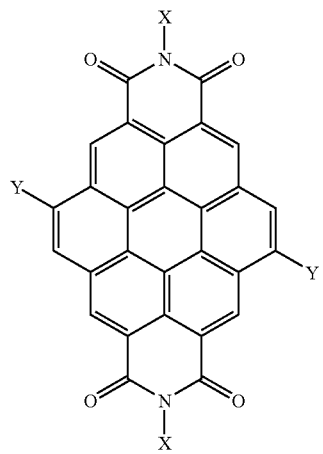

The coronene diimide charge-transport materials having Formula 1 are monomer units in a polymer of the charge-transport material, such as a homopolymer or a copolymer (e.g., block copolymers, random copolymers, alternating copolymers, periodic copolymers, and combinations thereof). The monomer units in embodiments of the copolymers can include coronene diimide charge-transport materials having Formula 1, as well as other monomer units consistent with the purposes and characteristics of the charge-transport materials described herein.

Various groups (e.g., atoms and compounds) or mesogenic units can be bonded to the coronene diimide charge-transport materials having Formula 1 to form a variety of charge-transport materials. The type of group and/or the combinations of groups that can be bonded to coronene diimide charge-transport materials having Formula 1 can be selected to tune the volatility, solubility, crystallinity, and/or charge transport ability, of the charge-transport material. In addition, the type of group and/or the combinations of groups that can be bonded to the coronene diimide charge-transport materials having Formula 1 can be selected to from a hole-transport material or an electron-transport material.

In coronene diimide charge-transport materials having Formula 1, an asterisk (*) in the structures shown below identifies the atom of attachment to a functional group and implies that the atom is missing one hydrogen that would normally be implied by the structure in the absence of the asterisk. Also note the following: "—" indicates a single bond between 2 atoms, "=" indicates a double bond between 2 atoms, and "≡" indicates a triple bond between 2 atoms.

In Formula 1, the groups can include from one type of group to multiple types of groups depending on the particular charge-transport material. It should also be noted that the configuration (e.g., position on the molecule) of the groups on the molecules can vary depending on the number of different groups bonded to the molecules to produce charge-transport materials having a particular characteristic.

X in each instance can be independently selected from, but is not limited to: 3,4,5-trialkoxyphenyl; 3,4,5-trialkylphenyl; 3,4,5-tri-perfluorinated-alkylphenyl; 3,4,5-tri-perfluorinated-alkoxyphenyl; 3,4,5-tri-oligomeric-ether-substituted phenyl; 3,4,5-trialkoxybenzyl; 3,4,5-trialkylbenzyl; 3,4,5-tri-perfluorinated-alkyl benzyl; 3,4,5-tri-perfluorinated-alkoxy benzyl; 3,4,5-tri-oligomeric-ether-substituted benzyl; 3,4-dialkoxyphenyl, 3,4-dialkylphenyl; 3,4-di-perfluorinated-alkylphenyl; 3,4-di-perfluorinated-alkoxyphenyl; 3,4-di-oligomeric-ether-substituted phenyl; 3,4-dialkoxybenzyl; 3,4-dialkylbenzyl; 3,4-di-perfluorinated-alkylbenzyl; 3,4-di-perfluorinated-alkoxybenzyl; 3,4-di-oligomeric-ether-substituted benzyl; 3,5-dialkoxyphenyl; 3,5-dialkylphenyl; 3,5-di-perfluorinated-alkyl phenyl; 3,5-di-perfluorinated-alkoxy phenyl; 3,5-di-oligomeric-ether-substituted phenyl; 3,5-dialkoxybenzyl; 3,5-dialkylbenzyl; 3,5-di-perfluorinated-alkyl benzyl; 3,5-di-oligomeric-ether-substituted benzyl; or the following units:

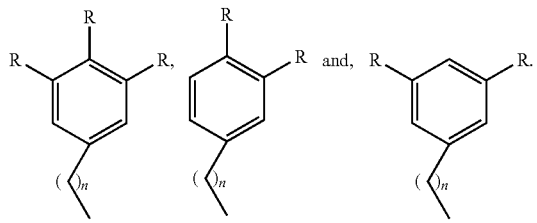

R in each instance can be independently selected from, but is not limited to: an alkyl, an alkoxy, a perfluorinated alkyl, a perfluorinated alkoxy, an oligomeric-ether. Also, R may denote units that can form dendrimers. Subscript n is a number from 0 to 20. In addition, R can be a polymerizable group as described below.

Also X in each instance can be independently selected from, but is not limited to one or more of the following: H; linear or branched; alkyl groups with up to 25 carbons; linear or branched, perfluorinated alkyl groups with up to 25 carbons; fused aromatic rings; donor groups; acceptor groups; aryl groups; polymerizable groups; —(CH$_2$CH$_2$O)$_\alpha$—(CH$_2$)$_\beta$ OR$_{a1}$; —(CH$_2$CH$_2$O)$_\alpha$—(CH$_2$)$_\beta$NR$_{a2}$R$_{a3}$; —(CH$_2$CH$_2$O)$_\alpha$—(CH$_2$)$_\beta$CONR$_{a2}$R$_{a3}$; —(CH$_2$CH$_2$O)$_\alpha$—(CH$_2$)$_\beta$CN; —(CH$_2$CH$_2$O)$_\gamma$—(CH$_2$)$_\delta$F; —(CH$_2$CH$_2$O)$_\gamma$—(CH$_2$)$_\delta$NO$_2$; —(CH$_2$CH$_2$O)$_\alpha$—(CH$_2$)$_\beta$Cl; —(CH$_2$CH$_2$O)$_\alpha$—(CH$_2$)$_\beta$Br; —(CH$_2$CH$_2$O)$_\alpha$—(CH$_2$)$_\beta$I; —(CH$_2$CH$_2$O)$_\alpha$—(CH$_2$)$_\beta$-Phenyl; —CH$_2$—(CH$_2$)$_\beta$—(OCH$_2$CH$_2$)$_\alpha$R$_{a1}$; —CH$_2$—(CH$_2$)$_\beta$—(OCH$_2$CH$_2$)$_\alpha$NR$_{a2}$R$_{a3}$; —(CH$_2$)$_\beta$CH$_2$—(OCH$_2$CH$_2$)$_\alpha$ CONR$_{a2}$R$_{a3}$; —CH$_2$—(CH$_2$)$_\beta$—(OCH$_2$CH$_2$)$_\alpha$ CN; —CH$_2$—(CH$_2$)$_\beta$—(OCH$_2$CH$_2$)$_\alpha$F; —CH$_2$—(CH$_2$)$_\beta$—(OCH$_2$CH$_2$)$_\alpha$NO$_2$; —CH$_2$—(CH$_2$)$_\beta$—(OCH$_2$CH$_2$)$_\alpha$Cl; —CH$_2$—(CH$_2$)$_\beta$—(OCH$_2$CH$_2$)$_\alpha$Br; —CH$_2$—(CH$_2$)$_\beta$—(OCH$_2$CH$_2$)$_\alpha$I; —CH$_2$(CH$_2$)$_\beta$—(OCH$_2$CH$_2$)$_\alpha$Phenyl; —CF$_2$—(CF$_2$)$_\beta$OR$_{a1}$; —CF$_2$—(CF$_2$)$_\beta$CH$_2$NR$_{a2}$R$_{a3}$; —(CF$_2$)$_\beta$CF$_3$; —(CF$_2$)$_\beta$OR$_{a1}$; —CH$_2$CH$_2$(CF$_2$)$_\beta$OR$_{a1}$; —CH$_2$CH$_2$(CF$_2$)$_\beta$CH$_2$NR$_{a2}$R$_{a3}$; (CF$_2$)$_\beta$CH$_2$NR$_{a2}$R$_{a3}$; —CH$_2$CH$_2$(CF$_2$)$_\beta$CF$_3$; —CH$_2$—(CH$_2$)$_\beta$—(OCH$_2$CH$_2$)$_\alpha$Phenyl; —CF$_2$—(CF$_2$)$_\beta$—(OCH$_2$CH$_2$)$_\alpha$Phenyl; —CH$_2$—(CH$_2$)$_\beta$—(OCH$_2$CH$_2$)$_\alpha$Aryl; —CF$_2$—(CF$_2$)$_\beta$—(OCH$_2$CH$_2$)$_\alpha$ Aryl; —CH$_2$CH$_2$—(OCH$_2$CH$_2$)$_\alpha$—O(CF$_2$)$_\beta$ Aryl; CH$_2$CH$_2$—(OCH$_2$CH$_2$)$_\alpha$—O(CH$_2$)$_\beta$Aryl; —CH$_2$O(CH$_2$)$_\alpha$Aryl; and —(CF$_2$)$_\beta$Aryl; and combinations thereof.

In addition, X, in each instance, can be independently selected from, but is not limited to, one or more of the following groups: —(CH$_2$CH$_2$O)$_\alpha$—(CH$_2$)$_\beta$CH$_2$OR$_{a1}$; —(CH$_2$CH$_2$O)$_\alpha$—(CH$_2$)$_\beta$CH$_2$NR$_{a2}$R$_{a3}$; —(CH$_2$CH$_2$O)$_\alpha$—(CH$_2$)$_\beta$CONR$_{a2}$R$_{a3}$; —(CH$_2$CH$_2$O)$_\alpha$—(CH$_2$)$_\beta$CH$_2$CN; —(CH$_2$CH$_2$O)$_\gamma$—(CH$_2$)$_\delta$CH$_2$F —(CH$_2$CH$_2$O)$_\gamma$—(CH$_2$)$_\delta$CH$_2$NO$_2$—(CH$_2$CH$_2$O)$_\alpha$—(CH$_2$)$_\beta$CH$_2$Cl; —(CH$_2$CH$_2$ O)$_\alpha$—(CH$_2$)$_\beta$CH$_2$Br; —(CH$_2$CH$_2$O)$_\alpha$—(CH$_2$)$_\beta$CH$_2$I; —(CH$_2$CH$_2$O)$_\alpha$—(CH$_2$)$_\beta$-Phenyl; —CH$_2$—(CH$_2$)$_\beta$—(OCH$_2$CH$_2$)$_\alpha$OR$_{a1}$; —CH$_2$—(CH$_2$)$_\beta$—(OCH$_2$CH$_2$)$_\alpha$SR$_{a1}$; —CH$_2$—(OCH$_2$CH$_2$)$_\alpha$—(CH$_2$)$_\beta$SR$_{a1}$; —CH$_2$—(CH$_2$)$_\beta$—(OCH$_2$CH$_2$)$_\alpha$P (O)(OR$_{a1}$)$_2$; —CH$_2$—(OCH$_2$CH$_2$)$_\alpha$—(CH$_2$)$_\beta$—P(O)(OR$_{a1}$)$_2$; —CH$_2$—(OCH$_2$CH$_2$)$_\alpha$—(CH$_2$)$_\beta$SR$_{a1}$; —CH$_2$—(CH$_2$)$_\beta$—(OCH$_2$CH$_2$)$_\alpha$NR$_{a2}$R$_{a3}$; —(CH$_2$)$_\beta$CH$_2$—(OCH$_2$CH$_2$)$_\alpha$CONR$_{a2}$R$_{a3}$; —CH$_2$—(CH$_2$)$_\beta$—(OCH$_2$CH$_2$)$_\alpha$ CN; —CH$_2$—(CH$_2$)$_\beta$—(OCH$_2$CH$_2$)$_\alpha$F; —CH$_2$—(CH$_2$)$_\beta$—(OCH$_2$CH$_2$)$_\alpha$NO$_2$; —CH$_2$—(CH$_2$)$_\beta$—(OCH$_2$CH$_2$)$_\alpha$Cl; —CH$_2$—(CH$_2$)$_\beta$—(OCH$_2$CH$_2$)$_\alpha$Br; —CH$_2$—(CH$_2$)$_\beta$—(OCH$_2$CH$_2$)$_\alpha$I; —CH$_2$(CH$_2$)$_\beta$—(OCH$_2$CH$_2$)$_\alpha$Phenyl; —CF$_2$—(CF$_2$)$_\beta$OR$_{a1}$; —CF$_2$—(CF$_2$)$_\beta$CH$_2$NR$_{a2}$R$_{a3}$; —(CF$_2$)$_\beta$CF$_3$; —(CF$_2$)$_\beta$OR$_{a1}$; —CH$_2$CH$_2$(CF$_2$)$_\beta$OR$_{a1}$; —CH$_2$CH$_2$(CF$_2$)$_\beta$CH$_2$NR$_{a2}$R$_{a3}$; (CF$_2$)$_\beta$CH$_2$NR$_{a2}$R$_{a3}$; —CH$_2$CH$_2$(CF$_2$)$_\beta$CF$_3$; —CH$_2$—(CH$_2$)$_\beta$—(OCH$_2$CH$_2$)$_\alpha$Phenyl; —CF$_2$—(CF$_2$)$_\beta$—(OCH$_2$CH$_2$)$_\alpha$ Phenyl; —CH$_2$—(CH$_2$)$_\beta$—(OCH$_2$CH$_2$)$_\alpha$Aryl; —CF$_2$—(CF$_2$)$_\beta$—(OCH$_2$CH$_2$)$_\alpha$Aryl (see discussion below); —CH$_2$CH$_2$—(OCH$_2$CH$_2$)$_\alpha$—O(CF$_2$)$_\beta$Aryl (see discussion below); -Aryl; CH$_2$CH$_2$—(OCH$_2$CH$_2$)$_\alpha$—O(CH$_2$)$_\beta$Aryl (see discussion below); —CH$_2$O(CH$_2$)$_\beta$Aryl (see discussion below); and —(CF$_2$)$_\beta$Aryl (see discussion below).

R$_{a1}$, R$_{a2}$, and R$_{a3}$ can each be independently selected from, but are not limited to, one or more of the following groups: H; linear or branched alkyl groups with up to 25 carbons (e.g., 0, 1, 2, 3, 4, 5, 6, 7, 8, 9, 10, 11, 12, 13, 14, 15, 16, 17, 18, 19, 20, 21, 22, 23, 24, and 25 carbons in all isomer forms such as normal, secondary, iso- and neo-isomers); and a functional group derived from amino acids, nucleic acids, biotin, ferrocene, ruthenocene, cyanuric chloride, methacryloyl chloride, and derivatives thereof. Subscript $\alpha$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). Subscript $\beta$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25).

The aryl group can include aromatic ring systems having up to 20 carbons in the aromatic ring framework (e.g., 0, 1, 2, 3, 4, 5, 6, 7, 8, 9, 10, 11, 12, 13, 14, 15, 16, 17, 18, 19, and 20 carbons in all isomer forms); (e.g., does not include carbons on the substituents). The aryl group can include, but is not limited to the following structures:

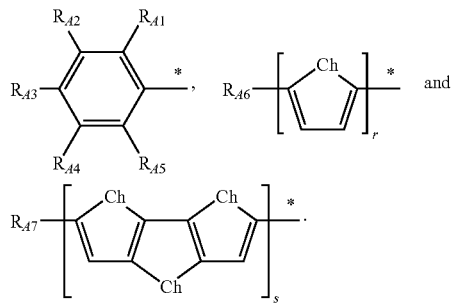

It should be noted that Ch can be an atom such as, but not limited to, Se, S, O, and a combination thereof when more than one Ch is present in the aryl ring system. R$_{A1}$, R$_{A2}$, R$_{A3}$, R$_{A4}$, R$_{A5}$, R$_{A6}$, R$_{A7}$, can each be independently selected from, but are not limited to, the following groups: H; a linear or branched alkyl group with up to 25 carbons (e.g., 0, 1, 2, 3, 4, 5, 6, 7, 8, 9, 10, 11, 12, 13, 14, 15, 16, 17, 18, 19, 20, 21, 22, 23, 24, and 25 carbons in all isomer forms such as normal, secondary, iso- and neo-isomers); —(CH$_2$CH$_2$O)$_\gamma$—(CH$_2$)$_\delta$OCH$_3$; —(CH$_2$CH$_2$O)$_\gamma$—(CH$_2$)$_\delta$N(CH$_3$)$_2$; —(CH$_2$CH$_2$O)$_\gamma$—(CH$_2$)$_\delta$CON(CH$_3$)$_2$; —(CH$_2$CH$_2$O)$_\gamma$—(CH$_2$)$_\delta$CN; —(CH$_2$CH$_2$O)$_\gamma$—(CH$_2$)$_\delta$F; —(CH$_2$CH$_2$O)$_\gamma$—(CH$_2$)$_\delta$NO$_2$; —(CH$_2$CH$_2$O)$_\gamma$—(CH$_2$)$_\delta$Cl; —(CH$_2$CH$_2$O)$_\gamma$—(CH$_2$)$_\delta$Br; —(CH$_2$CH$_2$O)$_\gamma$—(CH$_2$)$_\delta$I; —(CH$_2$CH$_2$O)$_\gamma$—(CH$_2$)$_\delta$-Phenyl; —(CH$_2$)$_\delta$—(OCH$_2$CH$_2$)$_\gamma$CH$_3$; —(CH$_2$)$_\delta$—(OCH$_2$CH$_2$)$_\delta$ N(CH$_3$)$_2$; —(CH$_2$)$_\delta$—(OCH$_2$CH$_2$)$_\gamma$CON (CH$_3$)$_2$; —(CH$_2$)$_\delta$—(OCH$_2$CH$_2$)$_\gamma$CN; —(CH$_2$)$_\delta$—(OCH$_2$CH$_2$)$_\gamma$F; —(CH$_2$)$_\delta$—(OCH$_2$CH$_2$)$_\alpha$NO$_2$; —(CH$_2$)$_\delta$—(OCH$_2$CH$_2$)$_\gamma$Cl; —(CH$_2$)$_\delta$—(OCH$_2$CH$_2$)$_\gamma$Br; —(CH$_2$)$_\delta$—(OCH$_2$CH$_2$)$_\gamma$I; —(CH$_2$)$_\delta$—(OCH$_2$CH$_2$)$_\gamma$-Phenyl; —(CF$_2$)$_\beta$OCH; —(CF$_2$)$_\beta$OCH; —(CF$_2$)$_\beta$CH$_2$ON(CH$_3$)$_2$; —(CF$_2$)$_\beta$CF$_3$; —O(CF$_2$)$_\beta$OCH$_3$; —OCH$_2$CH$_2$(CF$_2$)$_\beta$OCH$_3$; —OCH$_2$CH$_2$(CF$_2$)$_\beta$CH$_2$N(CH$_3$)$_2$; —O(CF$_2$)$_\beta$CH$_2$N(CH$_3$)$_2$; —OCH$_2$CH$_2$(CF$_2$)$_\beta$CF$_3$; —(CH$_2$)$_\beta$—(OCH$_2$CH$_2$)$_\alpha$Phenyl; and —(CF$_2$)$_\beta$—(OCH$_2$CH$_2$)$_\alpha$Phenyl.

The subscript $\gamma$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). The subscript $\delta$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). The subscript r is an integer number from 0 to 6 (e.g., 0, 1, 2, 3, 4, 5, and 6). The subscript s is an integer number from 0 to 3 (e.g., 0, 1, 2, and 3).

The polymerizable group (functionalities) can include, but is not limited to, vinyl, allyl, 4-styryl, acroyl, epoxide, oxetane, cyclic-carbonate, methacroyl, and acrylonitrile, each of which may be polymerized by either a radical, cationic, atom transfer, or anionic polymerization process.

In addition, the polymerizable group can include, but is not limited to, isocyanate, isothiocyanate, and epoxides, such that they can be copolymerized with difunctional amines or alcohols such as HO(CH$_2$)$_\chi$OH, H$_2$N(CH$_2$)$_\chi$NH$_2$, where $\chi$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25).

Also the polymerizable group can include, but is not limited to, strained ring olefins such as, but not limited to, dicyclopentadienyl, norbornenyl, and cyclobutenyl. Such monomers can be polymerized via ring opening metathesis polymerization using an appropriate metal catalyst, as would be known to those skilled in the art.

Further, the polymerizable group can include, but is not limited to, (—CH$_2$)$_\eta$SiCl$_3$, (—CH$_2$)$_\eta$Si(OCH$_2$CH$_3$)$_3$, or (—CH$_2$)$_\eta$Si(OCH$_3$)$_3$, where the monomers can be reacted with water under conditions known to those skilled in the art to form either thin film or monolithic organically modified sol-gel glasses, or modified silicated surfaces, where $\eta$ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25).

Furthermore, the polymerizable group can include, but is not limited to, polymerizable groups that can be photochemically dimerized or polymerized, and these include, but are not limited to, the following structures:

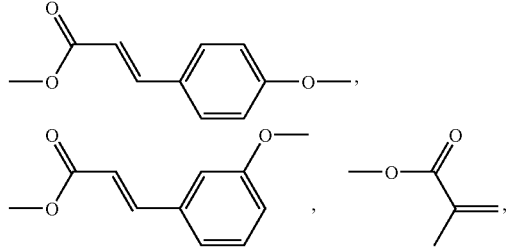

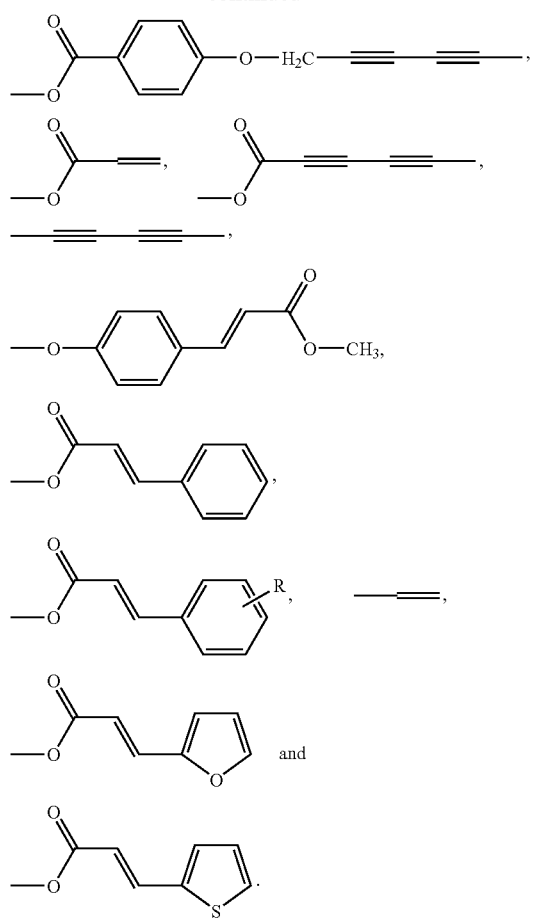
The acceptors can include structures such as, but not limited to, the following:
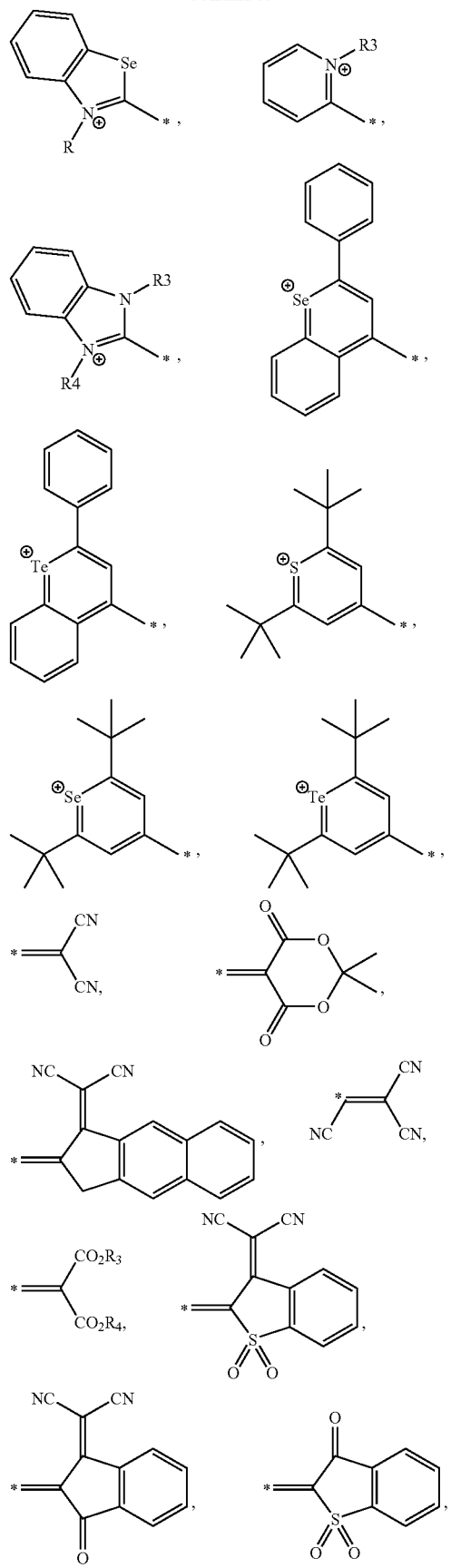

-continued

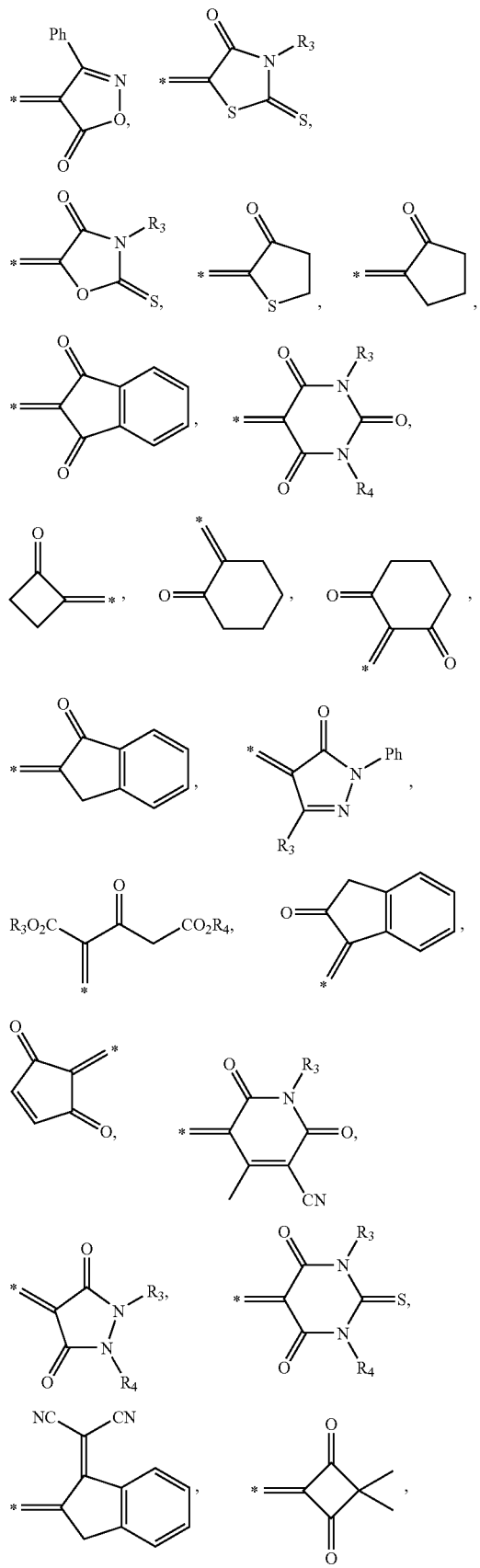
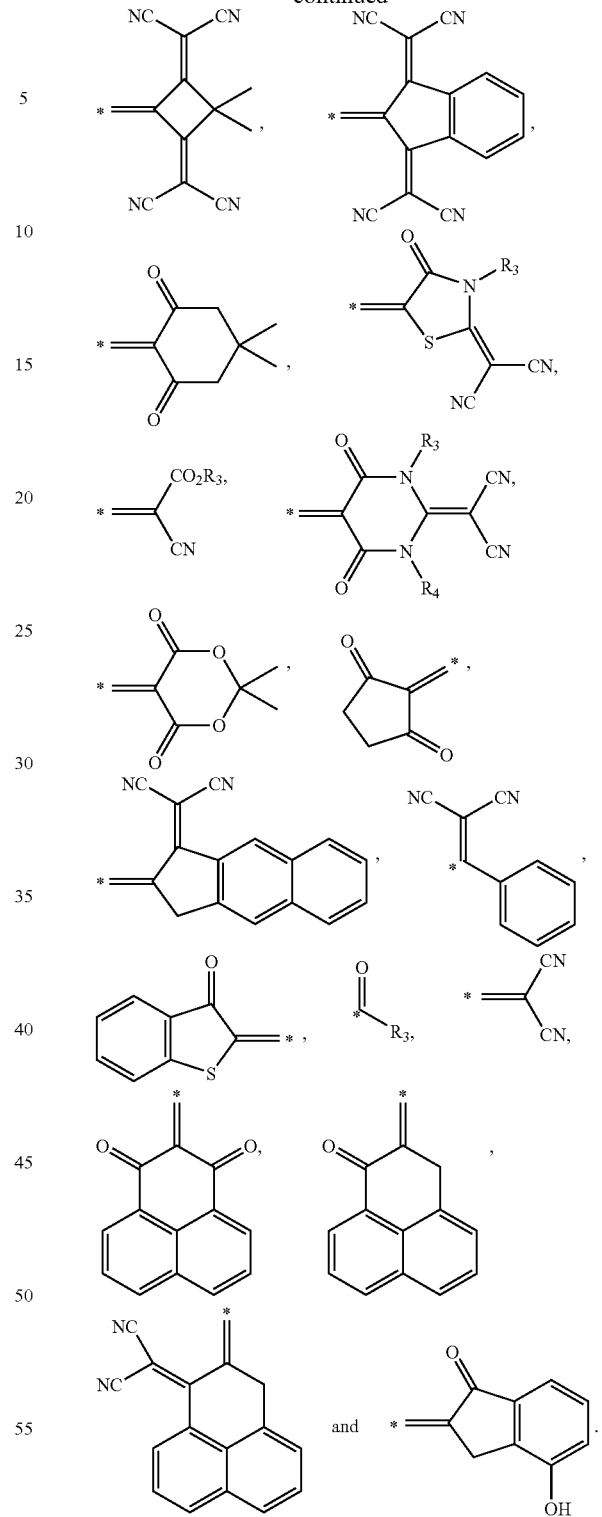

Y in each instance can be independently selected from, but is not limited to: H, CN, and acceptors (as described herein). In an exemplary embodiment, Y in each instance can be independently selected from an acceptor. In addition the acceptor can be of the form —C≡C-aryl; —(C≡C)-$_2$aryl; —(C≡C)-$_3$aryl; —HC═CH-aryl; —(HC═CH)$_2$-aryl; and —(HC═CH)$_3$-aryl. In addition, Y can be a polymerizable group as described above.

The aryl group can include, but is not limited to, the following structures:

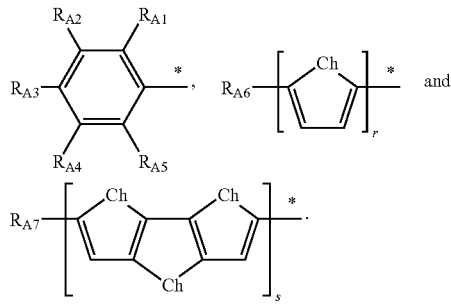

It should be noted that Ch can be an atom such as, but not limited to, Se, S, O, and a combination thereof when more than one Ch is present in the aryl ring system. $R_{A1}$, $R_{A2}$, $R_{A3}$, $R_{A4}$, $R_{A5}$, $R_{A6}$, $R_{A7}$, can each be independently selected from, but are not limited to, the following groups: H; a linear or branched alkyl group with up to 25 carbons (e.g., 0, 1, 2, 3, 4, 5, 6, 7, 8, 9, 10, 11, 12, 13, 14, 15, 16, 17, 18, 19, 20, 21, 22, 23, 24, and 25 carbons in all isomer forms such as normal, secondary, iso- and neo-isomers); —$(CH_2CH_2O)_\alpha$—$(CH_2)_\beta$ $OR_{b1}$; —$(CH_2CH_2O)_\alpha$—$(CH_2)_\beta NR_{b2}R_{b3}$; —$(CH_2CH_2O)_\alpha$—$(CH_2)_\beta CONR_{b2}R_{b3}$; —$(CH_2CH_2O)_\gamma$—$(CH_2)_\delta OCH_3$; —$(CH_2CH_2O)_\gamma$—$(CH_2)_\delta N(CH_3)_2$; —$(CH_2CH_2O)_\gamma$—$(CH_2)_\delta CON(CH_3)_2$; —$(CH_2CH_2O)_\gamma$—$(CH_2)_\delta CN$; —$(CH_2CH_2O)_\gamma$—$(CH_2)_\delta F$; —$(CH_2CH_2O)_\gamma$—$(CH_2)_\delta NO_2$; —$(CH_2CH_2O)_\gamma$—$(CH_2)_\delta Cl$; —$(CH_2CH_2O)_\gamma$—$(CH_2)_\delta Br$; —$(CH_2CH_2O)_\gamma$—$(CH_2)_\delta I$; —$(CH_2CH_2O)_\gamma$—$(CH_2)_\delta$-Phenyl; —$(CH_2)_\delta$—$(OCH_2CH_2)_\gamma CH_3$; —$(CH_2)_\delta$—$(OCH_2CH_2)_\delta N(CH_3)_2$; —$(CH_2)_\delta$—$(OCH_2CH_2)_\gamma CON(CH_3)_2$; —$(CH_2)_\delta$—$(OCH_2CH_2)_\gamma CN$; —$(CH_2)_\delta$—$(OCH_2CH_2)_\gamma F$; —$(CH_2)_\delta$—$(OCH_2CH_2)_\alpha NO_2$; —$(CH_2)_\delta$—$(OCH_2CH_2)_\gamma Cl$; —$(CH_2)_\delta$—$(OCH_2CH_2)_\gamma Br$; —$(CH_2)_\delta$—$(OCH_2CH_2)_\gamma I$; —$(CH_2)_\delta$—$(OCH_2CH_2)_\gamma Phenyl$; —$(CF_2)_\beta OCH_3$; —$(CF_2)_\beta OCH_3$; —$(CF_2)_\beta CH_2 ON(CH_3)_2$; —$(CF_2)_\beta CF_3$; —$O(CF_2)_\beta OCH_3$; —$OCH_2CH_2(CF_2)_\beta OCH_3$; —$OCH_2CH_2(CF_2)_\beta CH_2N(CH_3)_2$; —$O(CF_2)_\beta CH_2N(CH_3)_2$; —$OCH_2CH_2(CF_2)_\beta CF_3$; —$(CH_2)_\beta$—$(OCH_2CH_2)_\alpha Phenyl$; and —$(CF_2)_\beta$—$(OCH_2CH_2)_\alpha Phenyl$; —$(OCH_2CH_2)_\alpha Aryl'$; —$CF_2$—$(CF_2)_\beta$—$(OCH_2CH_2)_\alpha Aryl'$ (see discussion below); —$CH_2CH_2$—$(OCH_2CH_2)_\alpha$—$O(CF_2)_\beta Aryl'$ (see discussion below); -Aryl'; $CH_2CH_2$—$(OCH_2CH_2)_\alpha$—$O(CH_2)_\beta Aryl'$ (see discussion below); —$CH_2O(CH_2)_\beta Aryl'$ (see discussion below); and —$(CF_2)_\beta Aryl'$ (see discussion below).

The subscript γ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). The subscript δ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). The subscript r is an integer number from 0 to 6 (e.g., 0, 1, 2, 3, 4, 5, and 6). The subscript s is an integer number from 0 to 3 (e.g., 0, 1, 2, and 3).

$R_{b1}$, $R_{b2}$, and $R_{b3}$ can each be independently selected from, but are not limited to, one or more of the following groups: H; linear or branched alkyl groups with up to 25 carbons (e.g., 0, 1, 2, 3, 4, 5, 6, 7, 8, 9, 10, 11, 12, 13, 14, 15, 16, 17, 18, 19, 20, 21, 22, 23, 24, 25 carbons in all isomer forms such as normal, secondary, iso- and neo-isomers), and a functional group derived from amino acids, nucleic acids, biotin, ferrocene, ruthenocene, cyanuric chloride, methacryloyl chloride, and derivatives thereof; —$(CH_2)_\beta OCH_3$; —$CH_2$—$(OCH_2CH_2)_\alpha Aryl''$; —$CH_2$—$(CF_2)_\beta$—$(OCH_2CH_2)_\alpha Aryl''$ (see discussion below); —$CH_2CH_2$—$(OCH_2CH_2)_\alpha$—$O(CF_2)_\beta Aryl''$ (see discussion below); -Aryl''; $CH_2CH_2$—$(OCH_2CH_2)_\alpha$—$O(CH_2)_\beta Aryl''$ (see discussion below); —$CH_2O(CH_2)_\beta Aryl''$ (see discussion below); —$(CH_2)_\beta Aryl''$ (see discussion below); and —$(CF_2)_\beta Aryl''$ (see discussion below). Subscript α is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). Subscript β is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25).

The aryl group (e.g., Aryl' and Aryl'') can include aromatic ring systems having up to 20 carbons in the aromatic ring framework (e.g., 0, 1, 2, 3, 4, 5, 6, 7, 8, 9, 10, 11, 12, 13, 14, 15, 16, 17, 18, 19, and 20 carbons in all isomer forms) (e.g., does not include carbons on the substituents). The aryl group can include, but is not limited to the following structures:

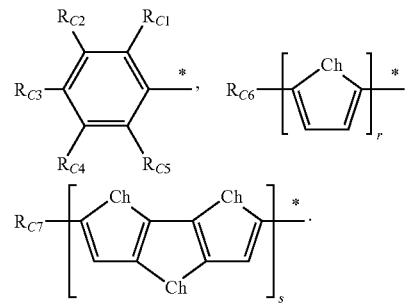

It should be noted that Ch can be an atom such as, but not limited to, Se, S, O, and a combination thereof when more than one Ch is present in the aryl ring system. $R_{C1}$, $R_{C2}$, $R_{C3}$, $R_{C4}$, $R_{C5}$, $R_{C6}$, $R_{C7}$, can each be independently selected from, but not limited to, the following groups: H; a linear or branched alkyl group with up to 25 carbons (e.g., 0, 1, 2, 3, 4, 5, 6, 7, 8, 9, 10, 11, 12, 13, 14, 15, 16, 17, 18, 19, 20, 21, 22, 23, 24, and 25 carbons in all isomer forms such as normal, secondary, iso- and neo-isomers); —$(CH_2CH_2O)_\gamma$—$(CH_2)_\delta OCH_3$; —$(CH_2CH_2O)_\gamma$—$(CH_2)_\delta N(CH_3)_2$; —$(CH_2CH_2O)_\gamma$—$(CH_2)_\delta CON(CH_3)_2$; —$(CH_2CH_2O)_\gamma$—$(CH_2)_\delta CN$; —$(CH_2CH_2O)_\gamma$—$(CH_2)_\delta F$; —$(CH_2CH_2O)_\gamma$—$(CH_2)_\delta NO_2$; —$(CH_2CH_2O)_\gamma$—$(CH_2)_\delta Cl$; —$(CH_2CH_2O)_\gamma$—$(CH_2)_\delta Br$; —$(CH_2CH_2O)_\gamma$—$(CH_2)_\delta$-Phenyl; —$(CH_2)_\delta$—$(OCH_2CH_2)_\gamma CH_3$; —$(CH_2)_\delta$—$(OCH_2CH_2)_\delta N(CH_3)_2$; —$(CH_2)_\delta$—$(OCH_2CH_2)_\gamma CON(CH_3)_2$; —$(CH_2)_\delta$—$(OCH_2CH_2)_\gamma CN$; —$(CH_2)_\delta$—$(OCH_2CH_2)_\gamma F$; —$(CH_2)_\delta$—$(OCH_2CH_2)_\alpha NO_2$; —$(CH_2)_\delta$—$(OCH_2CH_2)_\gamma Cl$; —$(CH_2)_\delta$—$(OCH_2CH_2)_\gamma Br$; —$(CH_2)_\delta$—$(OCH_2CH_2)_\gamma I$; —$(CH_2)_\delta$—$(OCH_2CH_2)_\gamma Phenyl$; —$(CF_2)_\beta OCH$; —$(CF_2)_\beta OCH$; —$(CF_2)_\beta CH_2ON(CH_3)_2$; —$(CF_2)_\beta CF_3$; —$O(CF_2)_\beta OCH$; —$OCH_2CH_2(CF_2)_\beta OCH$; —$OCH_2CH_2(CF_2)_\beta CH_2N(CH_3)_2$; —$O(CF_2)_\beta CH_2N(CH_3)_2$; —$OCH_2CH_2(CF_2)_\beta CF_3$; —$(CH_2)_\beta$—$(OCH_2CH_2)_\alpha Phenyl$; and —$(CF_2)_\beta$—$(OCH_2CH_2)_\alpha Phenyl$.

The subscript γ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). The subscript δ is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). The subscript r is an integer number from 0 to 6 (e.g., 0, 1, 2, 3, 4, 5, and 6). The subscript s is an integer number from 0 to 3 (e.g., 0, 1, 2, and 3).

In addition, X and Y in each instance can be independently selected from: hydrogen; halogens; $C_1$-$C_{18}$-alkyl; aryloxy, arylthio, heteroaryloxy or heteroarylthio, which may each be substituted by $C_1$-$C_{10}$-alkyl, $C_1$-$C_6$-alkoxy, cyano or carboxyl.

In addition, X and Y in each instance can be independently selected from an alkyl group from 6 to 20 carbons (e.g., 6, 7, 8, 9, 10, 11, 12, 13, 14, 15, 16, 17, 18, 19, and 20), where the chain can be interrupted with S, O, and ester linkers.

In addition, X in each instance can be independently selected from: methyl, ethyl, propyl, isopropyl, butyl, isobutyl, sec-butyl, tert-butyl, pentyl, isopentyl, neopentyl, tert-pentyl, hexyl, 2-methylpentyl, heptyl, 1-ethylpentyl, octyl, 2-ethylhexyl, isooctyl, nonyl, isononyl, decyl, isodecyl, undecyl, dodecyl, tridecyl, isotridecyl, tetradecyl, pentadecyl, hexadecyl, heptadecyl, octadecyl, nonadecyl and eicosyl (the above designations isooctyl, isononyl, isodecyl and isotridecyl are trivial names derived from the oxo process alcohols—cf. Ullmann's Encyklopadie der technischen Chemie, 4th edition, volume 7, pages 215 to 217, and volume 11, pages 435 and 436); 2-methoxyethyl, 2-ethoxyethyl, 2-propoxyethyl, 2-isopropoxyethyl, 2-butoxyethyl, 2- and 3-methoxypropyl, 2- and 3-ethoxypropyl, 2- and 3-propoxypropyl, 2- and 3-butoxypropyl, 2- and 4-methoxybutyl, 2- and 4-ethoxybutyl, 2- and 4-propoxybutyl, 3,6-dioxaheptyl, 3,6-dioxaoctyl, 4,8-dioxanonyl, 3,7-dioxaoctyl, 3,7-dioxanonyl, 4,7-dioxaoctyl, 4,7-dioxanonyl, 2- and 4-butoxybutyl, 4,8-dioxadecyl, 3,6,9-trioxadecyl, 3,6,9-trioxaundecyl, 3,6,9-trioxadodecyl, 3,6,9,12-tetraoxatridecyl and 3,6,9,12-tetraoxatetradecyl; 2-methylthioethyl, 2-ethylthioethyl, 2-propylthioethyl, 2-isopropylthioethyl, 2-butylthioethyl, 2- and 3-methylthiopropyl, 2- and 3-ethylthiopropyl, 2- and 3-propylthiopropyl, 2- and 3-butylthiopropyl, 2- and 4-methylthiobutyl, 2- and 4-ethylthiobutyl, 2- and 4-propylthiobutyl, 3,6-dithiaheptyl, 3,6-dithiaoctyl, 4,8-dithianonyl, 3,7-dithiaoctyl, 3,7-dithianonyl, 4,7-dithiaoctyl, 4,7-dithianonyl, 2- and 4-butylthiobutyl, 4,8-dithiadecyl, 3,6,9-trithiadecyl, 3,6,9-trithiaundecyl, 3,6,9-trithiadodecyl, 3,6,9,12-tetrathiamidecyl and 3,6,9,12-tetrathiatetradecyl; 2-monomethyl- and 2-monoethylaminoethyl, 2-dimethylaminoethyl, 2- and 3-dimethylaminopropyl, 3-monoisopropylaminopropyl, 2- and 4-monopropylaminobutyl, 2- and 4-dimethylaminobutyl, 6-methyl-3,6-diazaheptyl, 3,6-dimethyl-3,6-diazaheptyl, 3,6-diazaoctyl, 3,6-dimethyl-3,6-diazaoctyl, 9-methyl-3,6,9-triazadecyl, 3,6,9-trimethyl-3,6,9-triazadecyl, 3,6,9-triazaundecyl, 3,6,9-trimethyl-3,6,9-triazaundecyl, 12-methyl-3,6,9,12-tetraazatridecyl and 3,6,9,12-tetramethyl-3,6,9,12-tetraazatridecyl; propan-2-on-1-yl, butan-3-on-1-yl, butan-3-on-2-yl and 2-ethylpentan-3-on-1-yl; 2-methylsulfonylethyl, 2-ethylsulfonylethyl, 2-propylsulfonylethyl, 2-isopropylsulfonylethyl, 2-butylsulfonylethyl, 2- and 3-methylsulfonylpropyl, 2- and 3-ethylsulfonylpropyl, 2- and 3-propylsulfonylpropyl, 2- and 3-butylsulfonylpropyl, 2- and 4-methylsulfonylbutyl, 2- and 4-ethylsulfonylbutyl, 2- and 4-propylsulfonylbutyl and 4-butylsulfonylbutyl; carboxymethyl, 2-carboxyethyl, 3-carboxypropyl, 4-carboxybutyl, 5-carboxypentyl, 6-carboxyhexyl, 8-carboxyoctyl, 10-carboxydecyl, 12-carboxydodecyl and 14-carboxytetradecyl; sulfomethyl, 2-sulfoethyl, 3-sulfopropyl, 4-sulfobutyl, 5-sulfopentyl, 6-sulfohexyl, 8-sulfooctyl, 10-sulfodecyl, 12-sulfododecyl and 14-sulfotetradecyl; 2-hydroxyethyl, 2-hydroxypropyl, 1-hydroxyprop-2-yl, 2- and 4-hydroxybutyl, 1-hydroxybut-2-yl and 8-hydroxy-4-oxaoctyl, 2-cyanoethyl, 3-cyanopropyl, 2-methyl-3-ethyl-3-cyanopropyl, 7-cyano-7-ethylheptyl and 4-methyl-7-methyl-7-cyanoheptyl; methoxy, ethoxy, propoxy, isopropoxy, butoxy, isobutoxy, sec-butoxy, tert-butoxy, pentoxy, isopentoxy, neopentoxy, tert-pentoxy and hexoxy; carbamoyl, methylaminocarbonyl, ethylaminocarbonyl, ropylaminocarbonyl, butylaminocarbonyl, pentylaminocarbonyl, hexylaminocarbonyl, heptylaminocarbonyl, octylaminocarbonyl, nonylaminocarbonyl, decylaminocarbonyl and phenylaminocarbonyl; formylamino, acetylamino, propionylamino and benzoylamino; chlorine, bromine and iodine; phenylazo, 2-naphthylazo, 2-pyridylazo and 2-pyrimidylazo; cyclopentyl, cyclohexyl, cycloheptyl, cyclooctyl, 2-dioxanyl, 4-morpholinyl, 2- and 3-tetrahydrofuryl, 1-, 2- and 3-pyrrolidinyl and 1-, 2-, 3- and 4-piperidyl; phenyl, 2-naphthyl, 2- and 3-pyrryl, 2-, 3- and 4-pyridyl, 2-, 4- and 5-pyrimidyl, 3-, 4- and 5-pyrazolyl, 2-, 4- and 5-imidazolyl, 2-, 4- and 5-thiazolyl, 3-(1,2,4-triazyl), 2-(1,3,5-triazyl), 6-quinaldyl, 3-, 5-, 6- and 8-quinolinyl, 2 benzoxazolyl, 2-benzothiazolyl, 5-benzothiadiazolyl, 2- and 5-benzimidazolyl and 1- and 5-isoquinolyl; 2-, 3- and 4-methylphenyl, 2,4-, 3,5- and 2,6-dimethylphenyl, 2,4,6-trimethylphenyl, 2-, 3- and 4-ethylphenyl, 2,4-, 3,5- and 2,6-diethylphenyl, 2,4,6-triethylphenyl, 2-, 3- and 4-propylphenyl, 2,4-, 3,5- and 2,6-dipropylphenyl, 2,4,6-tripropylphenyl, 2-, 3- and 4-isopropylphenyl, 2,4-, 3,5- and 2,6-diisopropylphenyl, 2,4,6-triisopropylphenyl, 2-, 3- and 4-butylphenyl, 2,4-, 3,5- and 2,6-dibutylphenyl, 2,4,6-tributylphenyl, 2-, 3- and 4-isobutylphenyl, 2,4-, 3,5 and 2,6-diisobutylphenyl, 2,4,6-triisobutylphenyl, 2-, 3- and 4-sec-butylphenyl, 2,4-, 3,5- and 2,6-di-sec-butylphenyl and 2,4,6-tri-sec-butylphenyl; 2-, 3- and 4-methoxyphenyl, 2,4-, 3,5- and 2,6-dimethoxyphenyl, 2,4,6-trimethoxyphenyl, 2-, 3- and 4-ethoxyphenyl, 2,4-, 3,5- and 2,6-diethoxyphenyl, 2,4,6-triethoxyphenyl, 2-, 3- and 4-propoxyphenyl, 2,4-, 3,5- and 2,6-dipropoxyphenyl, 2-, 3- and 4-isopropoxyphenyl, 2,4- and 2,6-diisopropoxyphenyl and 2-, 3- and 4-butoxyphenyl; 2-, 3- and 4-chlorophenyl and 2,4-, 3,5- and 2,6-dichlorophenyl; 2-, 3- and 4-hydroxyphenyl and 2,4-, 3,5- and 2,6-dichlorophenyl; 2-, 3- and 4-hydroxyphenyl and 2,4-, 3,5- and 2,6-dihydroxyphenyl; 2-, 3- and 4-cyanophenyl; 3- and 4-carboxyphenyl; 3- and 4-carboxyamidophenyl, 3- and 4-N-methylcarboxamidophenyl and 3- and 4-N-ethylcarboxamidophenyl; 3- and 4-acetylaminophenyl, 3- and 4-propionylaminophenyl and 3- and 4-butyrylaminophenyl; 3- and 4-N-phenylaminophenyl, 3- and 4-N-(o-tolyl)aminophenyl, 3- and 4-N-(m-tolyl)aminophenyl and 3- and 4-(p-tolyl)aminophenyl; 3- and 4-(2-pyridyl)aminophenyl, 3- and 4-(3-pyridyl)aminophenyl, 3- and 4-(4-pyridyl)aminophenyl, 3- and 4-(2-pyrimidyl)aminophenyl and 4-(4-pyrimidyl)aminophenyl; 4-phenylazophenyl, 4-(1-naphthylazo)phenyl, 4-(2-naphthylazo)phenyl, 4-(4-naphthylazo)phenyl, 4-(2-pyridylazo)phenyl, 4-(3-pyridylazo)phenyl, 4-(4-pyridylazo)phenyl, 4-(2-pyrimidylazo)phenyl, 4-(4-pyrimidylazo)phenyl and 4-(5-pyrimidylazo)phenyl; and phenoxy, phenylthio, 2-naphthoxy, 2-naphthylthio, 2-, 3- and 4-pyridyloxy, 2-, 3- and 4-pyridylthio, 2-, 4- and 5-pyrimidyloxy and 2-, 4- and 5-pyrimidylthio.

Embodiments of the coronene diimide charge-transport materials of the present disclosure have a room temperature, zero field electron mobility of at least about $10^{-6}$ to $10^2$ cm$^2$/Vs, $10^{-4}$ to $10^2$ cm$^2$/Vs, and $10^2$ to $10^2$ cm$^2$/Vs.

The distance between adjacent molecules in adjacent layers is about 3.6 Å and 3.1 Å in embodiments of the materials of the present disclosure.

In an embodiment, a polymer layer of the coronene diimide charge-transport material can be formed by dispositing a layer of a polymerizable material including monomers, oligomers, and/or polymers of the coronene diimide charge-transport material, onto a surface. The molecules of the coronene diimide charge-transport material can be optionally aligned into a substantially uniform orientation or a patterned orientation such that in each pattern the orientation is substantially uniform. Then, a polymerization reaction is initiated and the monomers, oligomers and/or polymers of the coronene diimide charge-transport material form a layer of polymerized charge-transport material. The polymerization process can be repeated to produce a plurality of layers. In addition, cross-linking processes can also be performed to cross-link molecules in adjacent layers. One skilled in the art could perform a polymerization process in a manner different than described here and obtain the polymer layer of the coronene diimide charge-transport material, and such processes and materials are intended to be included herein.

A plurality of layers of coronene diimide charge-transport material can be produced to form charge-transport layers that each can have a thickness of about 0.01 to 1000 μm, 0.05 to 100 μm, and 0.05 to 10 μm. The length and width of the charge-transport layer can vary depending on the application, but in general, the length can be about 0.01 μm to 1000 cm, and the width can be about 0.01 μm to 1000 cm.

It should be noted that in some embodiments is it advantageous to have the aromatic core aligned parallel to the substrate materials (e.g., in photovoltaic cells and others devices where a perpendicular alignment may be more preferable (e.g., transistor configurations)).

It should also be noted that the coronene diimide charge-transport materials of the present disclosure could be used is mixtures with other electron-transport materials including those described herein, as well as others. Likewise, the disclosed coronene diimide charge-transport material could be used in combination with other hole-transport materials, sensitizers, emitters, chromophores, and the like, to add other functionality to devices.

In addition, the coronene diimides could be useful as sensitizers. Since the coronene diimide core is electron deficient, it is possible to have either/both X or Y groups be electron donors that donate electron density (e.g., —C≡C-aryl; —(C≡C)-$_2$aryl; —(C≡C)-$_3$aryl; —HC═CH-aryl; —(HC═CH)$_2$-aryl; and —(HC═CH)$_3$-aryl, where the aryl is described herein) to the coronene diimide core either in the ground-state or upon one or multiphoton excitation. Therefore, such molecules can be particularly useful in sensitizer applications, where creation of charge separation upon excitation is beneficial. Such applications include, but are not limited to, photovoltaic devices, photodetectors, photorefractive polymers, multi-photon absorbing materials.

Furthermore, when Y is a conjugated group including those that are substituted with donors, or themselves are electron rich, the molecules can have absorption bands that extend into the near-infrared absorbing region (e.g., 700-1500 nm) of the electromagnetic spectrum. Such materials can be useful for eye protection, as sensors, in optical data storage applications, as photovoltaic systems, as materials in photodetectors, as materials to convert near-infrared energy to heat, and for other applications that benefit from near-infrared absorption, as would be known to those skilled in the art of the application of near-infrared absorbing materials.

The polymerization and cross-linking of the coronene diimide charge-transport material molecules can be performed using methods understood by those skilled in the art. In general, polymerization can take place by exposure to heat or actinic radiation in the presence of an initiator. In general, cross-linking can occur due to internal reactions and/or by the addition of a cross-linking additive. Additional details regarding preparation of the coronene diimide charge-transport materials are described in Example 1.

Actinic radiation means irradiation with radiation (e.g., UV light, IR light or visible light, irradiation with X-rays or gamma rays or irradiation with high-energy particles, such as ions or electrons). In an embodiment, a polymerization initiator can be used that decomposes when heated to produce free radicals or ions that start the polymerization. In another embodiment, the polymerization can be carried out in the presence of an initiator absorbing at the wavelength of the actinic radiation. For example, when polymerizing using UV light, an UV initiator can be used that decomposes under UV irradiation to produce free radicals or ions that start the polymerization reaction.

The UV initiator can include chemicals such as, but not limited to, a free radical initiator, a cationic initiator, or combinations thereof. The free-radical initiator includes compounds that produce a free radical on exposure to UV radiation. The free-radical is capable of initiating a polymerization reaction among the monomers and/or oligomers present.

Examples of free-radical initiators include, but are not limited to, benzophenones (e.g., benzophenone, methyl benzophenone, Michler's ketone, and xanthones), acylphosphine oxide type free radical initiators (e.g., 2,4,6-trimethylbenzoyldiphenyl phosphine oxide (TMPO), 2,4,6-trimethylbenzoylethoxyphenyl phosphine oxide (TEPO), and bisacylphosphine oxides (BAPO's)), azo compounds (e.g., AIBN), benzoins, and benzoin alkyl ethers (e.g., benzoin, benzoin methyl ether and benzoin isopropyl ether).

In addition, the free radical photoinitiator can include, but is not limited to: acyloin; a derivative of acyloin, such as benzoin ethyl ether, benzoin isobutyl ether, desyl bromide, and α-methylbenzoin; a diketone, such as benzil and diacetyl; an organic sulfide, such as diphenyl monosulfide, diphenyl disulfide, desyl phenyl sulfide, and tetramethylthiuram monosulfide; a thioxanthone; an S-acyl dithiocarbamate, such as S-benzoyl-N,N-dimethyldithiocarbamate and S-(p-chlorobenzoyl)-N,N-dimethyldithiocarbamate; a phenone, such as acetophenone, α'-α-α-tribromoacetophenone, o-nitro-α'-α-α-tribromoacetophenone, benzophenone, and p,p'-tetramethyldiaminobenzophenone; a quinone; a triazole; a sulfonyl halide, such as p-toluenesulfonyl chloride; a phosphorus-containing photoinitiator, such as an acylphosphine oxide; an acrylated amine; or mixtures thereof.

The free-radical initiator can be used alone or in combination with a co-initiator. Co-initiators are used with initiators that need a second molecule to produce a radical that is active in UV-systems. For example, benzophenone uses a second molecule, such as an amine, to produce a reactive radical. A preferred class of co-initiators are alkanolamines such as, but not limited to, triethylamine, methyldiethanolamine, and triethanolamine Suitable cationic initiators include, but are not limited to, compounds that form aprotic acids or Brønsted acids upon exposure to UV light sufficient to initiate polymerization. The cationic initiator used can be a single compound, a mixture of two or more active compounds, or a combination of two or more different compounds (e.g., co-initiators).

The cationic photoinitiator can include, but is not limited to, onium salt, such as a sulfonium salt, an iodonium salt, or mixtures thereof. In addition, the cationic photoinitiatior can include, but is not limited to, an aryldiazonium salt, a bisdiaryliodonium salt, a diaryliodonium salt of sulfonic acid, a triarylsulfonium salt of sulfonic acid, a diaryliodonium salt of boric acid, a diaryliodonium salt of boronic acid, a triarylsulfonium salt of boric acid, a triarylsulfonium salt of boronic acid, or mixtures thereof. Examples of cationic photoinitiatiors include, but are not limited to, diaryliodonium hexafluoroantimonate, aryl sulfonium hexafluorophosphate, aryl sulfonium hexafluoroantimonate, bis(dodecyl phenyl) iodonium hexafluoroarsenate, tolyl-cumyliodonium tetrakis(pentafluorophenyl) borate, bis(dodecylphenyl) iodonium hexafluoroantimonate, dialkylphenyl iodonium hexafluoroantimonate, diaryliodonium salts of perfluoroalkylsulfonic acids (such as diaryliodonium salts of perfluorobutanesulfonic acid, perfluoroethanesulfonic acid, perfluorooctanesulfonic acid, and trifluoromethane sulfonic acid), diaryliodonium salts of aryl sulfonic acids (such as diaryliodonium salts of para-toluene sulfonic acid, dodecylbenzene sulfonic acid, benzene sulfonic acid, and 3-nitrobenzene sulfonic acid), triarylsulfonium salts of perfluoroalkylsulfonic acids (such as triarylsulfonium salts of perfluorobutanesulfonic acid, perfluoroethanesulfonic acid, perfluorooctanesulfonic acid, and trifluoromethane sulfonic acid), triarylsulfonium salts of aryl sulfonic acids (such as triarylsulfonium salts of para-toluene sulfonic acid, dodecylbenzene sulfonic acid, benzene sulfonic acid, and 3-nitrobenzene sulfonic acid), diaryliodonium salts of perhaloarylboronic acids, triarylsulfonium salts of perhaloarylboronic acid, or mixtures thereof.

The visible radiation initiator can include, but is not limited to, diketones (e.g., camphorquinone, 1,2-acenaphthylenedione, 11H-indole-2,3-dione, 5H-dibenzo[a,d]cycloheptene-10, and 11-dione), phenoxazine dyes (e.g., Resazurin, Resorufin), acylphosphine oxides, (e.g., diphenyl (2,4,6-trimethylbenzoyl) phosphine oxide), and the like.

In an embodiment, the polymerization of the coronene diimide charge-transport materials can be carried out as in-situ polymerization of a coated layer of the material, possibly during fabrication of the device of interest that includes the coronene diimide charge-transport material. In case of liquid crystal materials, these are preferably aligned in their liquid crystal state into homeotropic orientation prior to polymerization, where the conjugated pi-electron systems are orthogonal to the direction of charge transport. This ensures that the intermolecular distances are minimized and hence the energy required to transport charge between molecules is minimized. The molecules are then polymerized and/or cross-linked to fix the uniform orientation of the liquid crystal state. Alignment and curing are carried out in the liquid crystal phase or mesophase of the material. This technique is known in the art and is generally described for example in D. J. Broer, et al., Angew. Malcromol. Chem. 183, (1990), 45-66.

Polymers including the coronene diimide charge-transport material can have a molecular weight from about 3000 to 300,000 daltons, and about 2000 to 200,0000 daltons.

It should be emphasized that the embodiments of the present disclosure and Examples 1 and 2 below are merely possible examples of implementations, and are merely set forth for a clear understanding of the principles of this disclosure. Many variations and modifications may be made to the embodiment(s) of the disclosure and Examples 1 and 2 without departing substantially from the spirit and principles of the disclosure. All such modifications and variations are intended to be included herein within the scope of this disclosure and protected by the claims.

Example 1

Illustrative Synthesis of Coronene Diimide Liquid Crystals

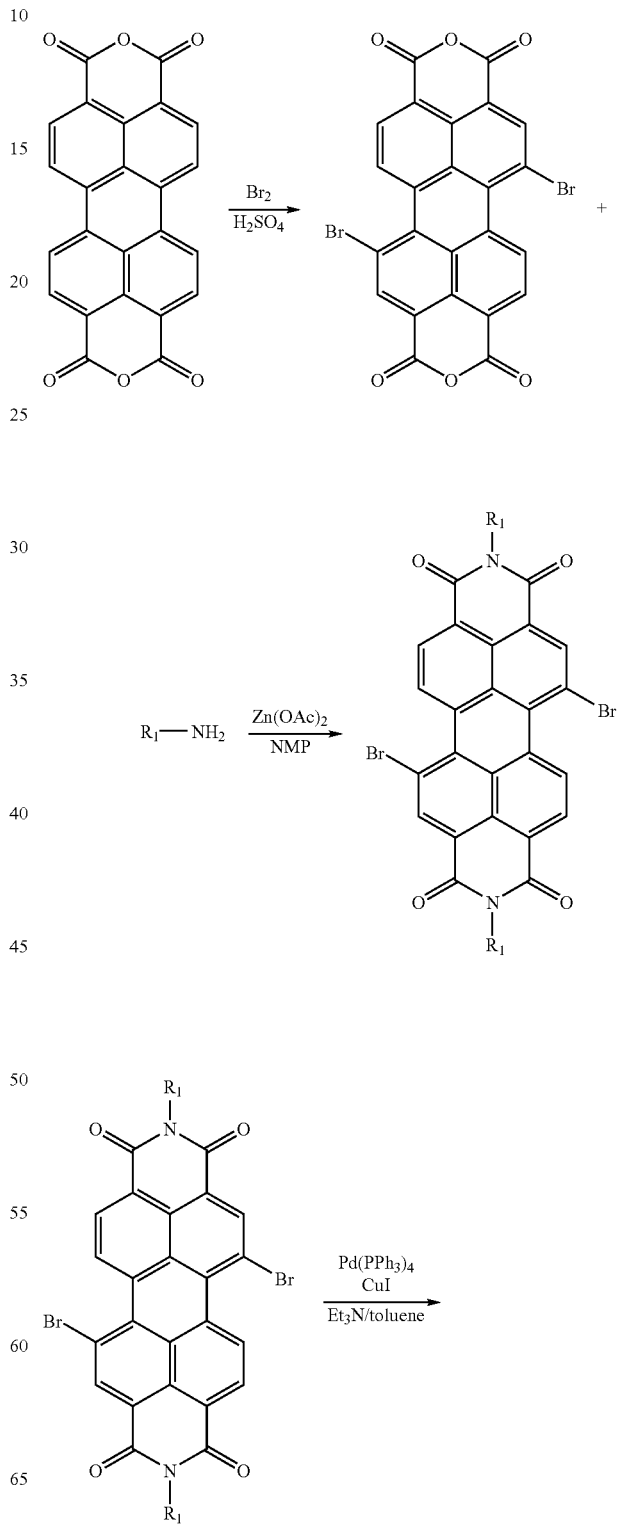

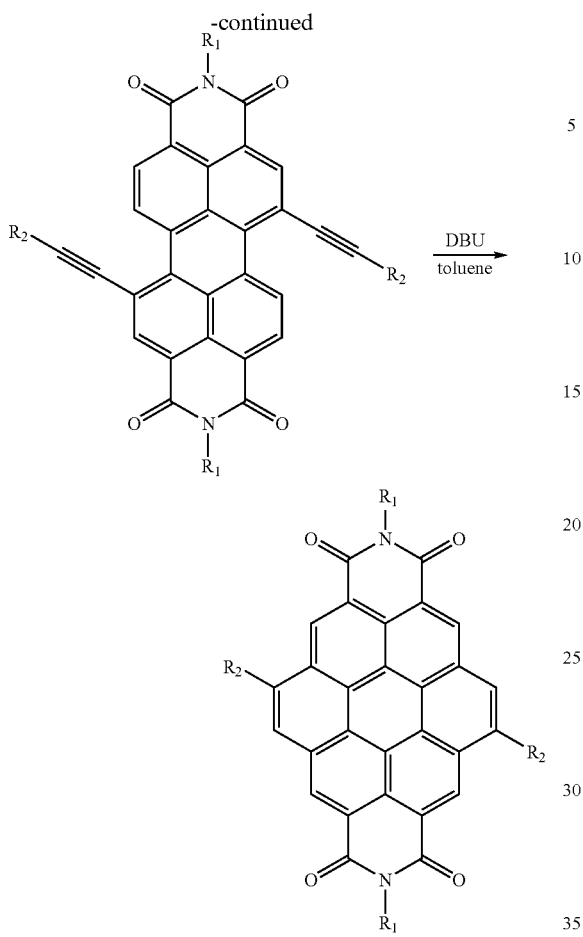

According to the general synthesis scheme above, bromination of perylene dianhydride in sulfuric acid produced 1,7-bisbromoperylene dianhydride, which was then condensed with primary amines to get 1,7-bisbromoperylene diimides. Subsequent cross coupling reaction between 1,7-bisbromoperylene diimides and terminal acetylene gave the diimides with substituted acetylene attached to the core, and these compounds were then cyclized into coronene diimides under basic condition. (See U. Rohr, P. Schlichting, A. Bohm, M. Gross, K. Meerholz, C. Brauchle, K. Mullen *Angew. Chem. Int. Ed.* 1998, 37, 1434 and U. Rohr, C. Kohl, K. Mullen, A. van de Craats and J. Warman, *J. Mater. Chem.* 2001, 11, 1789).

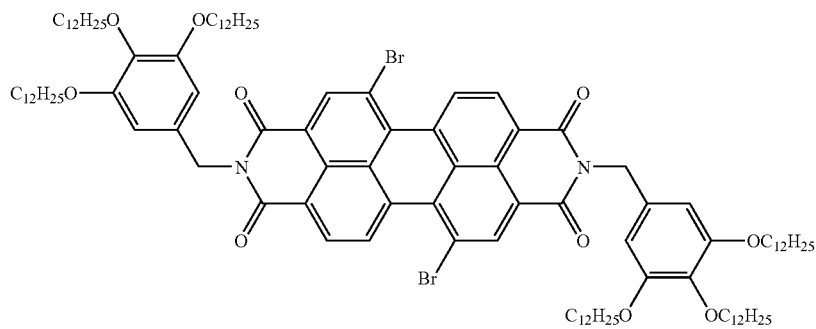

ZA-VI-70 and ZA-VI-73:

1,7-Dibromoperylene dianhydride (1.07 g, 1.95 mmol) in 160 ml 1:1 (v/v) BuOH/H$_2$O was sonicated for 10 min. Tridodecylbenzylamine (3.86 g, 5.85 mmol) was added and the reaction was stirred at 80° C. for 1 day, 15 ml HCl was added and the resultant precipitate was filtered, purified by chromatography eluting with 1:1 chloroform/hexane. 3.01 g (84%) red solid was obtained. $^1$H NMR (500 MHz, CDCl$_3$): δ(ppm): 9.43 (d, J=8.0 Hz, 2H), 8.90 (s, 2H), 8.67 (d, J=8.5 Hz, 2H), 6.79 (s, 4H), 5.26 (s, 4H), 3.94 (t, J=7.0 Hz, 8H), 3.87 (t, J=7.0 Hz, 4H), 1.75 (m, 8H), 1.68 (m, 4H), 1.5-1.1 (m, 108H), 0.85 (t, J=7.0 Hz, 18H). $^{13}$C NMR (125 MHz, CDCl$_3$): δ(ppm): 162.8, 163.4, 153.0, 138.2, 137.9, 132.1, 131.7, 130.2, 129.2, 128.5, 126.9, 123.2, 122.7, 120.8, 108.2, 73.4, 69.2, 44.0, 31.9, 30.3, 29.7, 29.6, 29.5, 29.4, 29.36, 26.1, 22.7, 14.1. (10 carbons not observed presumably due to overlapping resonances). MS (MALDI), m/z: calc. for C$_{110}$H$_{165}$N$_2$O$_{10}$Br$_2$ (M+H), 1832.0826; found 1832.0824. Elemental analysis, calc. for Cl$_{110}$H$_{164}$N$_2$O$_{10}$Br$_2$ C, 72.03; H, 9.01; N, 1.53; found C, 72.23; H, 9.30; N, 1.56.

8H), 3.87 (t, J=6.5 Hz, 4H), 3.36 (broad s, 4H), 2.0-1.0 (m, 144H), 0.93 (t, 6H), 0.81 (m, 18H). MS (MALDI), m/z: calculated for C$_{130}$H$_{198}$N$_2$O$_{10}$, 1947.5046; found, 1947.5155. Elemental analysis: calculated for C$_{130}$H$_{198}$N$_2$O$_{10}$, C, 80.11; H, 10.24; N, 1.44; found C, 80.23; H, 10.24; N, 1.49.

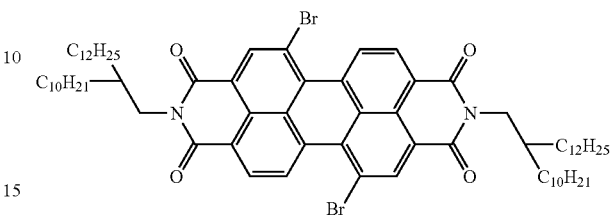

ZA-VI-77:

1,7-bisbromo-3,4,9,10-tetracarboxylic dianhydride (2.74 g, 4.98 mmol) in 200 ml BuOH/H$_2$O (1:1) was sonicated for

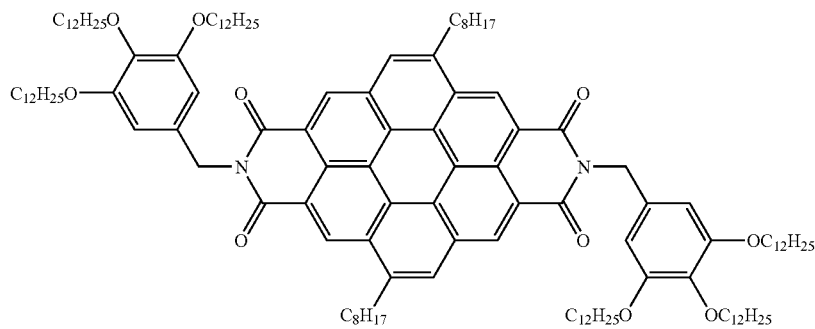

ZA-VI-75:

1,7-Bisbromo-N,N'-(3,4,5-tridodecylbenzyl)-3,4,9,10-tetracarboxylic diimide (1.47 g, 0.8 mmol) was suspended in 50 ml toluene and 5 ml triethylamine and degassed with nitrogen for 10 min. Tetrakis(triphenylphosphine)palladium (0) (0.12 g, 0.1 mmol), copper(I) iodide (0.02 g, 0.1 mmol) were added and the mixture further degassed and then 1-decyne (0.6 ml, 3.3 mmol) was added. The reaction was heated at 65° C. under nitrogen for 1 day. 0.5 ml DBU was added and the temperature was raised to 110° C. and the reaction was further stirred at this temperature under nitrogen for 21 h. After cooling to room temperature, the reaction was poured into 2 N HCl solution, extracted with dichloromethane, the organic solution dried over MgSO$_4$. The solvent was removed and the residue purified by chromatography eluting with 2:1 chloroform/hexane. Then more purification was performed to get pure compound. 0.75 g (48%) yellow solid was obtained. $^1$H NMR (500 MHz, CD$_2$Cl$_2$): δ(ppm): 9.16 (s, 2H), 8.85 (s, 2H), 7.89 (s, 2H), 7.02 (s, 4H), 5.55 (s, 4H), 4.08 (broad s, 10 min, 2-decyl-1-tetradecylamine (6.2 g, 17.53 mmol) was added, and the reaction mixture was heated at 80° C. for 17 h under nitrogen. 20 ml HCl was added and the mixture stirred at room temperature for 30 min. The mixture was extracted with chloroform, dried over MgSO$_4$, and filtered. The solvent was removed and the residue purified by chromatography eluting with 1:1 CHCl$_3$/Hexane, 4.9 g (81%) red solid was obtained. $^1$H NMR (500 MHz, CDCl$_3$): δ (ppm): 9.43 (d, J=8.5 Hz, 2H), 8.87 (s, 2H), 8.64 (d, J=8.0 Hz, 2H), 4.11 (d, J=7.0 Hz, 4H), 1.98 (m, 2H), 1.5-1.1 (m, 80H), 0.84 (m, 12H). $^{13}$C NMR (125 MHz, CDCl$_3$): δ(ppm): 163.2, 162.7, 138.1, 132.9, 132.7, 130.0, 129.2, 128.4, 126.9, 123.1, 122.7, 120.8, 44.8, 36.6, 31.9, 31.7, 31.6, 30.0, 29.68, 29.65, 29.3, 26.5, 22.7, 14.1. (12 aliphatic carbons not observed presumably due to overlapping resonances). MS (MALDI), m/z: calculated for C$_{72}$H$_{105}$Br$_2$N$_2$O$_4$ (M+H), 1219.6536; found 1220.6513. Elemental analysis, calc. for C$_{72}$H$_{104}$Br$_2$N$_2$O$_4$, C, 70.80; H, 8.58; N, 2.29; found C, 70.98; H, 8.59; N, 2.34.

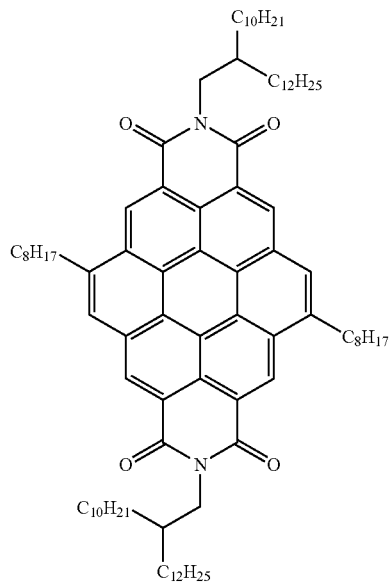

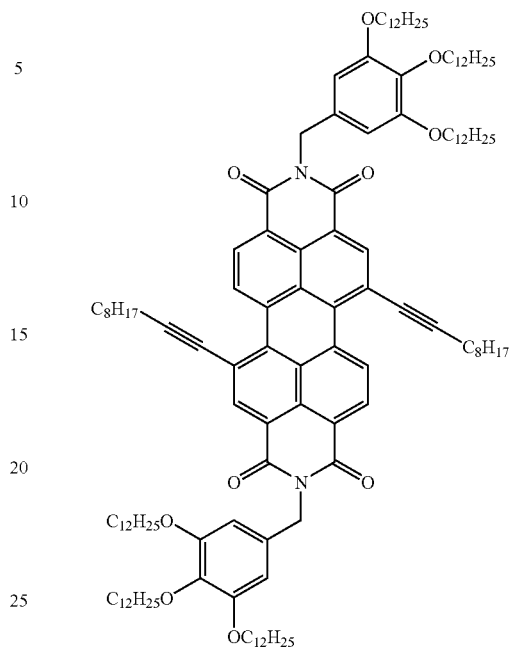

ZA-VI-79:

ZA-VI-77 (2.2 g, 1.8 mmol) was dissolved in 50 ml toluene and 10 ml triethylamine, degassed with nitrogen for 10 min. Tetrakis(triphenylphosphine) palladium(0) (0.28 g, 0.24 mmol), copper(I) iodide (0.034 g, 0.18 mmol) and 1-decyne (1.3 ml, 7.20 mmol) were added successively. The reaction was heated at 65° C. under nitrogen for 1 day. 0.5 ml DBU was added and the reaction temperature was raised to 100° C. and stirred for 16 h. Then 0.5 ml more DBU was added and the reaction temperature was raised to 110° C. and the reaction was further stirred at this temperature for 1 day. The reaction mixture was cooled to room temperature and poured into 2 N HCl solution, extracted with dichloromethane. The solvent was removed and the residue purified by chromatography eluting with 1:3 chloroform/hexane. 1.9 g (86%) yellow solid was obtained. $^1$H NMR (500 MHz, CDCl$_3$): δ(ppm): 9.32 (s, 2H), 9.10 (s, 2H), 8.25 (s, 2H), 4.42 (d, J=7.0 Hz, 4H), 3.52 (t, J=7.0 Hz, 4H), 2.15 (m, 2H), 2.00 (m, 4H), 1.63 (m, 4H), 1.55-1.0 (m, 104H), 0.91 (t, J=7.0 Hz, 6H), 0.80 (m, 12H). $^{13}$C NMR (125 MHz, CDCl$_3$): δ(ppm): 164.9, 164.7, 141.1, 129.4, 128.7, 128.1, 127.5, 125.5, 122.1, 121.5, 121.0, 120.8, 120.7, 119.5, 45.5, 37.5, 34.0, 32.4, 32.3, 31.3, 30.64, 30.62, 30.4, 30.1, 30.07, 30.01, 29.9, 29.74, 29.70, 27.1, 23.2, 23.0, 14.6, 14.5. (11 aliphatic carbons not observed presumably due to overlapping resonances). MS (MALDI), m/z calc. for $C_{92}H_{139}N_2O_4$ (M+H), 1336.0808; found 1337.0807. Elemental analysis: calculated for $C_{92}H_{138}N_2O_4$, C, 82.70; H, 10.41; N, 2.10; found C, 82.82; H, 10.55; N, 2.21.

ZA-VI-89:

1,7-Bisbromo-N,N'-(3,4,5-tridodecylbenzyl)-3,4,9,10-tetracarboxylic diimide (1.02 g, 0.56 mmol) was suspended in 35 ml toluene and 3.5 ml triethylamine, degassed with nitrogen for 10 min. Tetrakis(triphenylphosphine)palladium(0) (0.064 g, 0.055 mmol), copper(I) iodide (0.012 g, 0.063 mmol) and 1-decyne (0.4 ml, 2.20 mmol) were added successively. The reaction was heated at 65° C. under nitrogen for 22 h and poured into 2 N HCl solution. The solvent was removed and the residue purified by chromatography eluting with 2:1 chloroform/hexane, 0.94 g (87%) red solid was obtained. $^1$H NMR (500 MHz, CDCl$_3$): δ(ppm): 10.05 (d, J=8.5 Hz, 2H), 8.72 (s, 2H), 8.59 (d, J=8.5 Hz, 2H), 6.79 (s, 4H), 5.27 (s, 4H), 3.95 (t, J=6.5 Hz, 8H), 3.87 (t, J=6.5 Hz, 4H), 2.62 (t, J=7.0 Hz, 4H), 1.8-1.6 (m, 16H), 1.53 (m, 4H), 1.5-1.1 (m, 124H), 0.85 (m, 24H). $^{13}$C NMR (125 MHz, CDCl$_3$): δ(ppm): 163.3, 163.1, 153.0, 138.2, 137.8, 134.3, 133.9, 132.0, 130.4, 127.5, 127.2, 127.0, 122.8, 121.8, 121.0, 108.1, 101.5, 82.2, 73.4, 69.1, 43.9, 31.9, 31.8, 30.3, 29.73, 29.70, 29.65, 29.61, 29.46, 29.44, 29.36, 29.23, 29.21, 29.13, 28.3, 26.1, 22.7, 22.6, 20.3, 14.1. (11 aliphatic carbons not observed presumably due to overlapping resonances). MS (MALDI), m/z, calc. for $C_{130}H_{198}N_2O_{10}$ 1947.5038; found 1947.5046. Elemental analysis: calculated for $C_{130}H_{198}N_2O_{10}$, C, 80.11; H, 10.24; N, 1.44; found C, 80.25; H, 10.26; N, 1.46.

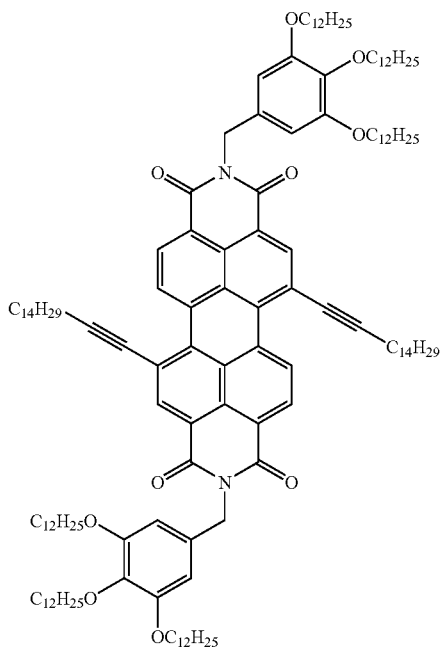
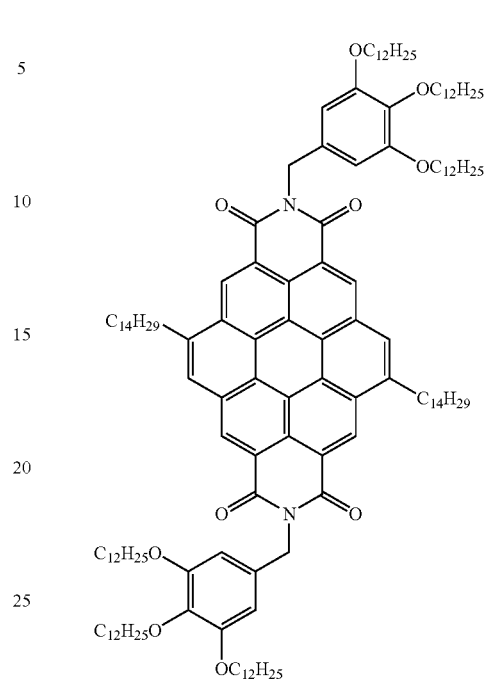

ZA-VII-1:

1,7-Bisbromo-N,N'-(3,4,5-tridodecylbenzyl)-3,4,9,10-tetracarboxylic diimide (2.0 g, 1.1 mmol) was suspended in 70 ml toluene and 10 ml triethylamine, degassed with nitrogen for 10 min. Tetrakis(triphenylphosphine)palladium(0) (0.12 g, 0.1 mmol), copper(I) iodide (0.02 g, 0.1 mmol) and 1-hexadecyne (1.2 ml, 4.3 mmol) were added successively. The reaction was heated at 70° C. under nitrogen for 42 h and poured into 2 N HCl solution. The solvent was removed and the residue purified by chromatography eluting with 2:1 chloroform/hexane, 1.96 g (85%) red solid was obtained. $^1$H NMR (500 MHz, CDCl$_3$): δ(ppm): 9.95 (d, J=8.5 Hz, 2H), 8.57 (s, 2H), 8.49 (d, J=8.0 Hz, 2H), 6.79 (s, 4H), 5.28 (s, 4H), 3.95 (t, J=6.0 Hz, 8H), 3.86 (t, J=6.5 Hz, 4H), 2.61 (t, J=7.0 Hz, 4H), 1.8-1.6 (m, 16H), 1.6-1.1 (m, 152H), 0.85 (t, J=7.0 Hz, 24H). $^{13}$C NMR (125 MHz, CDCl$_3$): δ(ppm): 163.1, 162.9, 153.0, 138.1, 137.8, 134.0, 133.6, 131.9, 130.2, 127.3, 127.1, 126.8, 122.7, 121.7, 120.9, 108.0, 101.8, 82.2, 73.3, 69.1, 43.9, 31.9, 30.3, 29.71, 29.65, 29.57, 29.47, 29.45, 29.36, 29.3, 29.2, 28.3, 26.1, 22.7, 20.3, 14.1. (21 aliphatic carbons not observed presumably due to overlapping resonances). MS (MALDI), m/z: calc. for C$_{142}$H$_{223}$N$_2$O$_{10}$ (M+H) 2116.7; found 2116.8. Elemental analysis: calc. for C$_{142}$H$_{222}$N$_2$O$_{10}$, C, 80.55; H, 10.57; N, 1.32; found C, 80.69; H, 10.68; N, 1.36.

ZA-VII-5:

ZA-VII-1 (1.78 g, 0.84 mmol) was dissolved in 50 ml toluene, 1 ml DBU was combined and the mixture was heated at 110° C. under argon for 42 h. After cooling to room temperature, the reaction mixture was poured into 2 N HCl and extracted with hexane. After removal of solvent, the material was purified by chromatography eluting with 1:1 chloroform/hexane. 0.65 g (37%) yellow solid was obtained. $^1$H NMR (500 MHz, CDCl$_3$): δ(ppm): 9.55 (s, 2H), 9.27 (s, 2H), 8.26 (s, 2H), 7.05 (s, 4H), 5.62 (s, 4H), 4.08 (br. s, 8H), 3.89 (t, J=6.5 Hz, 4H), 3.57 (br. s, 4H), 1.97 (br. m, 4H), 1.78 (m, 8H), 1.69 (m, 4H), 1.65 (m, 4H), 1.5-1.1 (m, 148H), 0.84 (m, 24H). $^{13}$C NMR (125 MHz, CDCl$_3$): δ(ppm): 164.1, 163.9, 153.2, 140.7, 138.0, 132.4, 129.1, 128.1, 127.5, 127.1, 125.2, 121.4, 120.9, 120.7, 120.4, 120.2, 118.8, 108.4, 73.4, 69.3, 44.4, 33.6, 31.93, 31.88, 31.1, 30.4, 29.96, 29.79, 29.78, 29.76, 29.70, 29.68, 29.64, 29.63, 29.57, 29.53, 29.4, 29.3, 26.2, 26.1, 22.7, 22.6, 14.09, 14.06. (13 aliphatic carbons not observed presumably due to overlapping resonances). Elemental analysis: calc. for C$_{142}$H$_{222}$N$_2$O$_{10}$, C, 80.55; H, 10.57; N, 1.32; found C, 80.32; H, 10.50; N, 1.35.

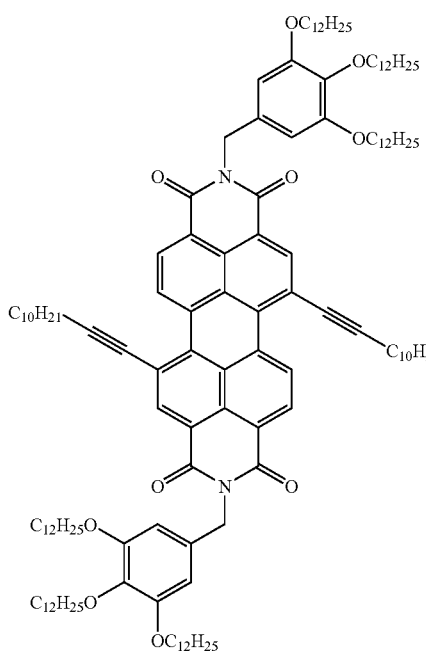

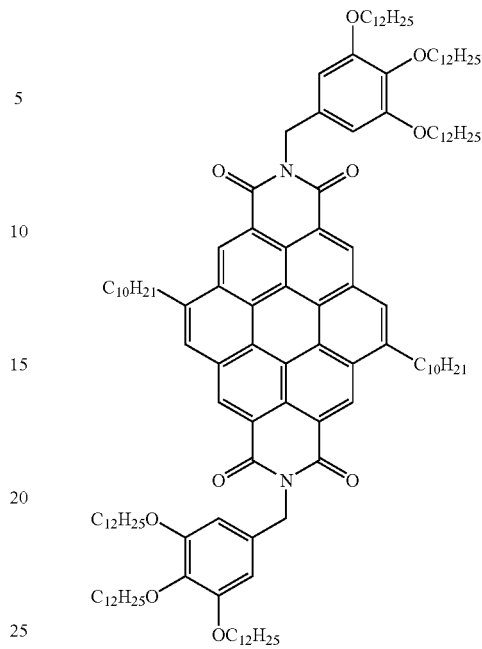

ZA-VII-11:

1,7-Bisbromo-N,N'-(3,4,5-tridodecylbenzyl)-3,4,9,10-tetracarboxylic diimide (1.60 g, 0.87 mmol) was suspended in 8 ml Et$_3$N and 60 ml toluene, degassed with argon for 10 min. Tetrakis(triphenylphosphine)palladium(0) (0.12 g, 0.10 mmol), copper(I) iodide (0.02 g, 0.10 mmol) and 1-dodecyne (0.76 ml, 3.48 mmol) were added successively. The reaction was heated at 70° C. under argon for 24 h, cooled to room temperature, and washed with 2 N HCl solution twice. The solvent was removed and the residue purified by chromatography eluting with 2:1 chloroform/hexane. 1.16 g (73%) dark red solid was obtained. $^1$H NMR (500 MHz, CDCl$_3$): δ(ppm): 9.98 (d, J=8.0 Hz, 2H), 8.67 (s, 2H), 8.53 (d, J=8.0 Hz, 2H), 6.79 (s, 4H), 5.25 (s, 4H), 3.95 (t, J=6.5 Hz, 8H), 3.86 (t, J=6.5 Hz, 4H), 2.61 (t, J=2.61, 4H), 1.8-1.6 (m, 16H), 1.6-1.1 (m, 136H), 0.86 (m, 24H). $^{13}$C NMR (125 MHz, CDCl$_3$): δ(ppm): 163.2, 163.0, 153.0, 138.2, 137.8, 134.1, 133.7, 132.0, 130.3, 127.4, 127.2, 126.8, 122.7, 121.7, 120.9, 108.0, 101.7, 82.2, 73.4, 69.1, 43.9, 31.9, 30.3, 29.73, 29.72, 29.71, 29.67, 29.65, 29.61, 29.56, 29.47, 29.45, 29.4, 29.3, 29.26, 29.19, 28.3, 26.1, 22.7, 20.3, 14.1. (12 aliphatic carbons not observed presumably due to overlapping resonances). Elemental analysis: calc. for C$_{134}$H$_{206}$N$_2$O$_{10}$, C, 80.27; H, 10.36; N, 1.40; found C, 80.28; H, 10.39; N, 1.45.

ZA-VII-13:

ZA-VII-11 (1.09 g, 0.54 mmol) was dissolved in 100 ml toluene and heated to 100° C. under argon, 0.32 ml DBU was added. The reaction was heated at 100° C. under argon for 20 h, cooled to room temperature, and washed with 2 N HCl twice. The solvent was removed and the residue purified by chromatography eluting with dichloromethane, 0.90 g (83%) yellow solid was obtained. $^1$H NMR (500 MHz, CDCl$_3$): δ(ppm): 9.56 (s, 2H), 9.29 (s, 2H), 8.28 (s, 2H), 7.05 (s, 4H), 5.62 (s, 4H), 4.08 (br. s, 8H), 3.88 (t, J=7.0 Hz, 4H), 3.58 (br. s, 4H), 1.98 (m, 4H), 1.78 (m, 8H), 1.68 (m, 4H), 1.59 (m, 4H), 1.5-1.1 (m, 136H), 0.85 (m, 24H). $^{13}$C NMR (125 MHz, CDCl$_3$): δ(ppm): 163.8, 163.6, 153.2, 140.2, 138.0, 132.3, 128.7, 127.6, 127.0, 126.6, 124.8, 120.8, 120.4, 120.1, 119.8, 119.5, 118.1, 108.5, 73.3, 69.2, 44.26, 33.4, 32.0, 31.9, 30.8, 30.4, 30.0, 29.8, 29.71, 29.68, 29.64, 29.61, 29.53, 29.45, 29.4, 29.3, 26.2, 26.1, 22.7, 22.6, 14.1, 14.0. (11 aliphatic carbons not observed presumably due to overlapping resonances). Elemental analysis: calc. for C$_{134}$H$_{206}$N$_2$O$_{10}$, C, 80.27; H, 10.36; N, 1.40; found C, 80.26; H, 10.35; N, 1.45.

Spectroscopic Properties of Liquid Coronene Diimides:

Four exemplar coronene diimides have been made and their absorption and emission were taken in dichloromethane. For emission measurement, the absorbance of the lowest energy band (512 nm) was controlled between 0.03-0.02; perylene was used as standard for quantum yield measurement, and quantum yield was determined by averaging three samples degassed with argon.

All the coronene diimides exhibit three absorption bands from 300-550 nm. The two lower energy bands show fine vibronic structures similar to that of perylene diimides and the lowest energy band is less intense. Although coronene diimides have extended conjugation relative to perylene diimides, the lowest energy band (512 nm) is blue-shifted compared to that of perylene diimides (525 nm). Theoretical calculation indicated that coronene diimides could not be regarded as simple analogs of perylene diimides. The lowest energy transition of perylene diimides is associated with polarization along the longer molecular axis; while the lowest energy transition of coronene diimides is related to polarization along the shorter molecular axis and is formally a quantum mechanically forbidden transition, which results in the corresponding blue-shift and weakened absorption intensity. (Adachi, M.; Nagao, Y. *Chem. Mater.* 2001, 13, 662-669) FIG. 1 illustrates the absorption and emission of ZA-VI-79 in dichloromethane, where the excitation is at about 427 nm.

X-ray Diffraction of Coronene Diimides:

X-ray diffraction patterns were taken after heating the sample above clearing point and cooling down to room temperature.

ZA-VI-75 and ZA-VII-5 only give one sharp peak at low angle region, so a specific liquid crystalline phase cannot be assigned. By assuming hexagonal phase, the lattice parameter calculated is $a_0=33.4$ Å and $a_0=31.3$ Å for ZA-VI-75 and ZA-VII-5, respectively. Also the sharp peak at the wide-angle region for both compounds, which is indexed to (001) peak, indicates that there exists a relatively long-range order within the column. And the distance of neighboring discs within the same column is 3.5 Å for both compounds.

ZA-VII-13 gives a series of peaks at the low-angle region, which are indexed to (100), (010), (110), (200), (020) planes of a rectangular phase. The reciprocal d spacing of (100):(200) and (010):(020) is 1:2, characteristics of a rectangular phase. And the lattice parameters are calculated to be $a_0=61.6$ Å, $b_0=34.4$ Å. Also, the sharp peak at the wide-angle region indicates an ordered mesophase, which gives an intermolecular separation of 3.5 Å.

The dove-tailed compound ZA-VI-79 displays three Bragg peaks at low-angle region, which are indexed to (100), (110) and (200) planes and whose reciprocal d spacing is $1:3^{1/2}:2$, suggesting a hexagonal mesophase. The additional sharp peak at the wide-angle region gives intermolecular distance of 3.5 Å in an ordered phase.

Figure 2:
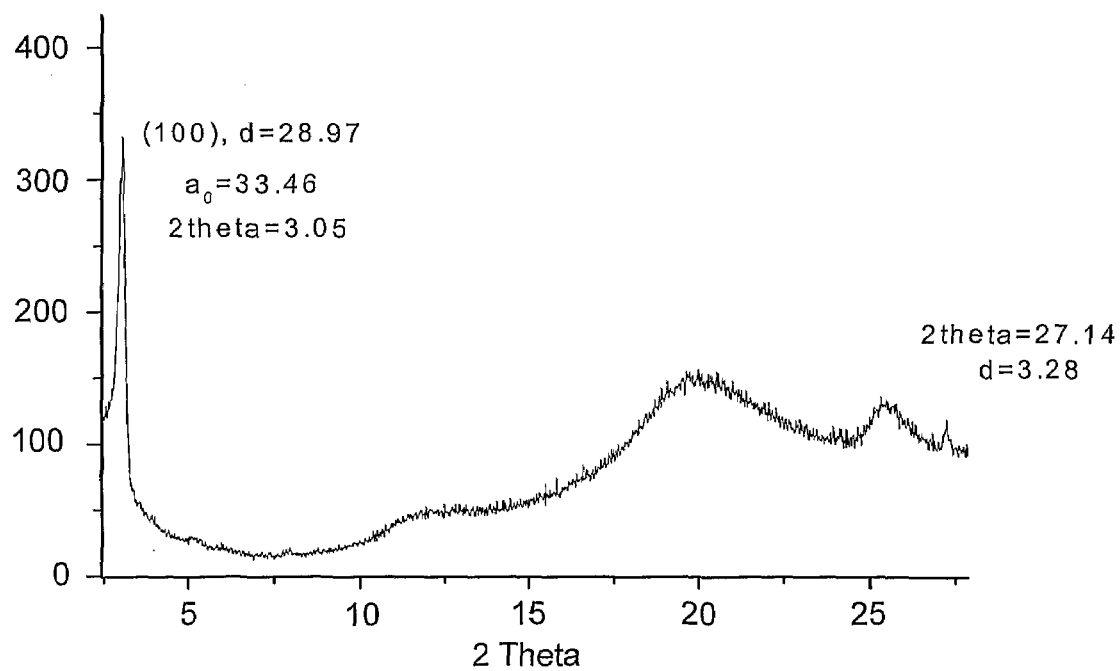
FIG. 2 illustrates an XRD of ZA-VI-75 at room temperature after heating over clearing point and cooling to room temperature.
Figure 3:
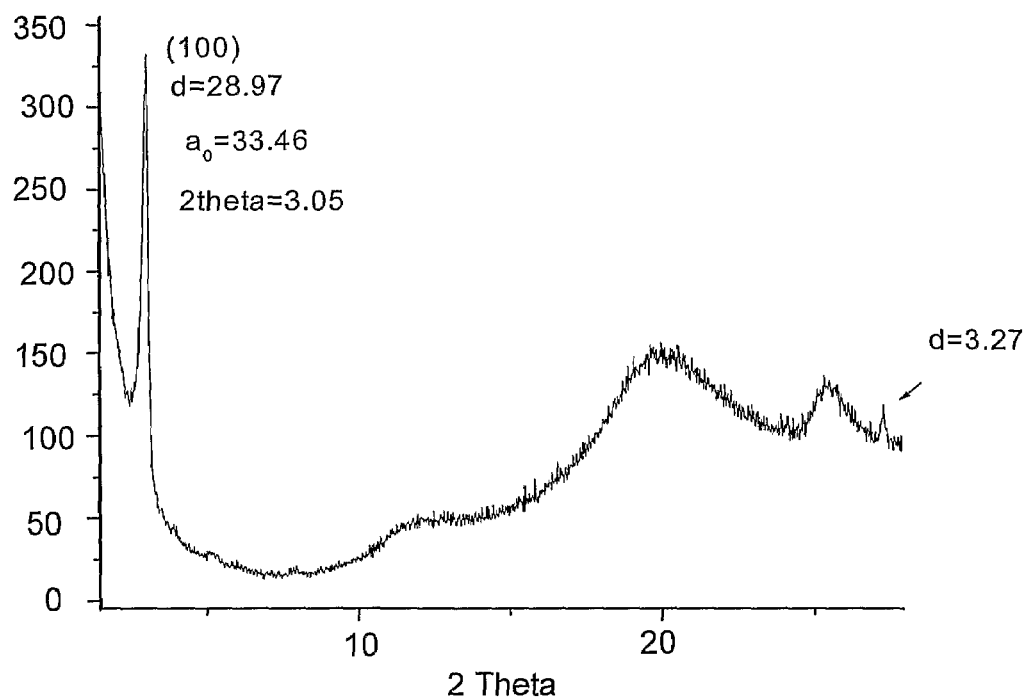
FIG. 3 illustrates an XRD of ZA-VII-5 at room temperature after heating over clearing point and cooling to room temperature.
Figure 4:
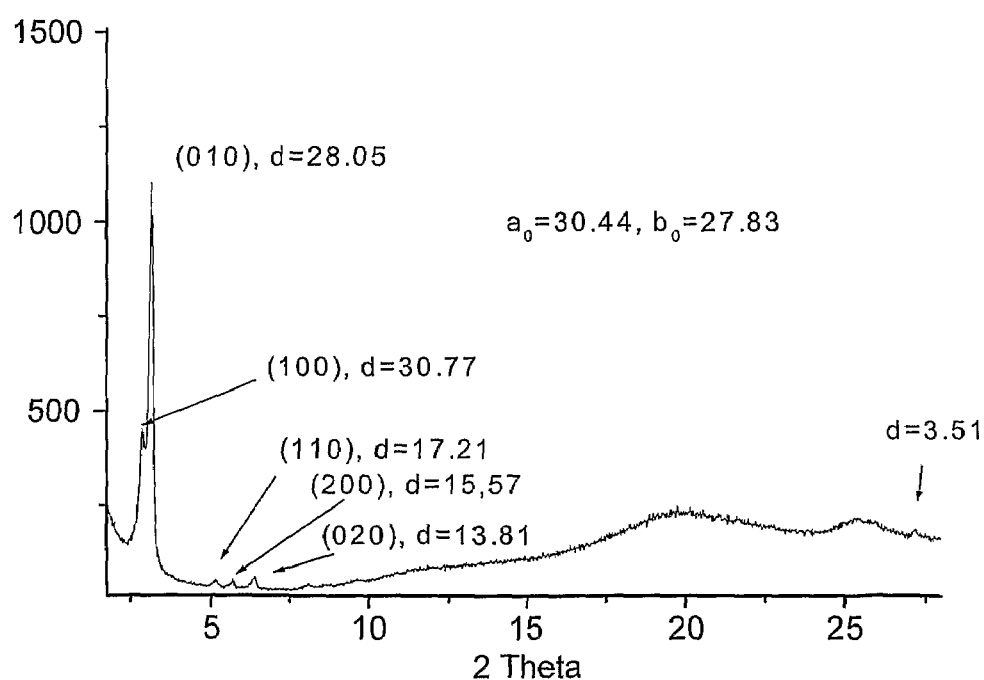
FIG. 4 illustrates XRD of ZA-VII-13 at room temperature after heating over clearing point and cooling to room temperature.
Figure 5:
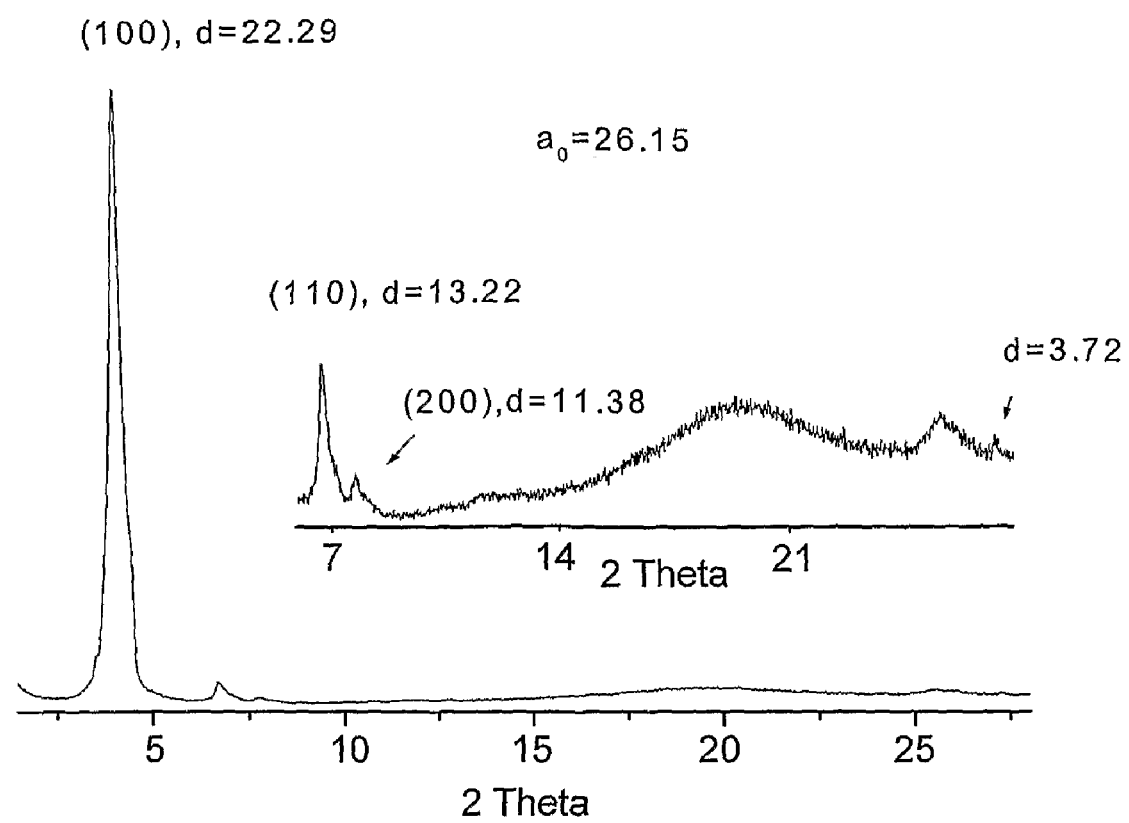
FIG. 5 illustrates an XRD of ZA-VI-79 at room temperature after heating over clearing point and cooling to room temperature.
Figure 6A:
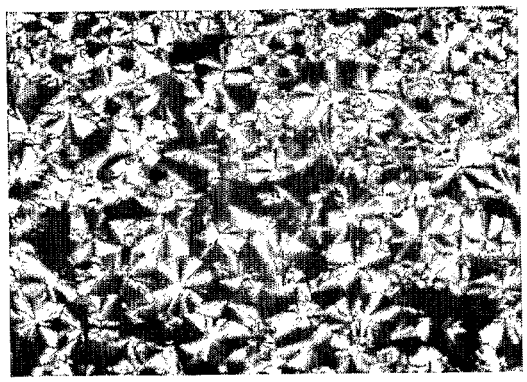
FIGS. 6A through 6D illustrate the optical texture of ZA-VI-75 (FIG. 6A), ZA-VI-79 (FIG. 6B), ZA-VII-5 (FIG. 6C), and ZA-VII-13 (FIG. 6D) under crossed polarizer at room temperature.
Figure 6B:
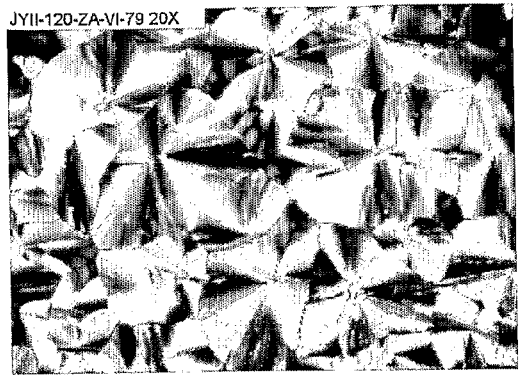
Figure 6C:
Figure 6D:
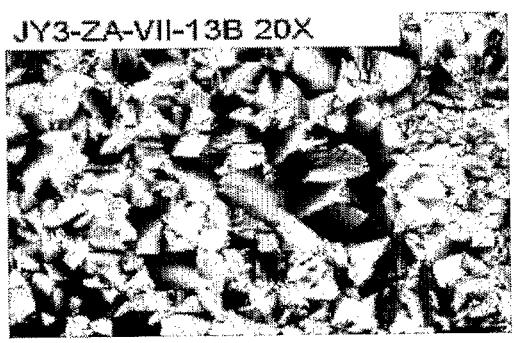
Figure 7A:
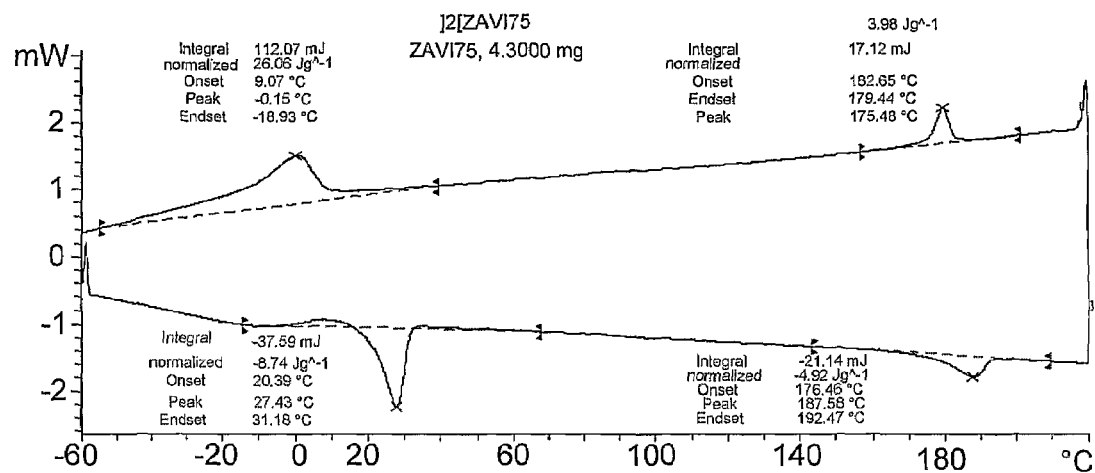
FIGS. 7A through 7D illustrate DSC traces (second heating/cooling cycle) of ZA-VI-75 (FIG. 7A), ZA-VI-79 (FIG. 7B), ZA-VII-5 (FIG. 7C) and ZA-VII-13 (FIG. 7D).
Figure 7B:
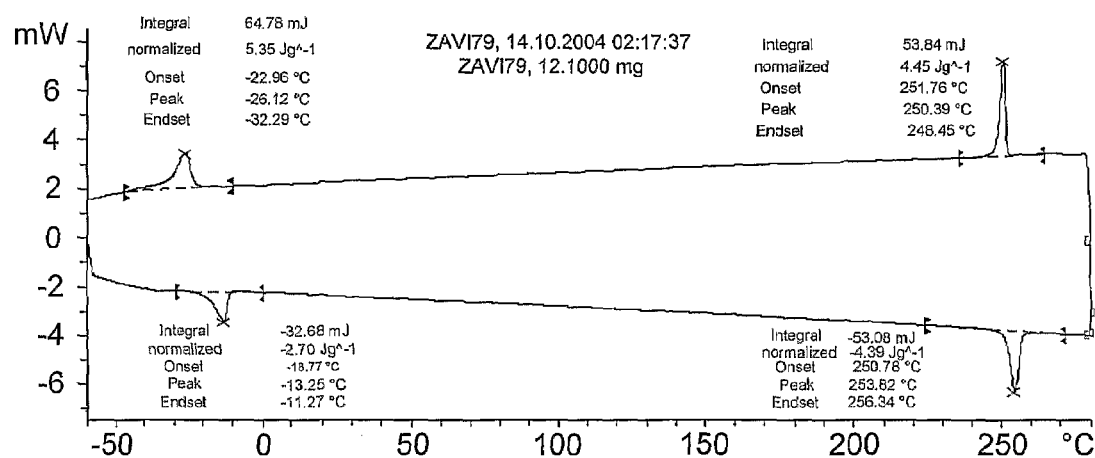
Figure 7C:
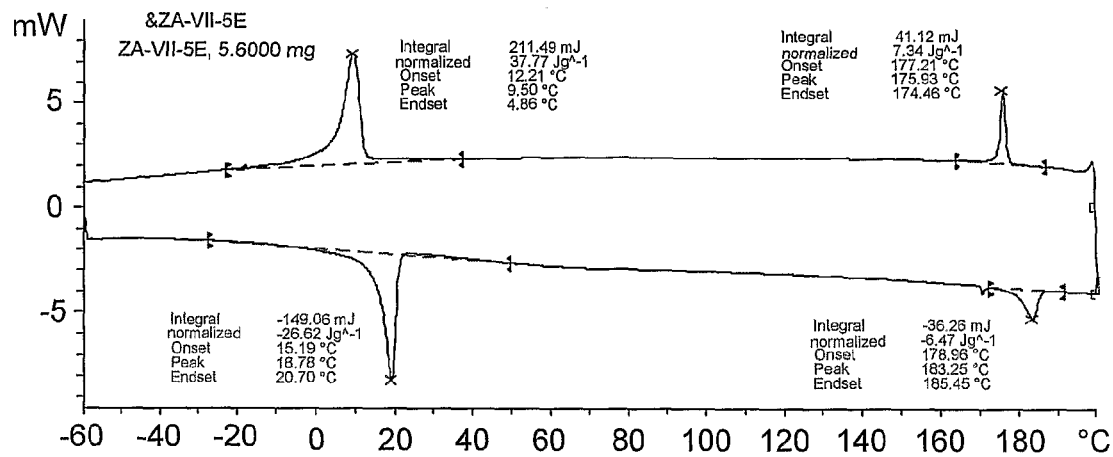
Figure 7D:
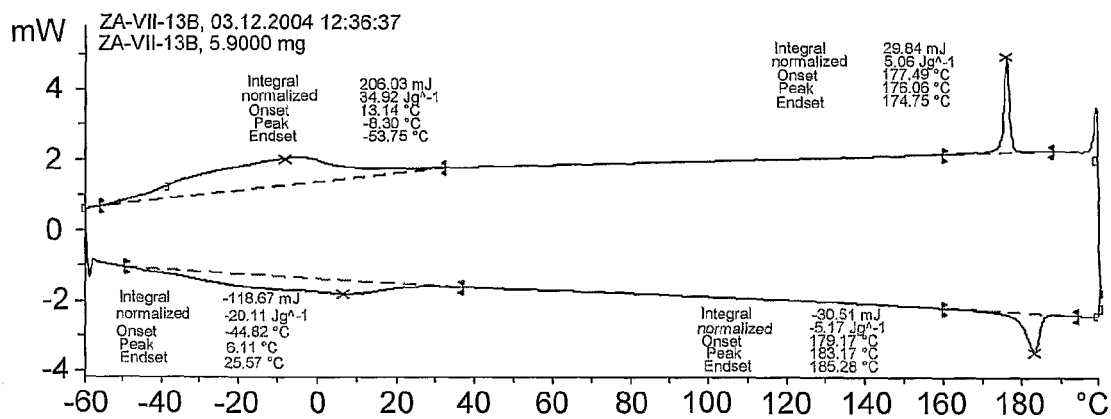

FIG. 2 illustrates an XRD of ZA-VI-75 at room temperature after heating over clearing point and cooling to room temperature. FIG. 3 illustrates an XRD of ZA-VII-5 at room temperature after heating over clearing point and cooling to room temperature. FIG. 4 illustrates XRD of ZA-VII-13 at room temperature after heating over clearing point and cooling to room temperature. FIG. 5 illustrates an XRD of ZA-VI-79 at room temperature after heating over clearing point and cooling to room temperature.

DSC and Optical Texture:

The liquid crystalline properties of the coronene diimides have been studied by polarized microscope and differential scanning calorimetry. All the materials show focal conic fan texture, typical of hexagonal columnar mesophases (FIG. 6), when observed under crossed polarizers at room temperature for the materials cooled from the melts. The DSC traces (FIG. 7) reveal that all the materials can form liquid crystals over a wide temperature range with ZA-VI-79 being a room-temperature liquid crystal and a phase transition of possibly assignable to a crystal to liquid crystal transition being close to room temperature for ZA-VI-75, ZA-VII-5 and ZA-VII-13.

Figure 8A:
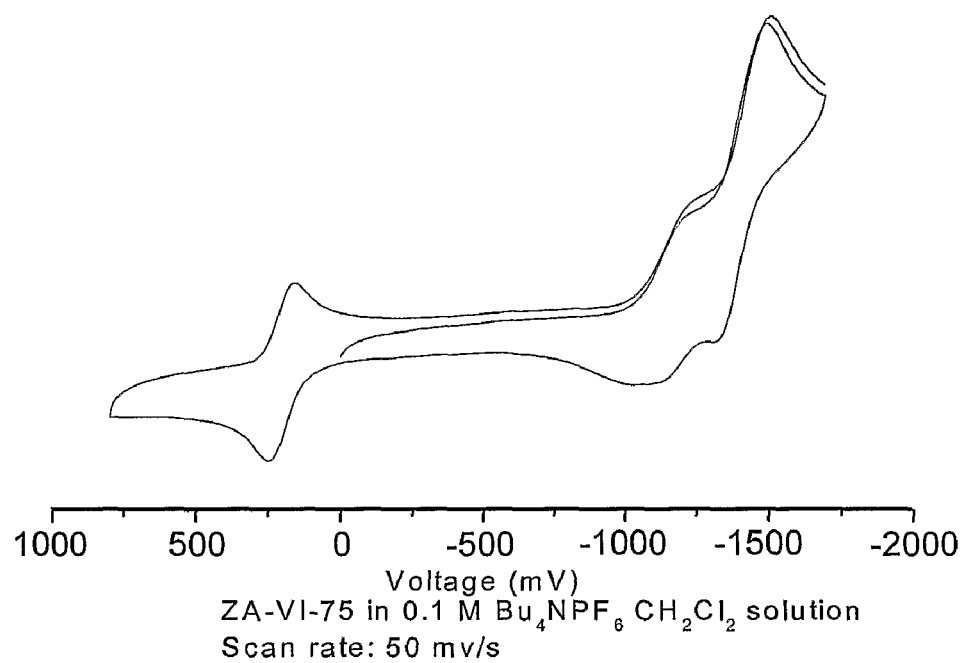
FIGS. 8A and 8B illustrates cyclic voltammetry of ZA-VI-75 (FIG. 8A) and ZA-VI-79 (FIG. 8B).
Figure 8B:
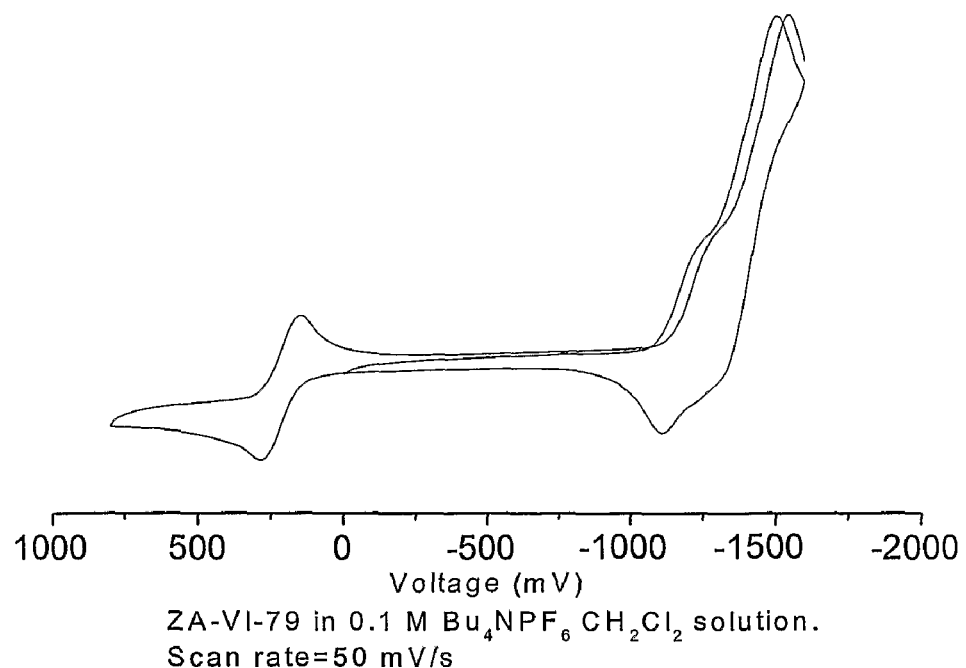

Electrochemistry:

The cyclic voltammetry (FIG. 8) of ZA-VI-75 and ZA-VI-79 displays two reversible reductions with the current of the second reduction being twice of that of the first reduction. The first reduction potential of these two compounds vs. ferrocene is about −1.4 V.

Figure 9:
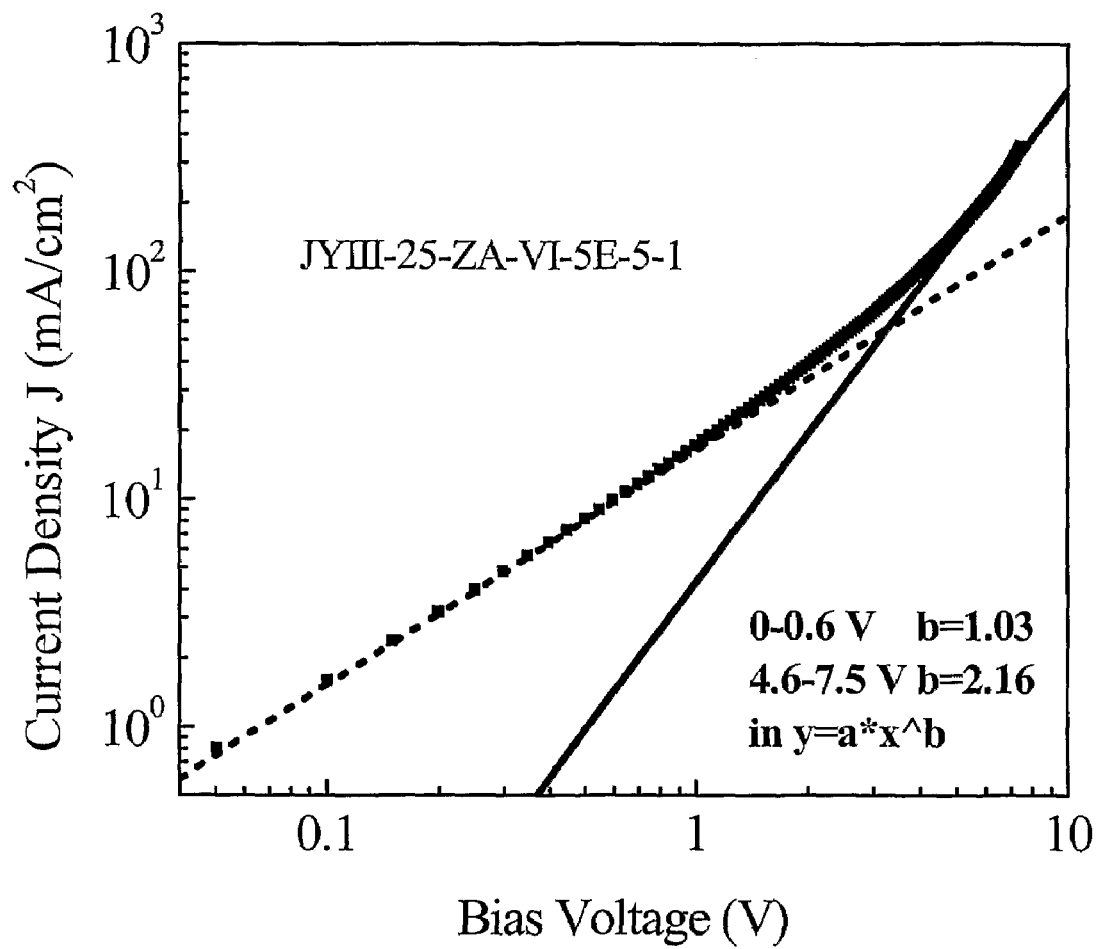
FIG. 9 illustrates the J-V curve of ZA-VII-5.

Mobility Measurement:

The charge carrier mobility of the liquid-crystalline compounds have been measured by space-charge limited current (SCLC) method (P. N. Murgatroyd, *J. Phys.* 1970, D 3, 151). The compounds were melted between an ITO electrode and another electrode of Ag coated glass. The mobility was derived from the J-V curve of ZA-VII-5 (FIG. 9), which was calculated by power fitting to be 3.14 $cm^2/Vs$ at an electric field of $1.5 \times 10^4$ V/cm.

Example 2

The coronene diimide charge-transport materials can be used in organic electronic devices, including, but not limited to, organic light-emitting diodes, lasers, photovoltaic cells, photodetectors, active and passive electronic devices, and memories. Active electronic devices include, but are not limited to, diodes and transistors. Passive electronic devices include, but are not limited to, resistors, capacitors, and inductors. Active and passive electronic devices can be combined to form electrical circuits with properties tailored to the need of specific applications. For example, transistors can be combined to form inverters and ring oscillators. Likewise, passive elements can be combined to form resonant circuits and various filters. Electronic devices and circuits are the foundation of modern electronics and are well known in the art. Examples of applications can be found for instance in P. Horowitz and W. Hill, The Art of Electronics, Cambridge University Press, Cambridge, 1989.

Organic electronic devices typically include one or several organic semiconductors that can conduct electrical charge. In devices, such as organic light-emitting diodes, transistors and memories, charges are injected into the organic semiconductor through electrical contacts formed with conductive electrodes such as metals and conductive oxides. In photovoltaic cells and photodetectors, electrical charges are produced by the optical absorption of light. These charges are then collected through electrical contacts formed with conductive electrodes such as metals and conductive oxides. In some devices and circuits it is important to combine two different organic semiconductors, one of which conducts electrons, and the other conducts holes. Preferably, the two semiconductors have hole- and electron-mobilities that are comparable. Interfaces formed between such semiconductors are often called heterojunctions.

Figure 10:
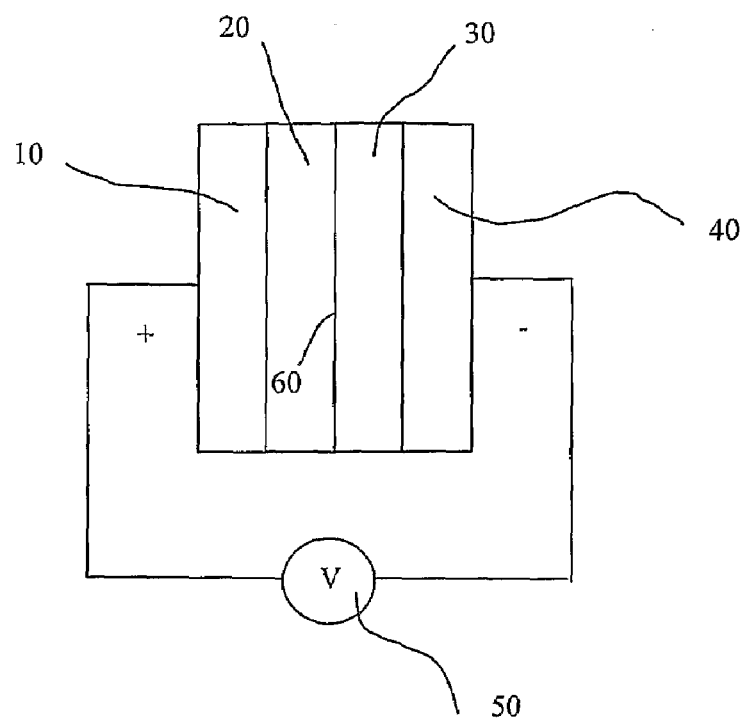
FIG. 10 is a schematic of an organic light-emitting diode.

In an embodiment, the coronene diimide charge-transport materials are used as electron-transport materials in organic light-emitting devices. An example of a geometry structure for such a device is shown in FIG. 10. In this device a hole-transport organic semiconductor 20 and an electron-transport organic semiconductor 30 are sandwiched between an anode 10 and a cathode 40. When a voltage is applied by a power supply 50 with positive electrode applied to anode 10 and negative electrode applied to cathode 40, holes get injected into hole-transport semiconductor 20 and electrons get injected into electron-transport semiconductor 30. Holes and electrons form excited states at the heterojunction 60, the recombination of which leads to emission of light through at least one of the electrodes (10 or 40) that is semitransparent. The hole-transport semiconductor 20 can be a triphenyl-diamine (TPD) derivative thin film or other hole-transport materials known in the art, the anode 10 can be indium tin oxide (ITO), the electron-transport semiconductor 30 can include of one or more of the coronene diimide charge-transport materials described herein, and the cathode 40 can be a metal including, but limited to, Ca, Ag, Mg, Al, Au, or mixtures thereof.

Figure 11:
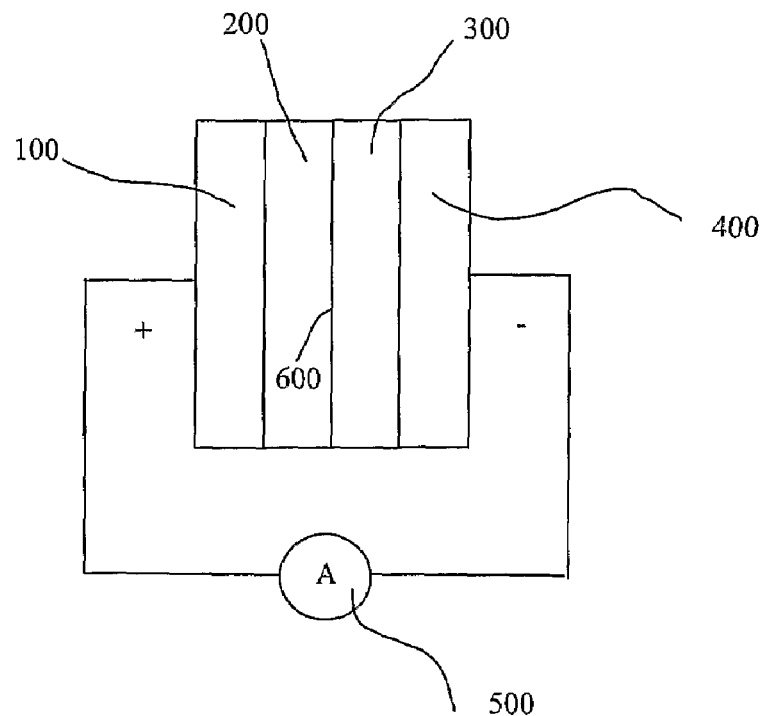
FIG. 11 is a schematic of an organic photovoltaic cell.

In another embodiment, the coronene diimide charge-transport materials are used as electron-transport materials in photovoltaic cells. In an embodiment, a possible geometry for such a device is shown in FIG. 11. In this device, a hole-transport organic semiconductor 200 and an electron-transport organic semiconductor 300 are sandwiched between a first electrode 100 and a second electrode 400. When the device is exposed to light, optical absorption in the organic semiconductors 200 and 300 leads to the formation of excited states that diffuse to the heterojunction 600 where they separate into electron-hole pairs. Holes are transported in the semiconductor layer 200 and get collected by the electrode 100. Electrons are transported in the layer 300 are collected by the electrode 400. The transport of the charges created optically leads to a current that can be measured by an ampmeter 500.

The hole-transport semiconductor 200 can be a thin film of a 4,4'-bis(diarylamino)biphenyl (such as TPD), a phthalocyanine, an oligoacene, an oligothiophene or any other organic hole-transport material with high hole-mobility known in the art; the electrode 100 can be indium tin oxide (ITO) or any other conducting oxide known in the art; the electron-transport semiconductor 300 can include one or more of the coronene diimide charge-transport materials described herein; and the second electrode 400 can be a metal including, but not limited to, Ca, Ag, Mg, Al, Au, or mixtures thereof. In some embodiments, an additional layer can be added between 300 and 400 to inhibit the dissociation of excited states (also referred to as excitons) near the electrode 400. This layer may be called an exciton-blocking layer.

Figure 12:
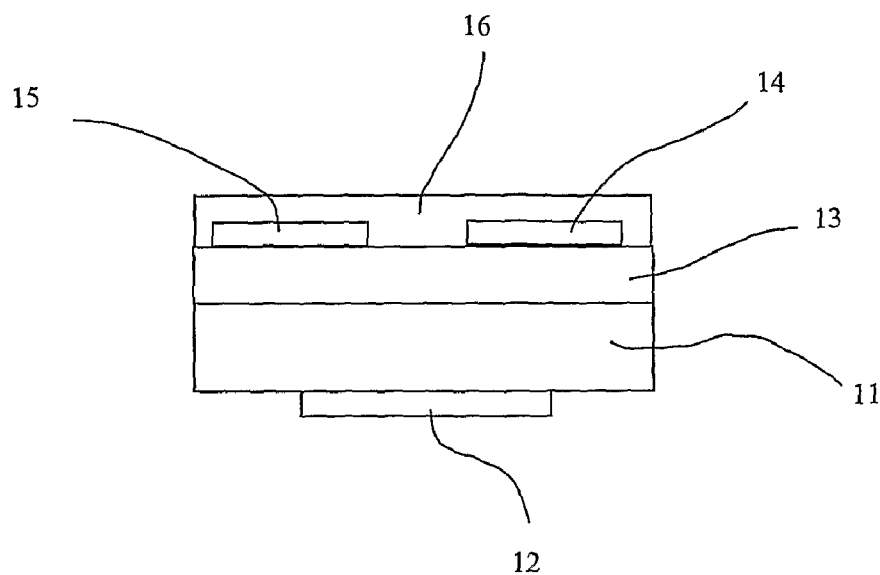
FIG. 12 is a schematic of an organic field-effect transistor with bottom electrodes.
Figure 13:
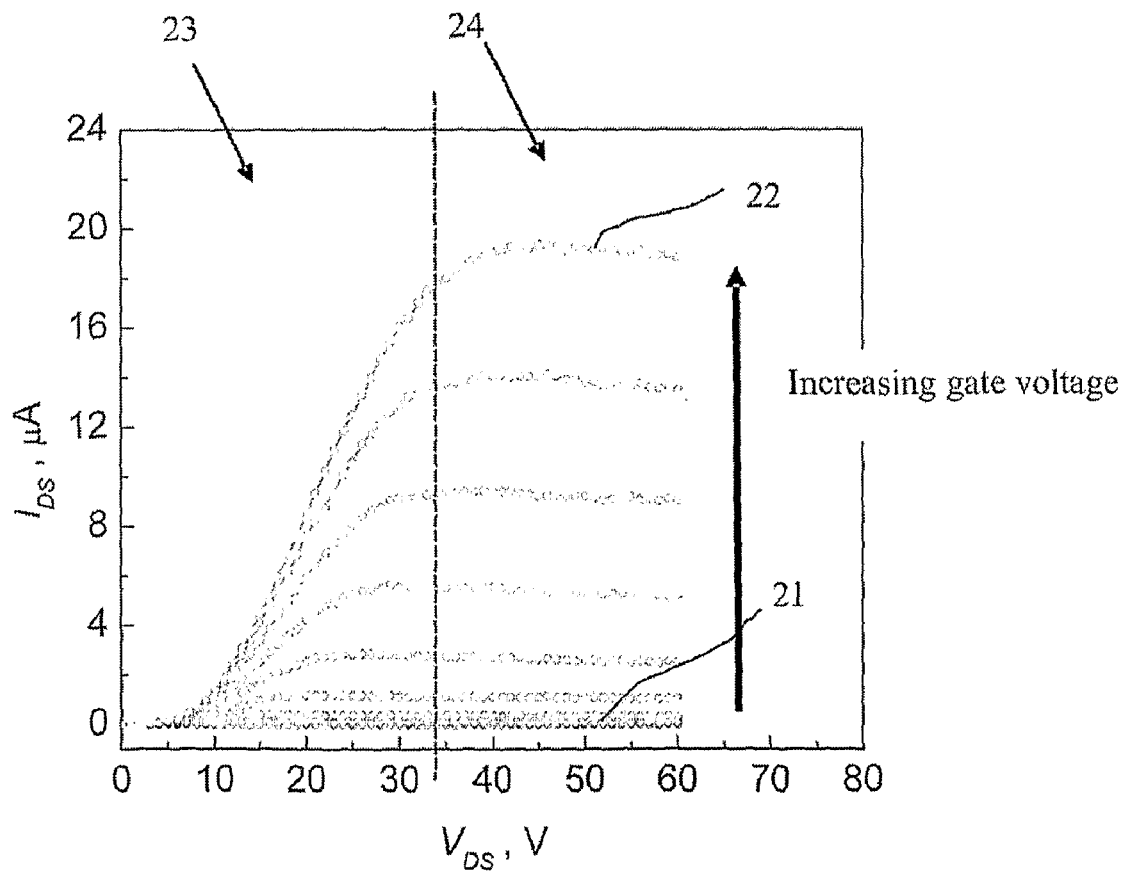
FIG. 13 is a schematic of the electrical output characteristic of an organic field-effect transistor. The curves show the current measured between source and drain electrodes as a function of the voltage between source and drain electrodes.

In another embodiment, the coronene diimide charge-transport materials are used as electron-transport materials in organic field-effect transistors. In an embodiment, a possible structure for such a device is shown in FIG. 12. The organic electron-transport semiconductor 16 is deposited on top of a structure that is comprised of a conductive substrate 11, such as highly doped silicon; an insulator layer 13 such as a thermally-grown silicon oxide layer; a gate electrode 12; a source electrode 15; and a drain electrode 14. A positive voltage applied to the gate electrode 12 changes the density of electrons in the organic semiconductor 16 and influences the current/voltage characteristics measured between the source electrode 15 and the drain electrode 14. The typical electrical output characteristic of a field-effect transistor is shown in FIG. 13. When a low voltage is applied between the source electrode 15 and the drain electrode 14 a small current is measured, as shown by curve 21. In contrast, when a larger gate voltage is applied between the source electrode 15 and the drain electrode 14, a large current is measured, as shown by curve 22. For a given gate voltage, the electrical characteristics 21 and 22 have a linear regime 23 and a saturation regime 24. These electrical characteristics are similar to those measured for MOSFET transistors fabricated from inorganic semiconductors including silicon and germanium.

At low drain voltage where the response is linear (as shown by region 23 in FIG. 13), the current-voltage response is given by:

$$I_D = \frac{WC_{ox}\mu}{L}\left(V_G - V_T - \frac{V_D}{2}\right)V_D \qquad (1)$$

Where W is the channel width, L the distance between source and drain electrodes (channel length), $C_{ox}$ is the capacitance per unit area of the insulator, $V_T$ is the threshold voltage, and μ is the "effective" field-effect mobility, which can be calculated in this regime from the transconductance defined by:

$$g_m = \frac{\partial I_D}{\partial V_G}\bigg|_{V_D=const.} = \frac{WC_{ox}}{L}\mu V_D \qquad (2)$$

For large drain voltages (as shown by region 24 in FIG. 13), the saturated drain current $I_{Dsat}$ is given by the so-called "square-law":

$$I_{Dsat} = \frac{WC_{ox}\mu}{2L}(V_G - V_T)^2 \qquad (3)$$

In this regime, mobility can be extracted from the slope of the plot of the square root of the drain current versus gate voltage. Such a curve is called a transfer curve.

Figure 14:
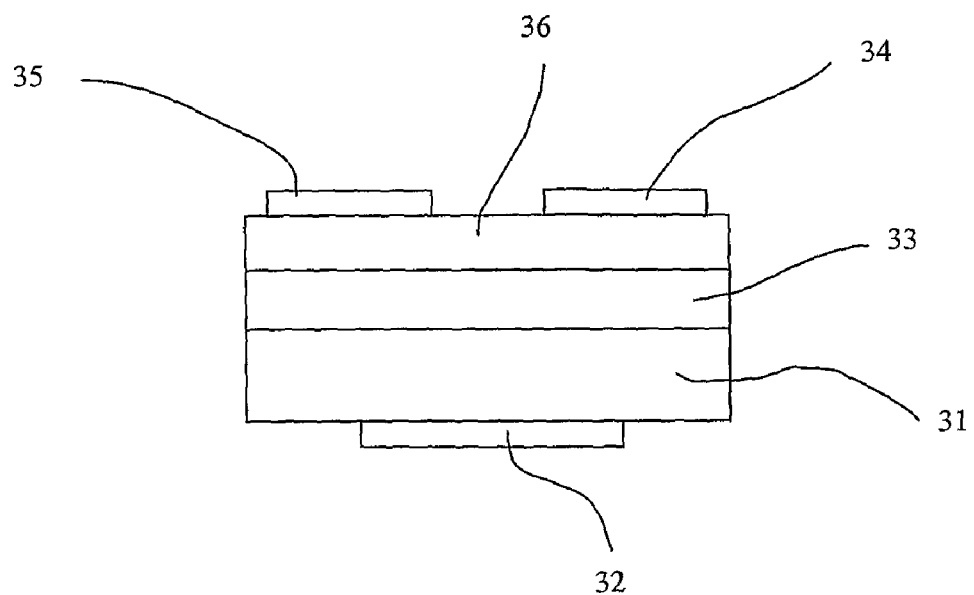
FIG. 14 is a schematic of an organic field-effect transistor with top electrodes.

Another geometry for an organic field-effect transistor is shown in FIG. 14. The organic electron-transport semiconductor 36 is deposited on top of a structure that includes a conductive substrate 31, such as highly doped silicon; an insulator layer 33, such as a thermally grown silicon oxide layer; and a gate electrode 32. In this geometry, source electrode 35 and a drain electrode 34 are deposited on top of the semiconductor layer 36.

Figure 15A:
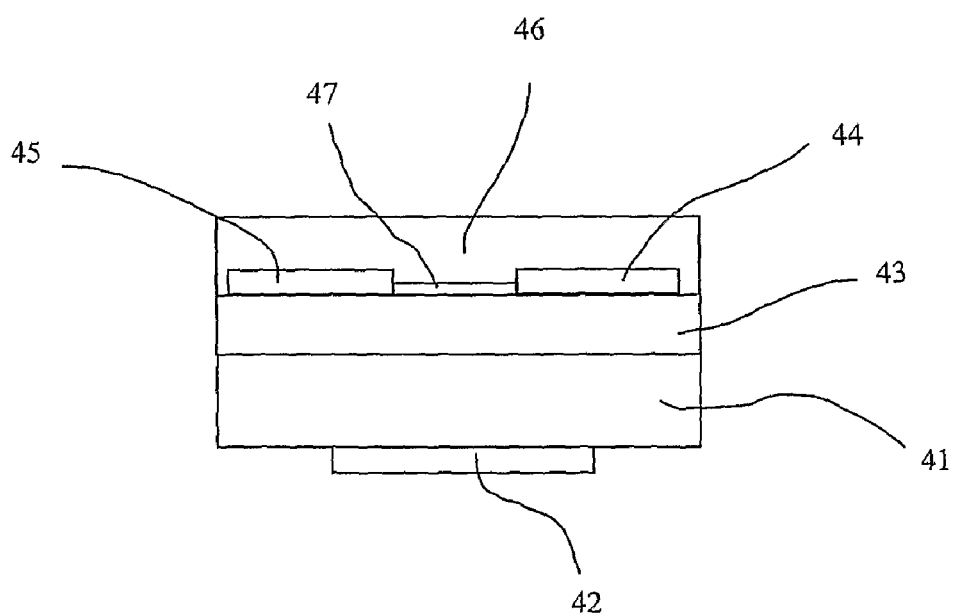
FIG. 15A is a schematic of an organic field-effect transistor with a surface modifier and bottom electrodes.
Figure 15B:
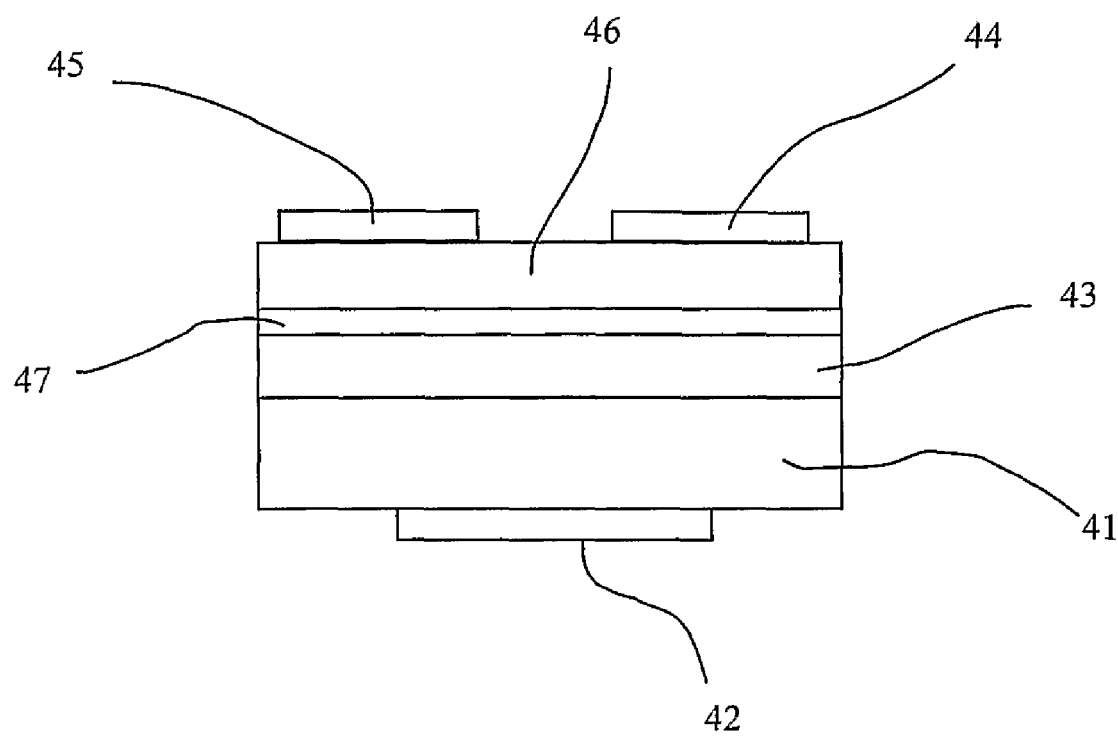
FIG. 15B is a schematic of an organic field-effect transistor with a surface modifier and top electrodes.

Another geometry for an organic field-effect transistor is shown in FIGS. 15A and 15B. In this geometry, an additional layer is introduced between the gate insulator 43 and the organic semiconductor 46. This layer modifies the properties of the surface of the gate insulator and improves its compatibility with the organic semiconductors. The surface modifier 47 can be a self-assembled monolayer leading to a thin layer. It can be deposited on top of the gate insulator 43 after the deposition of the source and drain electrodes, 45 and 44, respectively, and before the deposition of the organic semiconductor 46, as shown in FIG. 15A. Alternatively, layer 47 can be deposited on top of the gate insulator 43 before deposition of the organic semiconductor 46, as shown in FIG. 15B.

Example 3

Mobility Measurements

To illustrate the charge-transport properties of the materials described in the present disclosure charge transport measurements have been carried out in several illustrative embodiments of such materials using the steady-state space-charge limited current (SCLC) method.

Steady-state SCLC measurements are well known in the art and have been previously applied to the characterization of charge mobility in a variety of organic materials, ranging from amorphous materials, including conjugated polymers such as poly(p-phenylene vinylene) (PPV), amorphous glasses of small molecules, films of the soluble fullerene PCBM, and organic single crystals.

Figure 16:
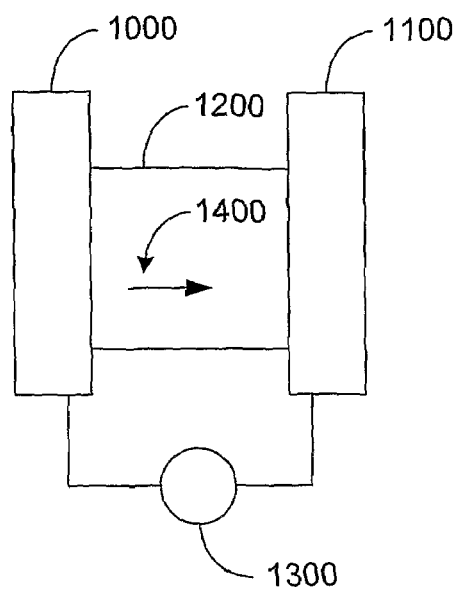
FIG. 16 illustrates the geometry used in the SCLC measurements.

In this example, a film 1200 of thickness L of the material under study is sandwiched between two conducting electrodes 1000 and 1100 as shown in FIG. 16. A source-measure unit 1300, such as a Keithley 2400 source meter, is connected to the electrodes 1000 and 1100. The source-measure unit records current-voltage characteristics of sample 1200. Electrodes 1000 and 1100 are made from metals such as, but not limited to, Ag, Al, or Au with different work functions. Electrodes 1000 and 1100 can also be made from transparent conducting oxides such as, but not limited to, indium tin oxide (ITO). Other TCOs can be used. The two electrodes 1000 and 1100 can be made from the same metal or from dissimilar metals. For instance, electrode 1000 can be made from Ag coated on a glass substrate and electrode 1100 can be made from ITO. The metals that make the electrodes are chosen such that the work function of a least one metal matches the energy of the frontier orbitals of the material 1200 under study. For electron transport one tries to match the work function of the metal to the LUMO level of the material. For hole transport matching is done with the HOMO level. Prior to applying a voltage, the sample is heated above the clearing point of the liquid crystalline material under study. The clearing point of a liquid crystal is defined as the temperature of the phase transition between the mesoscopic phase and the isotropic phase. After this initial heating, the sample is cooled down to room temperature slowly. Then, a voltage is applied with the source-measure unit 1300, and charges are injected into the material 1200. A current represented in FIG. 16 by arrow 1400, is flowing and measured by the source-measure unit 1300. Data from the source-unit 1300 can be collected by a computer (not shown in FIG. 16).

Figure 17:
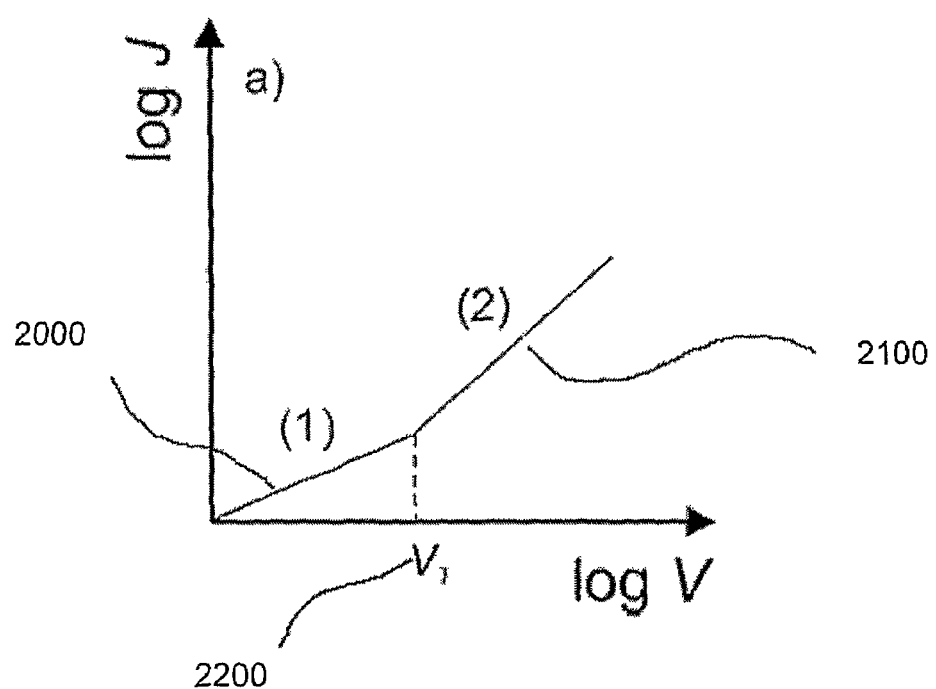
FIG. 17 illustrates the typical shape of the current voltage characteristic measured in SCLC experiments.

Studies of carrier injection from a metal into materials such as those described herein have shown that strong deviations from ohmic conduction can be observed when the metal electrode facilitates the direct injection of excess charge into solids that have a relatively low volume density of free charges. Under such conditions, the charge density and the electric field produced at steady-state in the solid placed between two electrodes are both nonuniform. The current density and the electric field in this case can be evaluated self-consistently by solving Poisson's equation. Deviations from the linear ohmic relationship between the current density and applied voltage are referred to as space-charge limited current (SCLC) effects. In the simplest case, when traps in the solid are ignored and the contact between the metal and the insulator is considered ohmic, the current voltage characteristic is given by the Mott-Gurney expression:

$$J = \frac{9}{8}\varepsilon\varepsilon_0 \mu \frac{V^2}{L^3} \qquad (4)$$

where V is the applied voltage, L is the distance between electrodes, $\mu$ is the carrier mobility, $\varepsilon$ is the dielectric constant of the solid, and $\varepsilon_0$ is the permittivity of free space. The contact is said to be ohmic when it provides an infinite reservoir of carriers ready to be injected into the solid. Note that Eq. (4) is the solid-state analog of Child's law for SCLC in a vacuum diode and results in a quadratic dependence of the current density as a function of voltage. Under these approximations, the typical current-voltage characteristic for a trap-free insulator is first comprised of an ohmic region at low voltage that is given by:

$$J = n_{fb}e\mu\frac{V}{L} \qquad (5)$$

where e is the elementary charge and $n_{fb}$ is the volume density of free carriers in the bulk of the solid. As shown in FIG. 17, this linear region 2000 is followed by a SCLC region 2100 in which the current density is quadratic in voltage and follows Eq. (4). The threshold voltage 2200, $V_T$, at which the power dependence of the current on voltage changes from linear to quadratic is given by:

$$V_T = \frac{8}{9}en_{fb}\frac{L^2}{\varepsilon\varepsilon_0} \qquad (6)$$

This expression is found by equating the expression of the current given by Ohm's law ($J \propto P$) and the Mott-Gurney expression ($J \propto V^2$). Note that the threshold voltage is independent of the carrier mobility but depends on $n_{fb}$ and the sample geometry.

If shallow traps are present and/or the contact deviates from being perfectly ohmic, the magnitude of the current in the SCLC regime will be reduced but the quadratic dependence of the current on voltage can be preserved. In these conditions, the SCLC current is given by:

$$J = \frac{9}{8}\varepsilon\varepsilon_0 \mu \frac{V^2}{L^3}\theta \qquad (7)$$

With $\theta<1$. In this case, the effective mobility value that is extracted from the measurement is $\mu_{eff}=\theta\mu$ and is lower than the intrinsic bulk mobility. Hence, mobility measurements performed in experimental conditions where injection is limited and/or when shallow traps are present provide underestimates of the mobility.

If deep traps localized in the forbidden gap strongly affect the transport of carriers, the shape of the current-voltage characteristic can significantly deviate from a linear and quadratic region and exhibit an additional steep current rise that is often referred to as trap-filled limit (TFL) region.

In the derivation of Eqs. (4) and (7), the mobility is assumed to be independent of the field. Transport in numerous organic materials is known to be field dependent with a general functional dependence on electric field of the form:

$$\mu=\mu_0\exp(\gamma\sqrt{E}) \qquad (8)$$

where $\mu_0$ is the zero-field mobility (units of cm$^2$/Vs) and $\gamma$ is an electric-field coefficient in units of (cm/Vs).$^{1/2}$ In this case, the derivation of the current-voltage equation is more complex. Fortunately, it has similarities with the theory of space-charge limited currents controlled by shallow traps whose effective depth is reduced by the electric field, an effect referred to as the Frenkel effect. In this theory, the following expression of the space-charge limited current voltage characteristic can be derived:

$$J = \frac{9}{8}\varepsilon\varepsilon_0\mu_0\exp\left(0.891\gamma\sqrt{\frac{V}{L}}\right)\frac{V^2}{L^3}\theta \qquad (9)$$

For typical values of electric-field coefficients $\gamma$ established by experiments in many organic materials ($10^{-2}$-$10^{-4}$ (cm/Vs)$^{1/2}$), the current-voltage characteristic in the space-charge limited regime is nearly quadratic with exponents slightly larger than 2. In that nearly quadratic regime, a best fit to the data using Eq. (9) provides numerical values for $\theta\mu_0$ and $\gamma$. With these parameters, the effective mobility is calculated using Eq. (5) multiplied by the factor $\theta$. Here again, if the contact is not perfectly ohmic and/or if traps are present, the effective mobility that is derived from this analysis is $\mu_{eff}=\theta\mu$ and is an underestimation of the bulk mobility that would exist under trap-free conditions. Likewise, improvements of the ohmicity of the contact will result in the extraction of larger effective mobility values.

Figure 18:
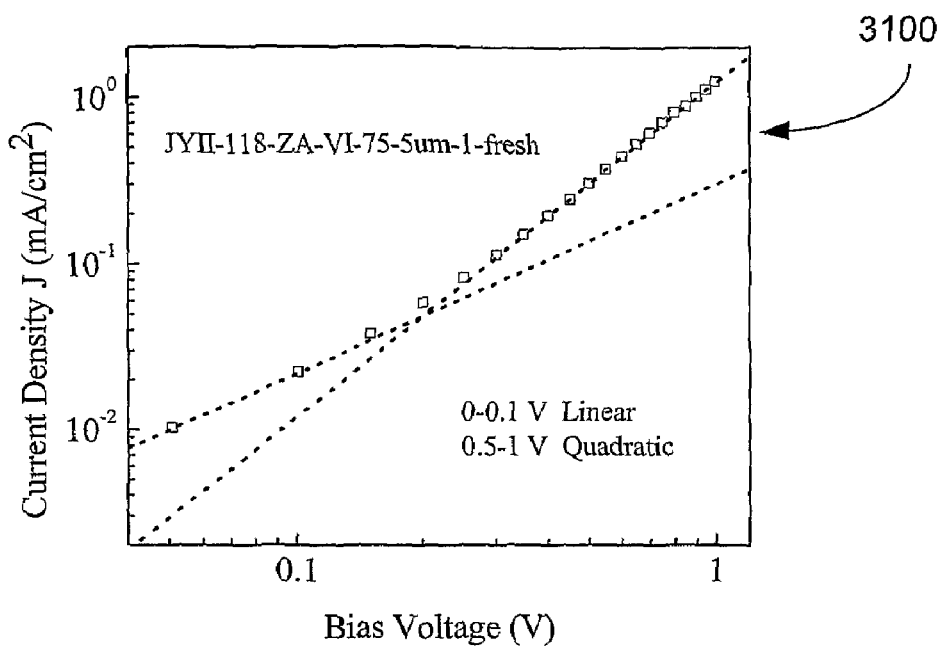
FIG. 18 illustrates the J-V curves of ZA-VI-75 in a 5-µm thick film between ITO electrodes.

In a first embodiment, charge mobility is measured in a 5-μm thick film of compound ZA-VI-75 sandwiched between two ITO electrodes. The current voltage (J-V) characteristic in a logarithmic plot is shown in FIG. 18. The plot exhibits the linear and nearly quadratic behavior of 3100. From the quadratic region, which corresponds the SCLC region, a effective mobility $\mu_{eff}$ of 0.6 cm$^2$/Vs at an electric field of 2.3×10$^3$ V/cm can be calculated.

Figure 19:
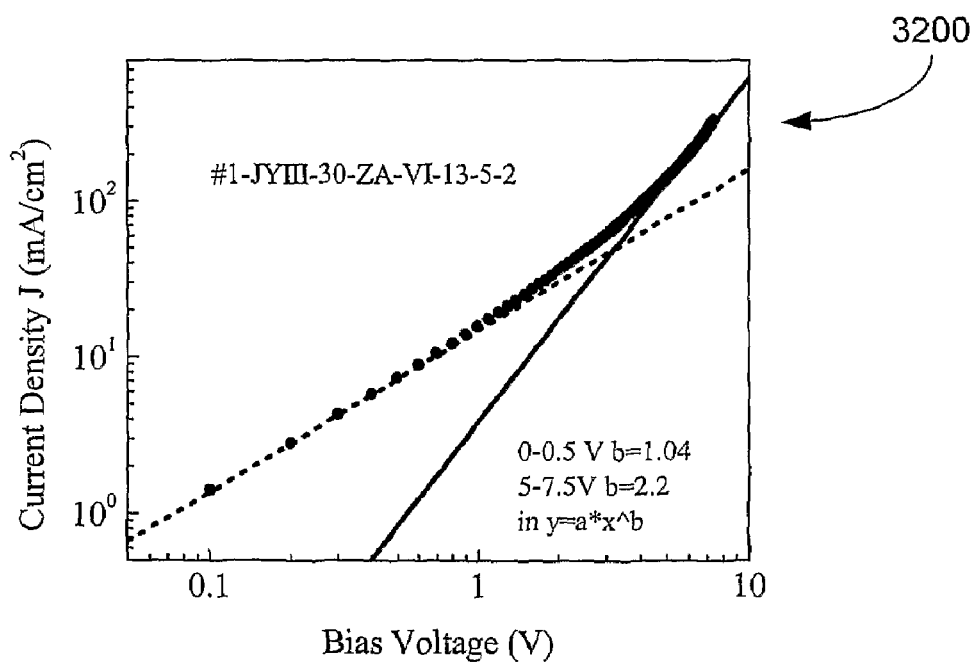
FIG. 19 illustrates the J-V curves of ZA-VI-13 in a 5-µm thick film between ITO electrodes.
Figure 20A:
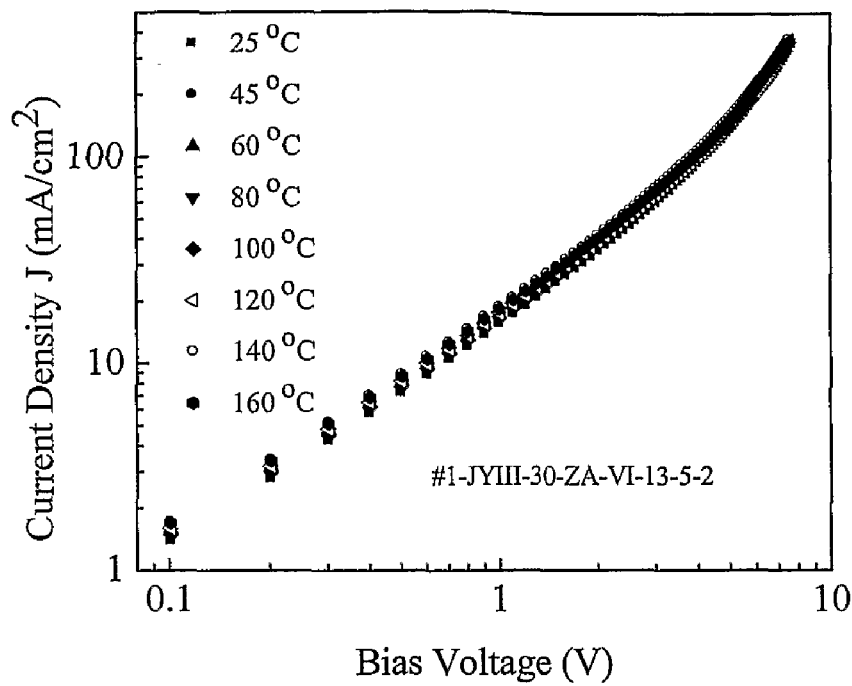
FIGS. 20A and 20B illustrate the temperature dependence of the J-V curves (FIG. 20A) and the calculated mobility of ZA-VI-13 (FIG. 20B).
Figure 20B:
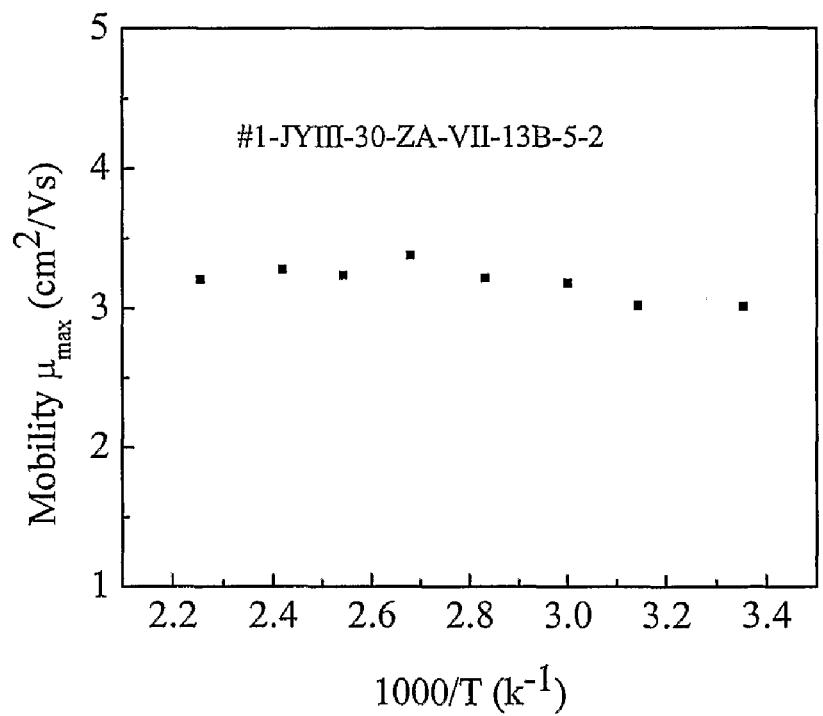

In a second embodiment, charge mobility is measured in a 5-μm thick film of compound ZA-VI-13 sandwiched between two ITO electrodes. The current voltage (J-V) characteristic in a logarithmic plot is shown in FIG. 19. The plot exhibits the linear and nearly quadratic behavior of 3200. From the quadratic region, which corresponds the SCLC region, a effective mobility $\mu_{eff}$ of 3.0 cm$^2$/Vs at an electric field of 1.5×10$^4$V/cm can be calculated. FIGS. 20A and 20B show the results of SCLC measurements as a function of temperature. As shown in FIG. 20A, all curves exhibit the SCLC region at high voltage. Analysis of these currents in the SCLC region using the procedure described above, leads to effective charge mobility values that are nearly independent of temperature as shown in FIG. 20B over a range of temperature from 25° C. to 160° C. This behavior is in contrast with many other organic and inorganic semiconductors in which the mobility is temperature dependent. This result exemplifies that the materials of the present disclosure can perform better in optoelectronic devices than other known semiconductors because their charge mobility is nearly insensitive to temperature over a broad range of temperatures. This property is important to develop devices that have a performance that is constant over a broad temperature range.

Figure 21A:
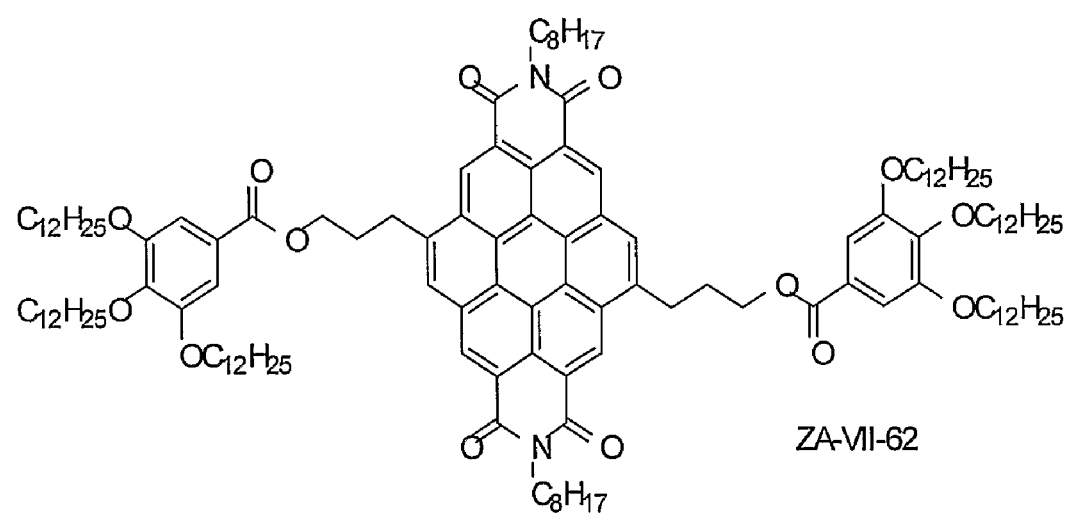
FIGS. 21A and 21B illustrate the chemical structure (FIG. 21A) and the optical textures (FIG. 21B) under cross polarizer at room temperature of ZA-VII-62.
Figure 21B:
Figure 22:
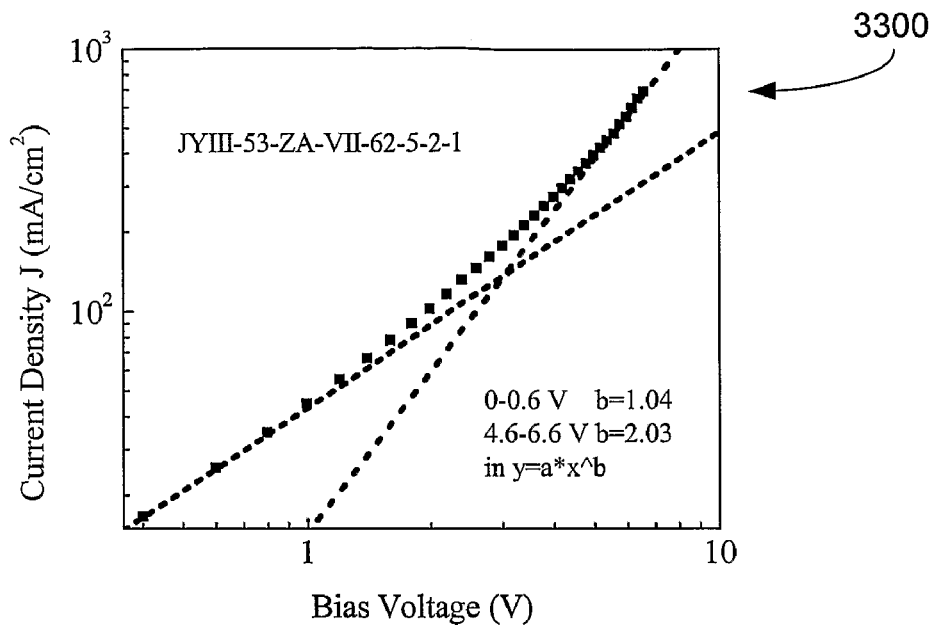
FIG. 22 illustrates the J-V curves of ZA-VII-62 in a 5-µm thick film between ITO and silver electrodes. ITO is used as the anode and Ag is used as the cathode.
Figure 23:
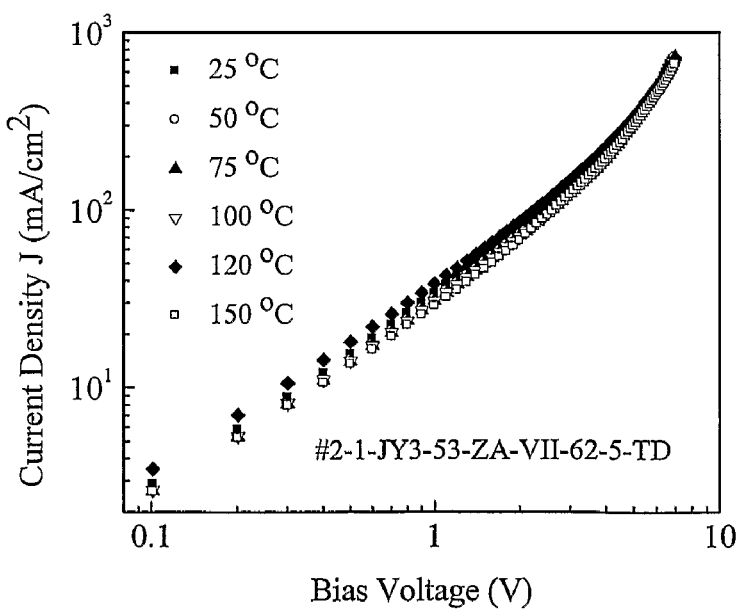
FIG. 23 illustrates the temperature dependence of the J-V curves of ZA-VII-62.

In a third embodiment, charge mobility is measured in a 5-μm thick film of compound ZA-VII-62 sandwiched between an ITO electrode and a silver electrode. The structure of compound ZA-VII-62 is shown in FIG. 21A, together with the photograph of a thin film measured by polarized microscopy (FIG. 21B). The texture seen in FIG. 21B is indicative of the formation of a mesophase. The current voltage (J-V) characteristic in a logarithmic plot is shown in FIG. 22 when ITO is used as the anode (positive voltage) and Ag is used as the cathode (negative voltage). The plot exhibits the linear and nearly quadratic behavior 3300. From the quadratic region, which corresponds the SCLC region, a effective mobility $\mu_{eff}$ of 4.7 cm$^2$/Vs at an electric field of 1.3×10$^4$V/cm can be calculated. When the device is operated in reverse bias, ITO being the cathode and silver being the anode, an effective mobility of only 2.3 cm$^2$/Vs is measured. This lower effective mobility can be assigned to the lower work function of silver compared to ITO. When silver is used as the cathode, injection of electrons from the electrode into the LUMO level of compound ZA-VII-62 is more favorable than when the cathode is ITO. These results are consistent with the assumption that the major carriers than contribute to the current are electrons. FIG. 23 shows J-V curves measured by SCLC is ZA-VII-62 as a function of temperature. As observed with compound ZA-VI-13 in FIG. 20B, the mobility in ZA-VII-62 is independent of temperature.

Figure 24A:
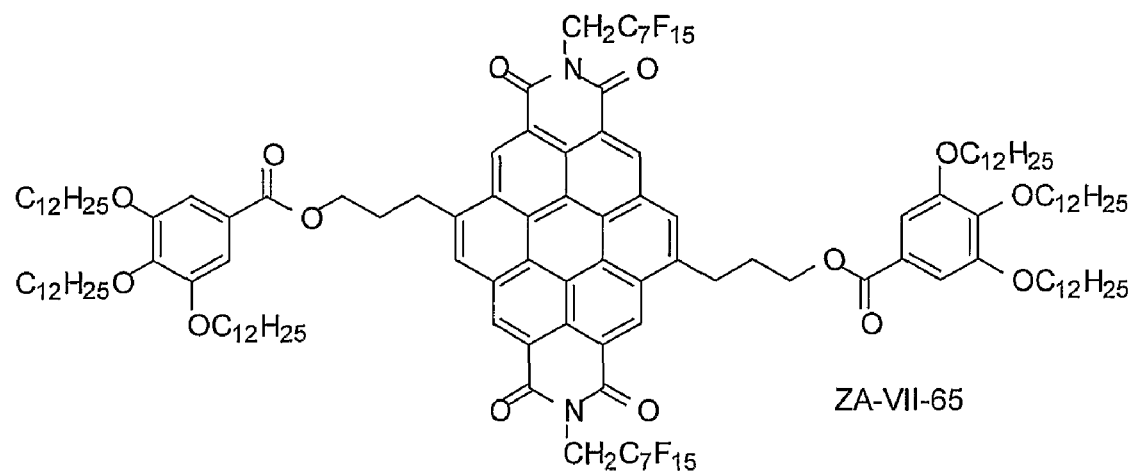
FIGS. 24A and 24B illustrate the chemical structure (FIG. 24A) and the optical textures (FIG. 24B) under cross polarizer at room temperature of ZA-VII-65.
Figure 24B:
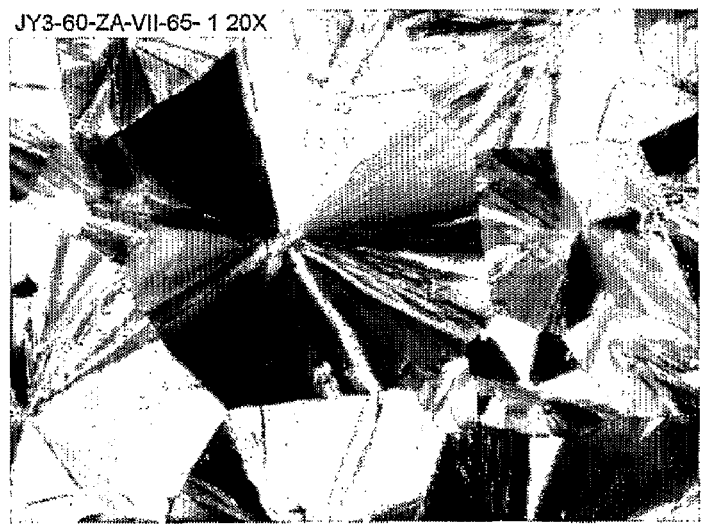
Figure 25:
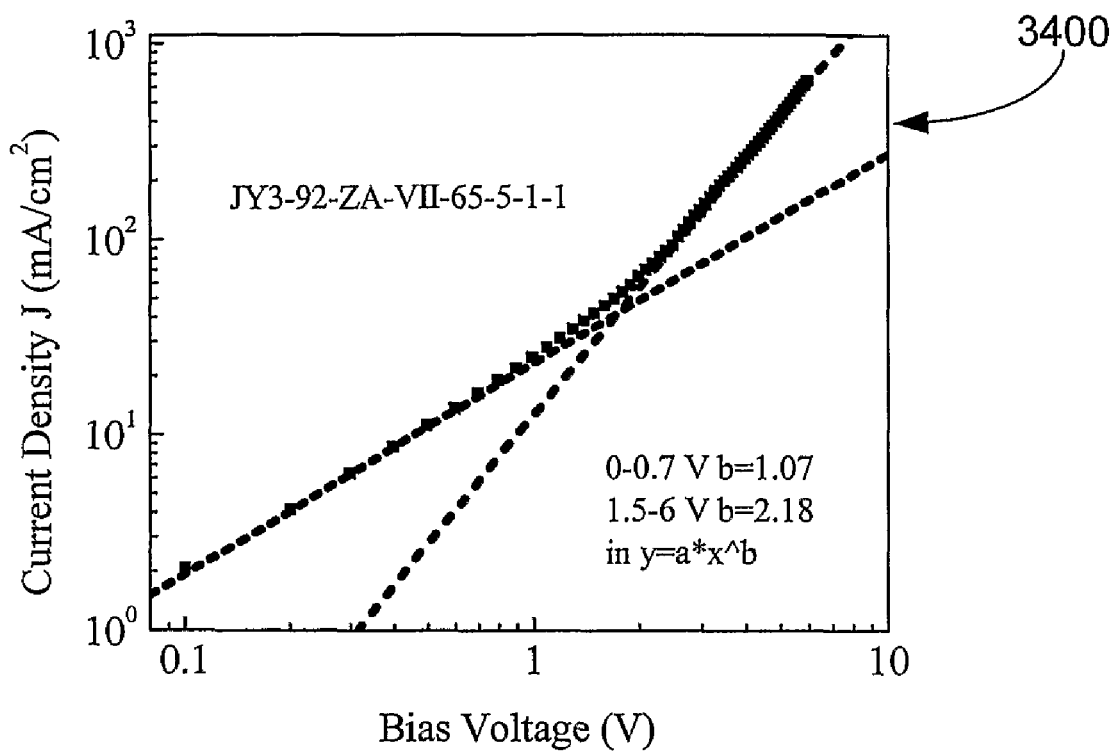
FIG. 25 illustrates the J-V curves of ZA-VII-65 in a 5-µm thick film between ITO and silver electrodes. ITO is used as the anode and Ag is used as the cathode.

In a fourth embodiment, charge mobility is measured in a 5-μm thick film of compound ZA-VII-65 sandwiched between an ITO electrode and a silver electrode. The structure of compound ZA-VII-65 is shown in FIG. 24A, together with the photograph of a thin film measured by polarized microscopy (FIG. 24B). The texture seen in FIG. 24B is indicative of the formation of a mesophase. The current voltage (J-V) characteristic in a logarithmic plot is shown in FIG. 25 when ITO is used as the anode (positive voltage) and Ag is used as the cathode (negative voltage). The plot exhibits the linear and nearly quadratic behavior of 3400. From the quadratic region, which corresponds the SCLC region, a effective mobility $\mu_{eff}$ of 6.7 cm$^2$/Vs at an electric field of 1.2×10$^4$ V/cm can be calculated.

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure and protected by the following claims.

Therefore the following is claimed:

1. A charge-transport material, comprising:

a coronene diimide charge-transport material monomer having a structure of Formula 1:

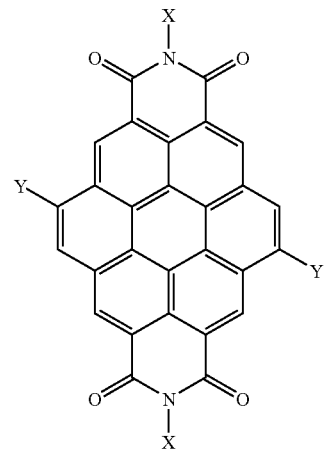

Formula 1 wherein Y in each instance is an acceptor; and wherein X in each instance can be independently selected from the following: a polymerizable group; 3,4,5-trialkoxyphenyl; 3,4,5-trialkylphenyl; 3,4,5-tri-perfluorinated-alkylphenyl; 3,4,5-tri-perfluorinated-alkoxyphenyl; 3,4,5-tri-oligomeric-ether-substituted phenyl; 3,4,5-trialkoxybenzyl; 3,4,5-trialkylbenzyl; 3,4,5-triperfluorinated-alkyl benzyl; 3,4,5-tri-perfluorinated-alkoxy benzyl; 3,4,5-tri-oligomeric-ether-substituted benzyl; 3,4-dialkoxyphenyl, 3,4-dialkylphenyl; 3,4-di-perfluorinated-alkylphenyl; 3,4-di-perfluorinated-alkoxyphenyl; 3,4-di-oligomeric-ether-substituted phenyl; 3,4-dialkoxybenzyl; 3,4-dialkylbenzyl; 3,4-di-perfluorinated-alkylbenzyl; 3,4-di-perfluorinated-alkoxybenzyl; 3,4-di-oligomeric-ether-substituted benzyl; 3,5-dialkoxyphenyl; 3,5-dialkylphenyl; 3,5-di-perfluorinated-alkyl phenyl; 3,5-di-perfluorinated-alkoxy phenyl; 3,5-di-oligomeric-ether-substituted phenyl; 3,5-dialkoxybenzyl; 3,5-dialkylbenzyl; 3,5-di-perfluorinated-alkyl benzyl; 3,5-di-oligomeric-ether-substituted benzyl;

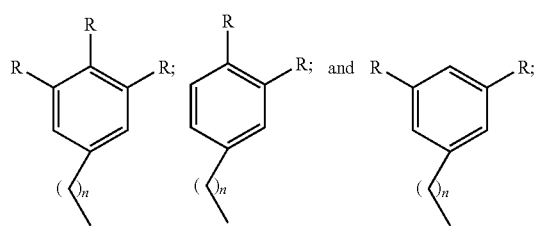
wherein R in each instance can be independently selected from the following: a polymerizable group, an alkyl, an alkoxy, a perfluorinated alkyl, a perfluorinated alkoxy, an oligomeric-ether, wherein R denotes dendritic units, and wherein the subscript n is a number from 0 to 20;
wherein each acceptor is selected from one or more of the following:
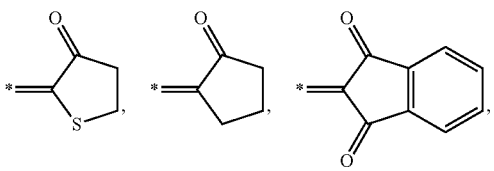
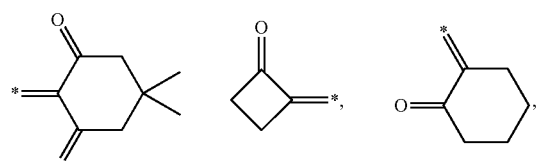
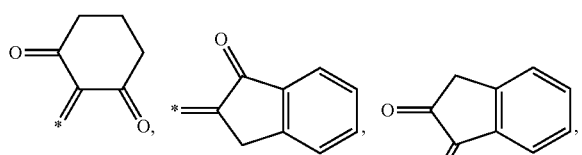
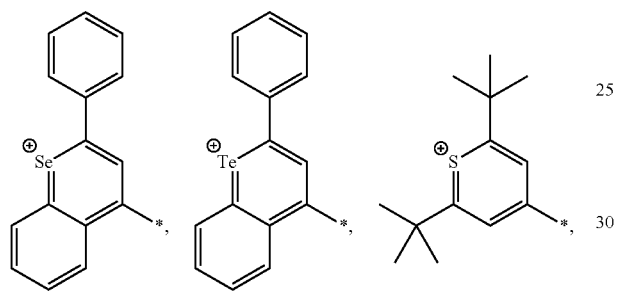
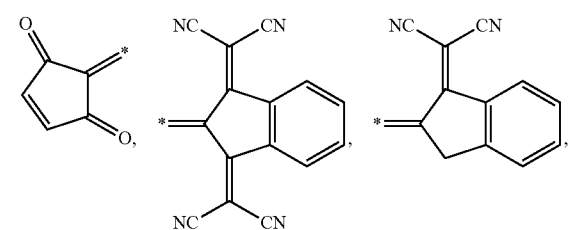
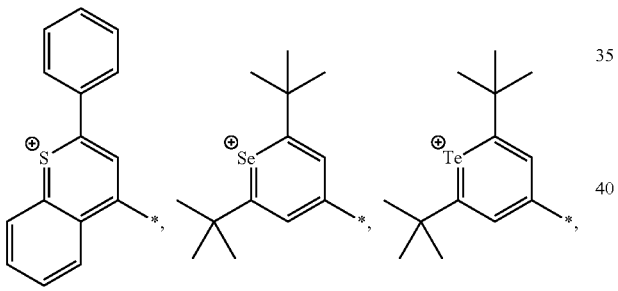
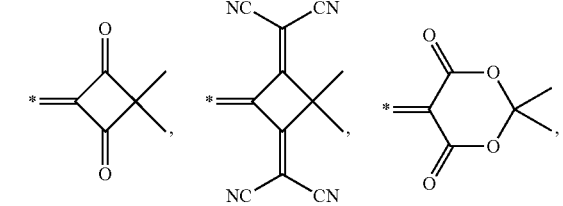
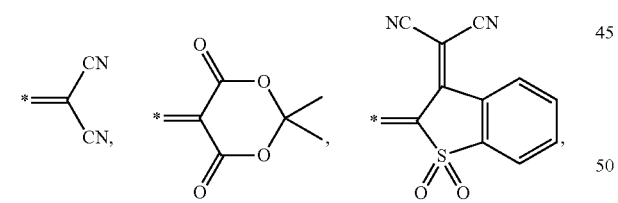
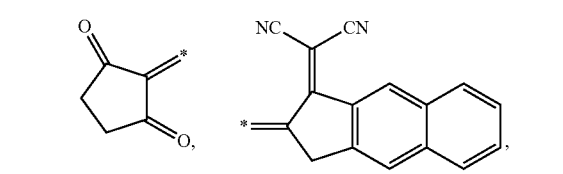
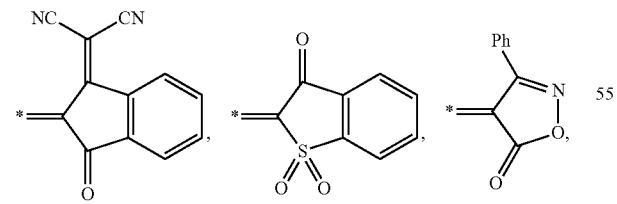
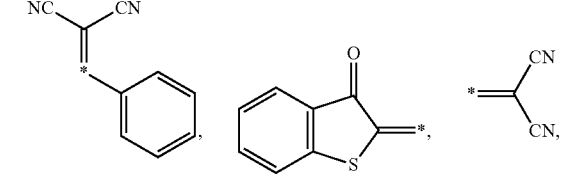
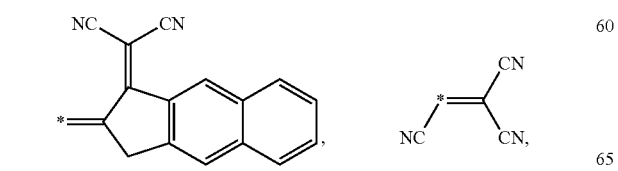
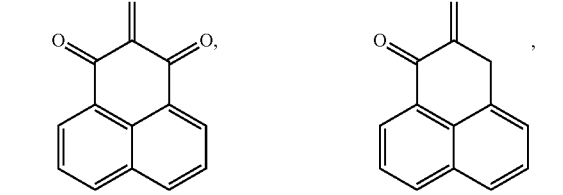

-continued

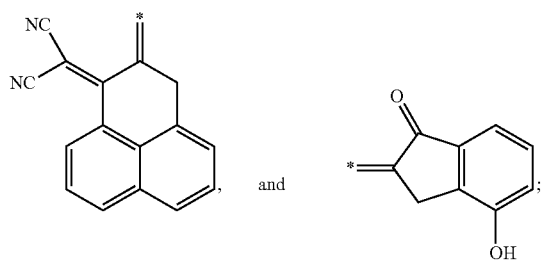
and wherein the polymerizable group is selected from: vinyl; allyl; 4-styryl; acroyl; epoxide; oxetane; cyclic-carbonate; methacroyl; acrylonitrile; isocyanate; isothiocyanate; epoxides; strained ring olefins; $(-CH_2)_n SiCl_3$; $(-CH_2)_n Si(OCH_2CH_3)_3$; $(-CH_2)_n Si(OCH_3)_3$, wherein $n$ is an integer number from 0 to 25; and compounds having the following structures:

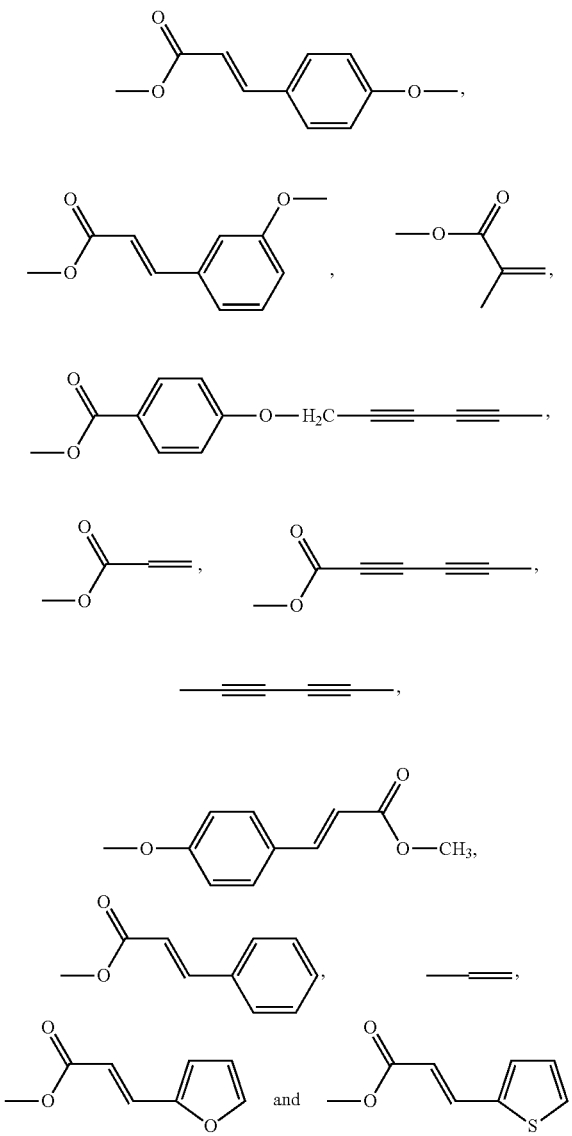

2. A charge-transport material, comprising:

a coronene diimide charge-transport material monomer having a structure of Formula 1:

Formula 1

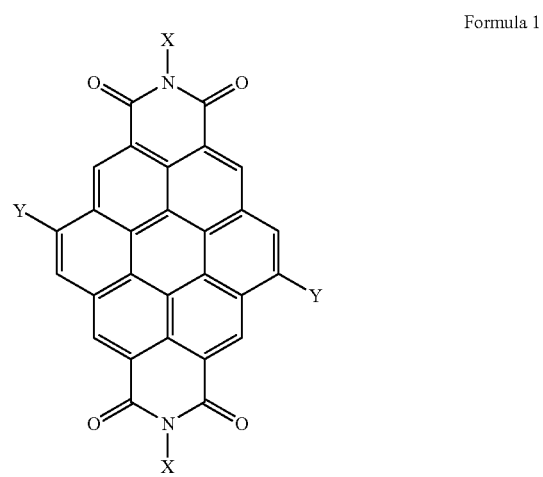

wherein Y in each instance can be independently selected from the following: —C≡C aryl ; —(C≡C)-$_2$aryl; —(C≡C)-$_3$aryl; —HC=CH-aryl; —(HC=CH)$_2$-aryl; and —(HC=CH)$_3$-aryl, and wherein the charge-transport material absorbs near-infrared energy from about 700 to 1500 nm;

wherein X in each instance can be independently selected from the following: a polymerizable group; hydrogen; halogens; $C_1$-$C_{18}$-alkyl; aryloxy, arylthio, heteroaryloxy and heteroarylthio;

wherein X and Y each independently can be independently substituted by one of the following: $C_1$-$C_{10}$-alkyl, $C_1$-$C_6$-alkoxy, cyano, and carboxyl; and wherein the polymerizable group is selected from: vinyl; allyl; 4-styryl; acroyl; epoxide; oxetane; cyclic-carbonate; methacroyl; acrylonitrile; isocyanate; isothiocyanate; epoxides; strained ring olefins; $(-CH_2)_n SiCl_3$; $(-CH_2)_n Si(OCH_2CH_3)_3$; $(-CH_2)_n Si(OCH_3)_3$, wherein $n$ is an integer number from 0 to 25; and compounds haying the following structures:

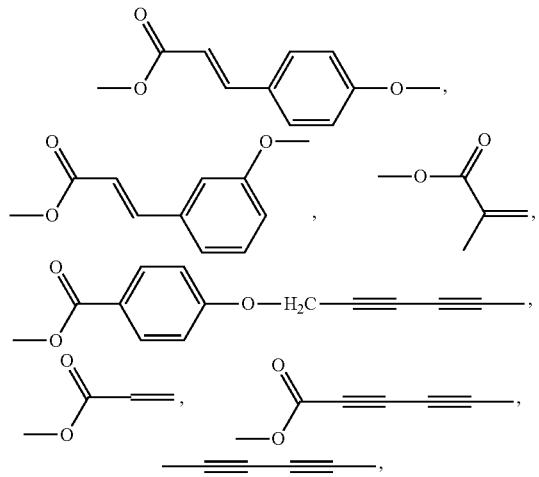

-continued

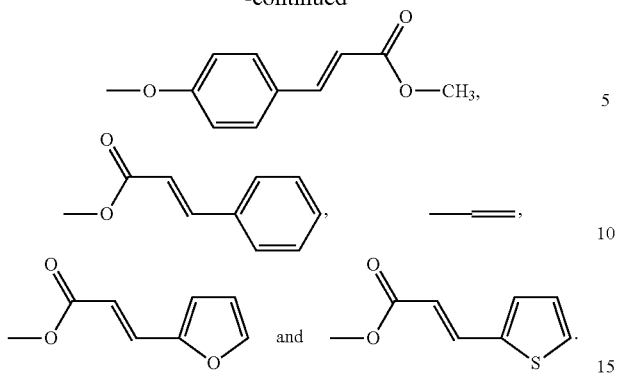

3. A charge-transport material, comprising:
a coronene diimide charge-transport material monomer having a structure of Formula 1:

Formula 1

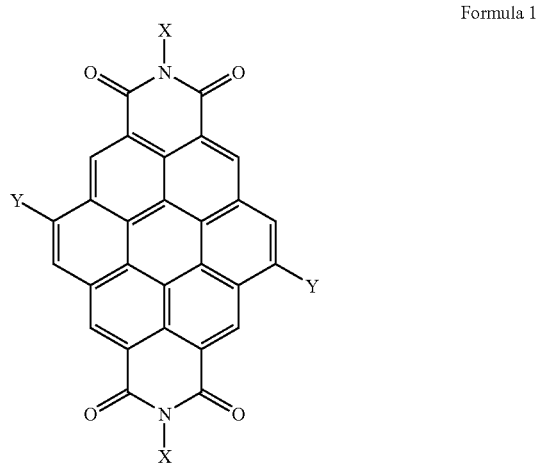

wherein Y in each instance can be independently selected from the following: —C≡C aryl; —(C≡C)-$_2$aryl, (C≡C)-$_3$aryl: —HC═CH-aryl; —(HC═CH)$_2$-aryl; and —(HC═CH)$_3$-aryl, and wherein the charge-transport material absorbs near-infrared energy from about 700 to 1500 nm;
wherein X in each instance can be independently selected from the following: a polymerizable group; methyl, ethyl, propyl, isopropyl, butyl, isobutyl, sec-butyl, tert-butyl, pentyl, isopentyl, neopentyl, tert-pentyl, hexyl, 2-methylpentyl, heptyl, 1-ethylpentyl, octyl, 2-ethylhexyl, isooctyl, nonyl, isononyl, decyl, isodecyl, undecyl, dodecyl, tridecyl, isotridecyl, tetradecyl, pentadecyl, hexadecyl, heptadecyl, octadecyl, nonadecyl and eicosyl; 2-methoxyethyl, 2-ethoxyethyl, 2-propoxyethyl, 2-isopropoxyethyl, 2-butoxyethyl, 2-methoxypropyl, 3-methoxypropyl, 2-ethoxypropyl, 3-ethoxypropyl, 2-propoxypropyl, 3-propoxypropyl, 2-butoxypropyl, 3-butoxypropyl, 2-methoxybutyl, 4-methoxybutyl, 2-ethoxybutyl, 4-ethoxybutyl, 2-propoxybutyl, 4-propoxybutyl, 3,6-dioxaheptyl, 3,6-dioxaoctyl, 4,8-dioxanonyl, 3,7-dioxaoctyl, 3,7-dioxanonyl, 4,7-dioxaoctyl, 4,7-dioxanonyl, 2- and 4-butoxybutyl, 4,8-dioxadecyl, 3,6,9-trioxadecyl, 3,6,9-trioxaundecyl, 3,6,9-trioxadodecyl, 3,6,9,12-tetraoxamidecyl and 3,6,9,12-tetraoxatetradecyl; 2-methylthioethyl, 2-ethylthioethyl, 2-propylthioethyl, 2-isopropylthioethyl, 2-butylthioethyl, 2-methylthiopropyl, 3-methylthiopropyl, 2-ethylthiopropyl, 3-ethylthiopropyl, 2-propylthiopropyl, 3-propylthiopropyl, 2-butylthiopropyl, 3-butylthiopropyl, 2-methylthiobutyl, 4-methylthiobutyl, 2-butylthiopropyl, 4-ethylthiobutyl, 2-propylthiobutyl, 4-propylthiobutyl, 3,6-dithiaheptyl, 3,6-dithiaoctyl, 4,8-dithianonyl, 3,7-dithiaoctyl, 3,7-dithianonyl, 4,7-dithiaoctyl, 4,7-dithianonyl, 2-butylthiobutyl, 4-butylthiobutyl, 4,8-dithiadecyl, 3,6,9-trithiadecyl, 3,6,9-trithiaundecyl, 3,6,9-trithiadodecyl, 3,6,9,12-tetrathiamidecyl, 3,6,9,12-tetrathiatetradecyl; 2-monomethylaminoethyl, 2-monoethylaminoethyl, 2-dimethylaminoethyl, 2-dimethylaminopropyl, 3-dimethylaminopropyl, 3-monoisopropylaminopropyl, 2-monopropylaminobutyl, 4-monopropylaminobutyl, 2-dimethylaminobutyl, 4-dimethylaminobutyl, 6-methyl-3,6-diazaheptyl, 3,6-dimethyl-3,6-diazaheptyl, 3,6-diazaoctyl, 3,6-dimethyl-3,6-diazaoctyl, 9-methyl-3,6,9-triazadecyl, 3,6,9-trimethyl-3,6,9-triazadecyl, 3,6,9-triazaundecyl, 3,6,9-trimethyl-3,6,9-triazaundecyl, 12-methyl-3,6,9,12-tetraazatridecyl and 3,6,9,12-tetramethyl-3,6,9,12-tetraazatridecyl; propan-2-on-1-yl, butan-3-on-1-yl, butan-3-on-2-yl and 2-ethylpentan-3-on-1-yl; 2-methylsulfonylethyl, 2-ethylsulfonylethyl, 2-propylsulfonylethyl, 2-isopropylsulfonylethyl, 2-butylsulfonylethyl, 2-methylsulfonylpropyl, 3-methylsulfonylpropyl, 2-ethylsulfonylpropyl, 3-ethylsulfonylpropyl, 2-propylsulfonylpropyl, 3-propylsulfonylpropyl, 2-butylsulfonylpropyl, 3-butylsulfonylpropyl, 2-methylsulfonylbutyl, 4-methylsulfonylbutyl, 2-ethylsulfonylbutyl, 4-ethylsulfonylbutyl, 2-propylsulfonylbutyl, 4-propylsulfonylbutyl, and 4-butylsulfonylbutyl; carboxymethyl, 2-carboxyethyl, 3-carboxypropyl, 4-carboxybutyl, 5-carboxypentyl, 6-carboxyhexyl, 8-carboxyoctyl, 10-carboxydecyl, 12-carboxydodecyl and 14-carboxytetradecyl; sulfomethyl, 2-sulfoethyl, 3-sulfopropyl, 4-sulfobutyl, 5-sulfopentyl, 6-sulfohexyl, 8-sulfooctyl, 10-sulfodecyl, 12-sulfododecyl and 14-sulfotetradecyl; 2-hydroxyethyl, 2-hydroxypropyl, 1-hydroxyprop-2-yl, 2-hydroxybutyl, 4-hydroxybutyl, 1-hydroxybut-2-yl and 8-hydroxy-4-oxaoctyl, 2-cyanoethyl, 3-cyanopropyl, 2-methyl-3-ethyl-3-cyanopropyl, 7-cyano-7-ethylheptyl and 4-methyl-7-methyl-7-cyanoheptyl; methoxy, ethoxy, propoxy, isopropoxy, butoxy, isobutoxy, sec-butoxy, tert-butoxy, pentoxy, isopentoxy, neopentoxy, tert-pentoxy and hexoxy; carbamoyl, methylaminocarbonyl, ethylaminocarbonyl, propylaminocarbonyl, butylaminocarbonyl, pentylaminocarbonyl, hexylaminocarbonyl, heptylaminocarbonyl, octylaminocarbonyl, nonylaminocarbonyl, decylaminocarbonyl and phenylaminocarbonyl; formylamino, acetylamino, propionylamino and benzoylamino; chlorine, bromine and iodine; phenylazo, 2-naphthylazo, 2-pyridylazo and 2-pyrimidylazo; cyclopentyl, cyclohexyl, cycloheptyl, cyclooctyl, 2-dioxanyl, 4-morpholinyl, 2-tetrahydrofuryl, 3-tetrahydrofuryl, 1-pyrrolidinyl, 2-pyrrolidinyl, 3-pyrrolidinyl and 1-piperidyl, 2-piperidyl, 3-piperidyl, and 4-piperidyl; phenyl, 2-naphthyl, 2-pyrryl, and 3-pyrryl, 2-pyridyl, 3-pyridyl, 4-pyridyl, 2-pyrimidyl, 4-pyrimidyl, 5-pyrimidyl, 3-pyrazolyl, 4-pyrazolyl, 5-pyrazolyl, 2-imidazolyl, 4-imidazolyl, 5-imidazolyl, 2-thiazolyl, 4-thiazolyl, 5-thiazolyl, 3-(1,2,4-triazyl), 2-(1,3,5-triazyl), 6-quinaldyl, 3-quinolinyl, 5-quinolinyl, 6-quinolinyl, 8-quinolinyl, 2-benzoxazolyl, 2-benzothiazolyl, 5-benzothiadiazolyl, 2-benzimidazolyl, 5-benzimidazolyl, and 1-isoquinolyl, and 5-isoquinolyl; 2-methylphenyl, 3-methylphenyl, 4-methylphenyl, 2,4-dimethylphenyl, 3,5-dimethylphenyl, 2,6-dimethylphenyl, 2,4,6-trimethylphenyl, 2-ethylphenyl, 3-ethylphenyl, 4-ethylphenyl, 2,4-diethylphenyl, 3,5-diethylphenyl, 2,6-diethylphenyl, 2,4,6-triethylphenyl, 2-propylphenyl, 3-propylphenyl, 4-propylphenyl, 2,4-, 3,5- and 2,6-dipropylphenyl, 2,4,6-tripropylphenyl, 2-isopropylphenyl, 3-isopropylphenyl, 4-isopropylphenyl, 2,4-diisopropylphenyl, 3,5-diisopropylphenyl, 2,6-diisopropylphenyl, 2,4,6-triisopropylphenyl, 2-butylphenyl, 3-butylphenyl, 4-butylphenyl, 2,4-dibutylphenyl, 3,5-dibutylphenyl, 2,6-dibutylphenyl, 2,4,6-tributylphenyl, 2-isobutylphenyl, 3-isobutylphenyl, 4-isobutylphenyl, 2,4-diisobutylphenyl, 3,5-diisobutylphenyl, 2,6-diisobutylphenyl, 2,4,6-triisobutylphenyl, 2-butylphenyl, 3-butylphenyl, 4-sec-butylphenyl, 2,4-, 3,5- and 2,6-di-sec-butylphenyl and 2,4,6-tri-sec-butylphenyl; 2-methoxyphenyl, 3-methoxyphenyl, 4-methoxyphenyl, 2,4-dimethoxyphenyl, 3,5-dimethoxyphenyl, 2,6-dimethoxyphenyl, 2,4,6-trimethoxyphenyl, 2-ethoxyphenyl, 3-ethoxyphenyl, 4-ethoxyphenyl, 2,4-diethoxyphenyl, 3,5-diethoxyphenyl, 2,6-diethoxyphenyl, 2,4,6-triethoxyphenyl, 2-propoxyphenyl, 3-propoxyphenyl, 4-propoxyphenyl, 2,4-dipropoxyphenyl, 3,5-dipropoxyphenyl, 2,6-dipropoxyphenyl, 2-isopropoxyphenyl, 3-isopropoxyphenyl, 4-isopropoxyphenyl, 2,4-diisopropoxyphenyl, 2,6-diisopropoxyphenyl, 2-butoxyphenyl, 3-butoxyphenyl, and 4-butoxyphenyl; 2-chlorophenyl, 3-chlorophenyl, 4-chlorophenyl, 2,4-dichlorophenyl, 3,5-dichlorophenyl, and 2,6-dichlorophenyl; 2-hydroxyphenyl, 3-hydroxyphenyl, 4-hydroxyphenyl, 2,4-dichlorophenyl, 3,5-dichlorophenyl, and 2,6-dichlorophenyl; 2-hydroxyphenyl, 3-hydroxyphenyl, 4-hydroxyphenyl, 2,4-dihydroxyphenyl, 3,5-dihydroxyphenyl, and 2,6-dihydroxyphenyl; 2-cyanophenyl, 3-cyanophenyl, and 4-cyanophenyl; 3-carboxyphenyl and 4-carboxyphenyl; 3-carboxyamidophenyl, 4-carboxyamidophenyl, 3-N-methylcarboxamidophenyl, 4-N-methylcarboxamidophenyl, 3-N-ethylcarboxamidophenyl, and 4-N-ethylcarboxamidophenyl; 3-acetylaminophenyl, 4-acetylaminophenyl, 3-propionylaminophenyl, 4-propionylaminophenyl, 3-butyrylaminophenyl, and 4-butyrylaminophenyl; 3-phenylaminophenyl, 4-N-phenylaminophenyl, 3-(o-tolyl)aminophenyl, 4-N-(o-tolyl)aminophenyl, 3-(m-tolyl)aminophenyl, 4-N-(m-tolyl)aminophenyl, 3-(p-tolyl)aminophenyl, and 4-(p-tolyl)aminophenyl; 3-(2-pyridyl)aminophenyl, 4-(2-pyridyl)aminophenyl, 3-(3-pyridyl)aminophenyl, 4-(3-pyridyl)aminophenyl, 3-(4-pyridyl)aminophenyl, 4-(4-pyridyl)aminophenyl, 3-(2-pyrimidyl)aminophenyl, 4-(2-pyrimidyl)aminophenyl, and 4-(4-pyrimidyl)aminophenyl; 4-phenylazophenyl, 4-(1-naphthylazo)phenyl, 4-(2-naphthylazo)phenyl, 4-(4-naphthylazo)phenyl, 4-(2-pyridylazo)phenyl, 4-(3-pyridylazo)phenyl, 4-(4-pyridylazo)phenyl, 4-(2-pyrimidylazo)phenyl, 4-(4-pyrimidylazo)phenyl and 4-(5-pyrimidylazo)phenyl; and phenoxy, phenylthio, 2-naphthoxy, 2-naphthylthio, 2-pyridyloxy, 3-pyridyloxy, 4-pyridyloxy, 2-pyridylthio, 3-pyridylthio, 4-pyridylthio, 2-pyrimidyloxy, 4-pyrimidyloxy, 5-pyrimidyloxy, 2-pyrimidylthio, 4-pyrimidylthio, and 5-pyrimidylthio; and wherein the polymerizable group is selected from: vinyl; allyl; 4-styryl acroyl; epoxide; oxetane; cyclic-carbonate; methacroyl; acrylonitrile; isocyanate; isothiocyanate; epoxides; strained ring olefins; $(-CH_2)_n SiCl_3$; $(-CH_2)_n Si(OCH_2CH_3)_3$; $(-CH_2)_n Si(OCH_3)_3$, wherein $n$ is an integer number from 0 to 25; and compounds having the following structures:

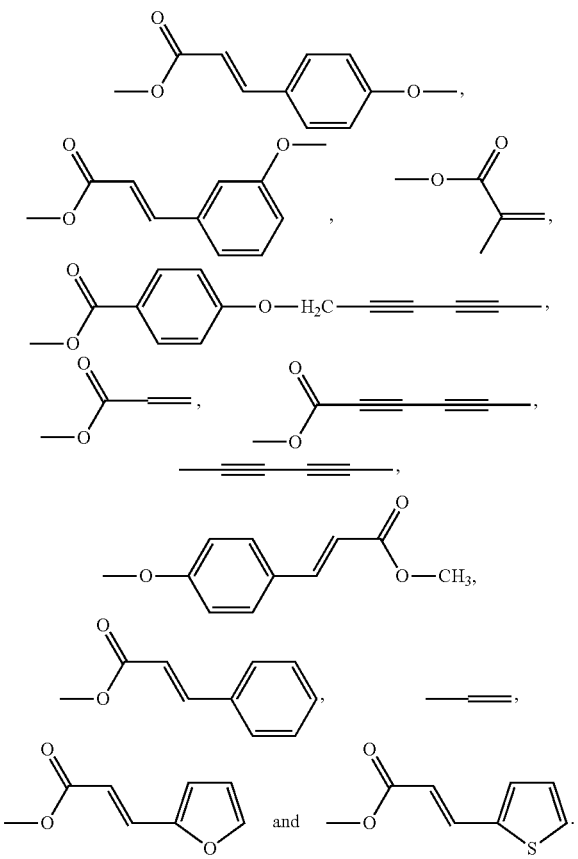

4. A charge-transport material, comprising:
a coronene diimide charge-transport material monomer having a structure of Formula 1:

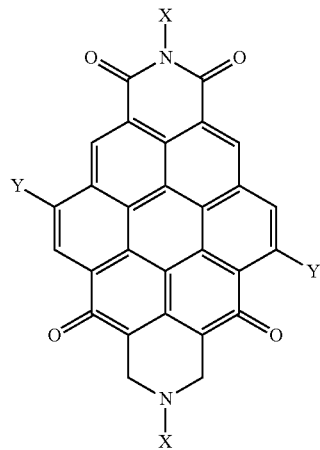

Formula 1 wherein Y is selected from one or more of: —C≡C-aryl; —(C≡C)-$_2$aryl; —(C≡C)-$_3$aryl; —HC=CH-aryl; —(HC=CH)$_2$-aryl; and —(HC=CH)$_3$-aryl, and wherein the charge-transport material absorbs near-infrared energy from about 700 to 1500 nm;

wherein X in each instance can be independently selected from the following: a polymerizable group; 3,4,5-trialkoxyphenyl; 3,4,5-trialkylphenyl; 3,4,5-tri-perfluorinated-alkylphenyl; 3,4,5-tri-perfluorinated-alkoxyphenyl; 3,4,5-tri-oligomeric-ether-substituted phenyl; 3,4,5-trialkoxybenzyl; 3,4,5-trialkylbenzyl; 3,4,5-tri-perfluorinated-alkyl benzyl; 3,4,5-tri-perfluorinated-alkoxy benzyl; 3,4,5-tri-oligomeric-ether-substituted benzyl; 3,4-dialkoxyphenyl, 3,4-dialkylphenyl; 3,4-di-perfluorinated-alkylphenyl; 3,4-di-perfluorinated-alkoxyphenyl; 3,4-di-oligomeric-ether-substituted phenyl; 3,4-dialkoxybenzyl; 3,4-dialkylbenzyl; 3,4-di-perfluorinated-alkylbenzyl; 3,4-di-perfluorinated-alkoxybenzyl; 3,4-di-oligomeric-ether-substituted benzyl; 3,5-dialkoxyphenyl; 3,5-dialkylphenyl; 3,5-di-perfluorinated-alkyl phenyl; 3,5-di-perfluorinated-alkoxy phenyl; 3,5-di-oligomeric-ether-substituted phenyl; 3,5-dialkoxybenzyl; 3,5-dialkylbenzyl; 3,5-di-perfluorinated-alkyl benzyl; 3,5-di-oligomeric-ether-substituted benzyl;

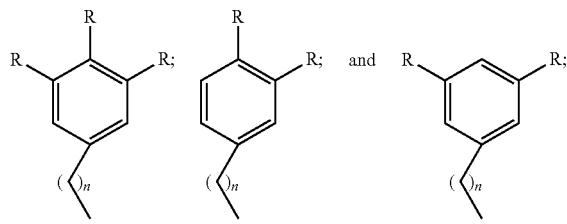

wherein R in each instance can be independently selected from the following: a polymerizable group, an alkyl, an alkoxy, a perfluorinated alkyl, a perfluorinated alkoxy, an oligomeric-ether, wherein R denotes dendritic units, and wherein the subscript n is a number from 0 to 20;

wherein the polymerizable group is selected from: vinyl; allyl; 4-styryl; acroyl; epoxide; oxetane; cyclic-carbonate; methacroyl; acrylonitrile; isocyanate; isothiocyanate; epoxides; strained ring olefins; (—CH$_2$)$_n$SiCl$_3$; (—CH$_2$)$_n$Si(OCH$_2$CH$_3$)$_3$; (—CH$_2$)$_n$Si(OCH$_3$)$_3$, wherein $_n$ is an integer number from 0 to 25; and compounds having the following structures:

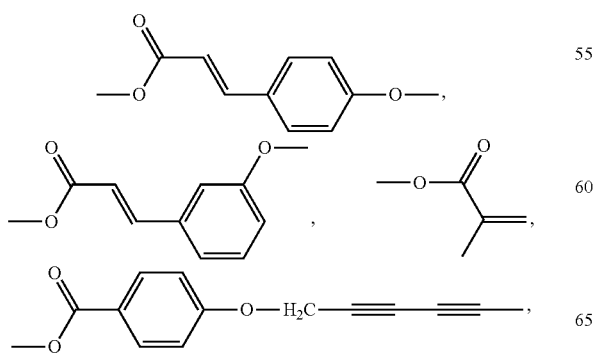

-continued

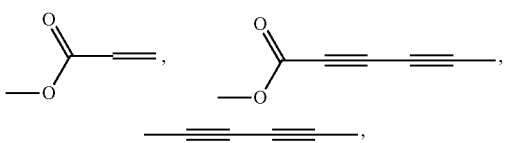

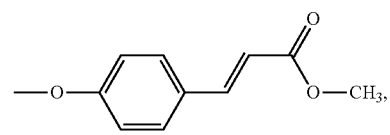

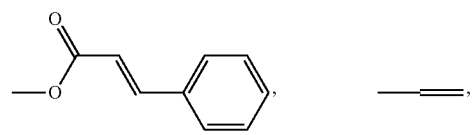

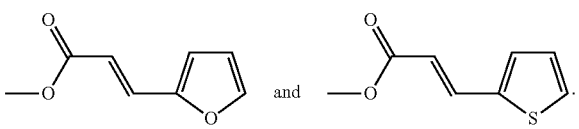

5. A charge-transport material, comprising:

a coronene diimide charge-transport material monomer having a structure of Formula 1:

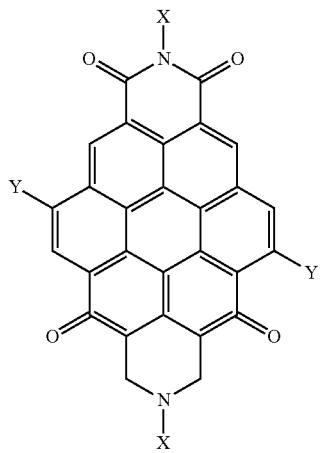

Formula 1 wherein Y is an acceptor;

wherein X in each instance can be independently selected from the following: a polymerizable group; hydrogen; halogens; C$_1$-C$_{18}$-alkyl; aryloxy, arylthio, heteroaryloxy and heteroarylthio; and wherein X and Y each independently can be independently substituted by one of the following: C$_1$-C$_{10}$-alkyl, C$_1$-C$_6$-alkoxy, cyano, and carboxyl;

wherein each acceptor is selected from one or more of the following:

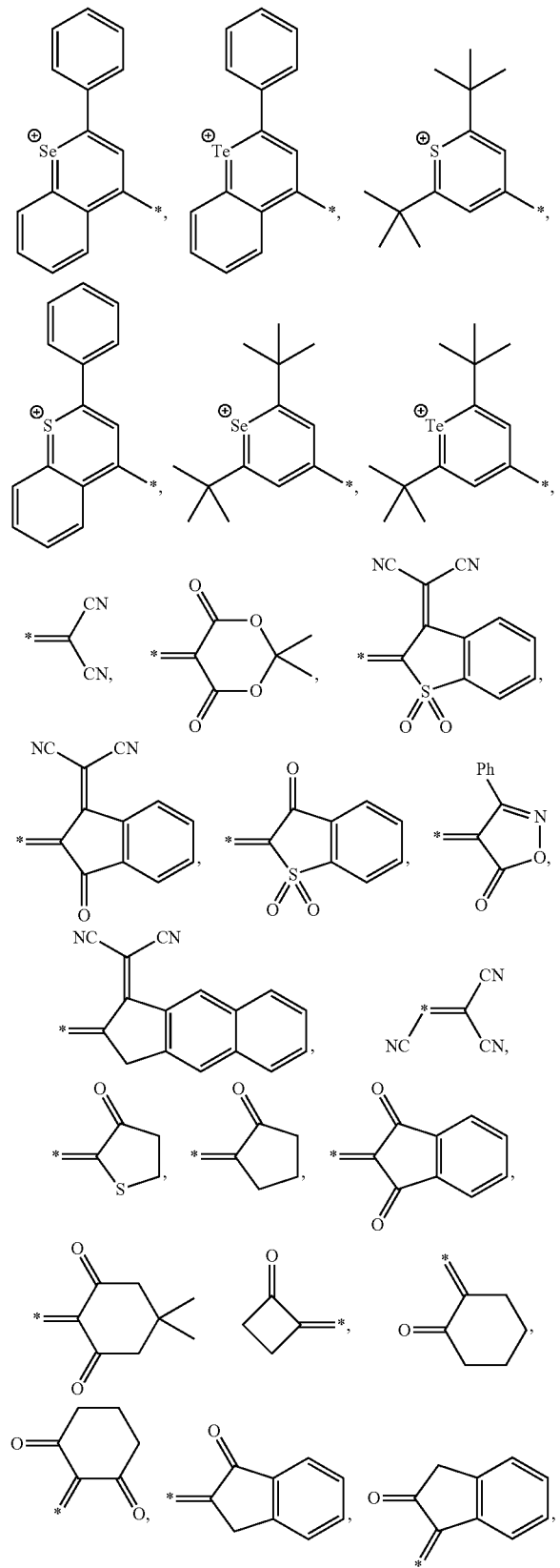

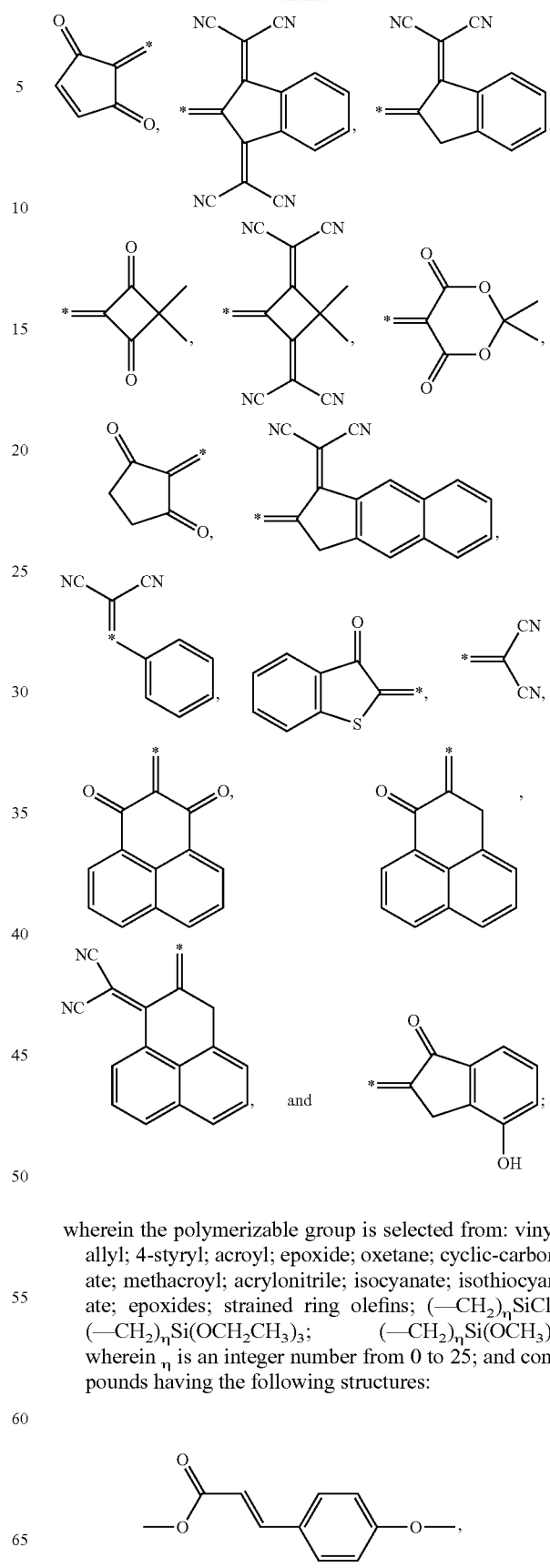

wherein the polymerizable group is selected from: vinyl; allyl; 4-styryl; acroyl; epoxide; oxetane; cyclic-carbonate; methacroyl; acrylonitrile; isocyanate; isothiocyanate; epoxides; strained ring olefins; (—CH$_2$)$_n$SiCl$_3$; (—CH$_2$)$_n$Si(OCH$_2$CH$_3$)$_3$; (—CH$_2$)$_n$Si(OCH$_3$)$_3$, wherein $n$ is an integer number from 0 to 25; and compounds having the following structures:

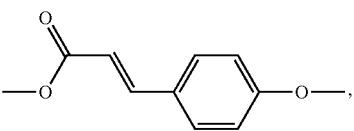

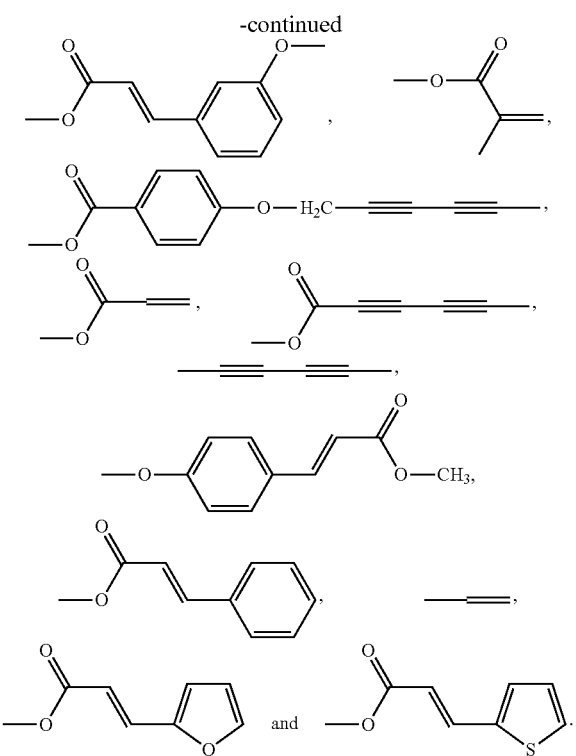

6. A charge-transport material, comprising:
a coronene diimide charge-transport material monomer having a structure of Formula 1:

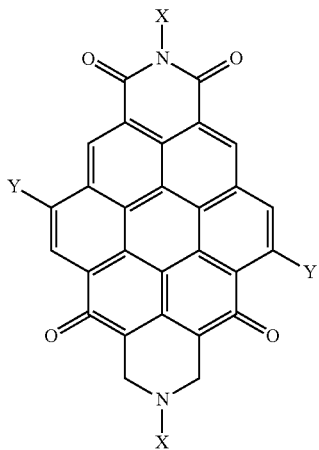

Formula 1 wherein Y is an acceptor; and
wherein X in each instance can be independently selected from the following: a polymerizable group; methyl, ethyl, propyl, isopropyl, butyl, isobutyl, sec-butyl, tert-butyl, pentyl, isopentyl, neopentyl, tert-pentyl, hexyl, 2-methylpentyl, heptyl, 1-ethylpentyl, octyl, 2-ethylhexyl, isooctyl, nonyl, isononyl, decyl, isodecyl, undecyl, dodecyl, tridecyl, isotridecyl, tetradecyl, pentadecyl, hexadecyl, heptadecyl, octadecyl, nonadecyl and eicosyl; 2-methoxyethyl, 2-ethoxyethyl, 2-propoxyethyl, 2-isopropoxyethyl, 2-butoxyethyl, 2-methoxypropyl, 3-methoxypropyl, 2-ethoxypropyl, 3-ethoxypropyl, 2-propoxypropyl, 3-propoxypropyl, 2-butoxypropyl, 3-butoxypropyl, 2-methoxybutyl, 4-methoxybutyl, 2-ethoxybutyl, 4-ethoxybutyl, 2-propoxybutyl, 4-propoxybutyl, 3,6-dioxaheptyl, 3,6-dioxaoctyl, 4,8-dioxanonyl, 3,7-dioxaoctyl, 3,7-dioxanonyl, 4,7-dioxaoctyl, 4,7-dioxanonyl, 2- and 4-butoxybutyl, 4,8-dioxadecyl, 3,6,9-trioxadecyl, 3,6,9-trioxaundecyl, 3,6,9-trioxadodecyl, 3,6,9,12-tetraoxamidecyl and 3,6,9,12-tetraoxatetradecyl; 2-methylthioethyl, 2-ethylthioethyl, 2-propylthioethyl, 2-isopropylthioethyl, 2-butylthioethyl, 2-methylthiopropyl, 3-methylthiopropyl, 2-ethylthiopropyl, 3-ethylthiopropyl, 2-propylthiopropyl, 3-propylthiopropyl, 2-butylthiopropyl, 3-butylthiopropyl, 2-methylthiobutyl, 4-methylthiobutyl, 2-butylthiopropyl, 4-ethylthiobutyl, 2-propylthiobutyl, 4-propylthiobutyl, 3,6-dithiaheptyl, 3,6-dithiaoctyl, 4,8-dithianonyl, 3,7-dithiaoctyl, 3,7-dithianonyl, 4,7-dithiaoctyl, 4,7-dithianonyl, 2-butylthiobutyl, 4-butylthiobutyl, 4,8-dithiadecyl, 3,6,9-trithiadecyl, 3,6,9-trithiaundecyl, 3,6,9-trithiadodecyl, 3,6,9,12-tetrathiamidecyl, 3,6,9,12-tetrathiatetradecyl; 2-monomethylaminoethyl, 2-monoethylaminoethyl, 2-dimethylaminoethyl, 2-dimethylaminopropyl, 3-dimethylaminopropyl, 3-monoisopropylaminopropyl, 2-monopropylaminobutyl, 4-monopropylaminobutyl, 2-dimethylaminobutyl, 4-dimethylaminobutyl, 6-methyl-3,6-diazaheptyl, 3,6-dimethyl-3,6-diazaheptyl, 3,6-diazaoctyl, 3,6-dimethyl-3,6-diazaoctyl, 9-methyl-3,6,9-triazadecyl, 3,6,9-trimethyl-3,6,9-triazadecyl, 3,6,9-triazaundecyl, 3,6,9-trimethyl-3,6,9-triazaundecyl, 12-methyl-3,6,9,12-tetraazatridecyl and 3,6,9,12-tetramethyl-3,6,9,12-tetraazatridecyl; propan-2-on-1-yl, butan-3-on-1-yl, butan-3-on-2-yl and 2-ethylpentan-3-on-1-yl; 2-methylsulfonylethyl, 2-ethylsulfonylethyl, 2-propylsulfonylethyl, 2-isopropylsulfonylethyl, 2-butylsulfonylethyl, 2-methylsulfonylpropyl, 3-methylsulfonylpropyl, 2-ethylsulfonylpropyl, 3-ethylsulfonylpropyl, 2-propylsulfonylpropyl, 3-propylsulfonylpropyl, 2-butylsulfonylpropyl, 3-butylsulfonylpropyl, 2-methylsulfonylbutyl, 4-methylsulfonylbutyl, 2-ethylsulfonylbutyl, 4-ethylsulfonylbutyl, 2-propylsulfonylbutyl, 4-propylsulfonylbutyl, and 4-butylsulfonylbutyl; carboxymethyl, 2-carboxyethyl, 3-carboxypropyl, 4-carboxybutyl, 5-carboxypentyl, 6-carboxyhexyl, 8-carboxyoctyl, 10-carboxydecyl, 12-carboxydodecyl and 14-carboxytetradecyl; sulfomethyl, 2-sulfoethyl, 3-sulfopropyl, 4-sulfobutyl, 5-sulfopentyl, 6-sulfohexyl, 8-sulfooctyl, 10-sulfodecyl, 12-sulfododecyl and 14-sulfotetradecyl; 2-hydroxyethyl, 2-hydroxypropyl, 1-hydroxyprop-2-yl, 2-hydroxybutyl, 4-hydroxybutyl, 1-hydroxybut-2-yl and 8-hydroxy-4-oxaoctyl, 2-cyanoethyl, 3-cyanopropyl, 2-methyl-3-ethyl-3-cyanopropyl, 7-cyano-7-ethylheptyl and 4-methyl-7-methyl-7-cyanoheptyl; methoxy, ethoxy, propoxy, isopropoxy, butoxy, isobutoxy, sec-butoxy, tert-butoxy, pentoxy, isopentoxy, neopentoxy, tert-pentoxy and hexoxy; carbamoyl, methylaminocarbonyl, ethylaminocarbonyl, propylaminocarbonyl, butylaminocarbonyl, pentylaminocarbonyl, hexylaminocarbonyl, heptylaminocarbonyl, octylaminocarbonyl, nonylaminocarbonyl, decylaminocarbonyl and phenylaminocarbonyl; formylamino, acetylamino, propionylamino and benzoylamino; chlorine, bromine and iodine; phenylazo, 2-naphthylazo, 2-pyridylazo and 2-pyrimidylazo; cyclopentyl, cyclohexyl, cycloheptyl, cyclooctyl, 2-dioxanyl, 4-morpholinyl, 2-tetrahydrofuryl, 3-tetrahydrofuryl, 1-pyrrolidinyl, 2-pyrrolidinyl, 3-pyrrolidinyl and 1-piperidyl, 2-piperidyl, 3-piperidyl, and 4-piperidyl;

phenyl, 2-naphthyl, 2-pyrryl, and 3-pyrryl, 2-pyridyl, 3-pyridyl, 4-pyridyl, 2-pyrimidyl, 4-pyrimidyl, 5-pyrimidyl, 3-pyrazolyl, 4-pyrazolyl, 5-pyrazolyl, 2-imidazolyl, 4-imidazolyl, 5-imidazolyl, 2-thiazolyl, 4-thiazolyl, 5-thiazolyl, 3-(1,2,4-triazyl), 2-(1,3,5-triazyl), 6-quinaldyl, 3-quinolinyl, 5-quinolinyl, 6-quinolinyl, 8-quinolinyl, 2-benzoxazolyl, 2-benzothiazolyl, 5-benzothiadiazolyl, 2-benzimidazolyl, 5-benzimidazolyl, and 1-isoquinolyl, and 5-isoquinolyl; 2-methylphenyl, 3-methylphenyl, 4-methylphenyl, 2,4-dimethylphenyl, 3,5-dimethylphenyl, 2,6-dimethylphenyl, 2,4,6-trimethylphenyl, 2-ethylphenyl, 3-ethylphenyl, 4-ethyl phenyl, 2,4-diethylphenyl, 3,5-diethylphenyl, 2,6-diethylphenyl, 2,4,6-triethylphenyl, 2-propylphenyl, 3-propylphenyl, 4-propylphenyl, 2,4-, 3,5- and 2,6-dipropylphenyl, 2,4,6-tripropylphenyl, 2-isopropylphenyl, 3-isopropylphenyl, 4-isopropylphenyl, 2,4-diisopropylphenyl, 3,5-diisopropylphenyl, 2,6-diisopropylphenyl, 2,4,6-triisopropylphenyl, 2-butylphenyl, 3-butylphenyl, 4-butylphenyl, 2,4-dibutylphenyl, 3,5-dibutylphenyl, 2,6-dibutylphenyl, 2,4,6-tributylphenyl, 2-isobutylphenyl, 3-isobutylphenyl, 4-isobutylphenyl, 2,4-diisobutylphenyl, 3,5-diisobutylphenyl, 2,6-diisobutylphenyl, 2,4,6-triisobutylphenyl, 2-butylphenyl, 3-butylphenyl, 4-sec-butylphenyl, 2,4-, 3,5- and 2,6-di-sec-butylphenyl and 2,4,6-tri-sec-butylphenyl; 2-methoxyphenyl, 3-methoxyphenyl, 4-methoxyphenyl, 2,4-dimethoxyphenyl, 3,5-dimethoxyphenyl, 2,6-dimethoxyphenyl, 2,4,6-trimethoxyphenyl, 2-ethoxyphenyl, 3-ethoxyphenyl, 4-ethoxyphenyl, 2,4-diethoxyphenyl, 3,5-diethoxyphenyl, 2,6-diethoxyphenyl, 2,4,6-triethoxyphenyl, 2-propoxyphenyl, 3-propoxyphenyl, 4-propoxyphenyl, 2,4-dipropoxyphenyl, 3,5-dipropoxyphenyl, 2,6-dipropoxyphenyl, 2-isopropoxyphenyl, 3-isopropoxyphenyl, 4-isopropoxyphenyl, 2,4-diisopropoxyphenyl, 2,6-diisopropoxyphenyl, 2-butoxyphenyl, 3-butoxyphenyl, and 4-butoxyphenyl; 2-chlorophenyl, 3-chlorophenyl, 4-chlorophenyl, 2,4-dichlorophenyl, 3,5-dichlorophenyl, and 2,6-dichlorophenyl; 2-hydroxyphenyl, 3-hydroxyphenyl, 4-hydroxyphenyl, 2,4-dichlorophenyl, 3,5-dichlorophenyl, and 2,6-dichlorophenyl; 2-hydroxyphenyl, 3-hydroxyphenyl, 4-hydroxyphenyl, 2,4-dihydroxyphenyl, 3,5-dihydroxyphenyl, and 2,6-dihydroxyphenyl; 2-cyanophenyl, 3-cyanophenyl, and 4-cyanophenyl; 3-carboxyphenyl and 4-carboxyphenyl; 3-carboxyamidophenyl, 4-carboxyamidophenyl, 3-N-methylcarboxamidophenyl, 4-N-methylcarboxamidophenyl, 3-N-ethylcarboxamidophenyl, and 4-N-ethylcarboxamidophenyl; 3-acetylaminophenyl, 4-acetylaminophenyl, 3-propionylaminophenyl, 4-propionylaminophenyl, 3-butyrylaminophenyl, and 4-butyrylaminophenyl; 3-phenylaminophenyl, 4-N-phenylaminophenyl, 3-(o-tolyl)aminophenyl, 4-N-(o-tolyl)aminophenyl, 3-(m-tolyl)aminophenyl, 4-N-(m-tolyl)aminophenyl, 3-(p-tolyl)aminophenyl, and 4-(p-tolyl)aminophenyl; 3-(2-pyridyl)aminophenyl, 4-(2-pyridyl)aminophenyl, 3-(3-pyridyl)aminophenyl, 4-(3-pyridyl)aminophenyl, 3-(4-pyridyl)aminophenyl, 4-(4-pyridyl)aminophenyl, 3-(2-pyrimidyl)aminophenyl, 4-(2-pyrimidyl)aminophenyl, and 4-(4-pyrimidyl)aminophenyl; 4-phenylazophenyl, 4-(1-naphthylazo)phenyl, 4-(2-naphthylazo)phenyl, 4-(4-naphthylazo)phenyl, 4-(2-pyridylazo)phenyl, 4-(3-pyridylazo)phenyl, 4-(4-pyridylazo)phenyl, 4-(2-pyrimidylazo) phenyl, 4-(4-pyrimidylazo)phenyl and 4-(5-pyrimidylazo)phenyl; and phenoxy, phenylthio, 2-naphthoxy, 2-naphthylthio, 2-pyridyloxy, 3-pyridyloxy, 4-pyridyloxy, 2-pyridylthio, 3-pyridylthio, 4-pyridylthio, 2-pyrimidyloxy, 4-pyrimidyloxy, 5-pyrimidyloxy, 2-pyrimidylthio, 4-pyrimidylthio, and 5-pyrimidylthio;

wherein each acceptor is selected from one or more of the following:

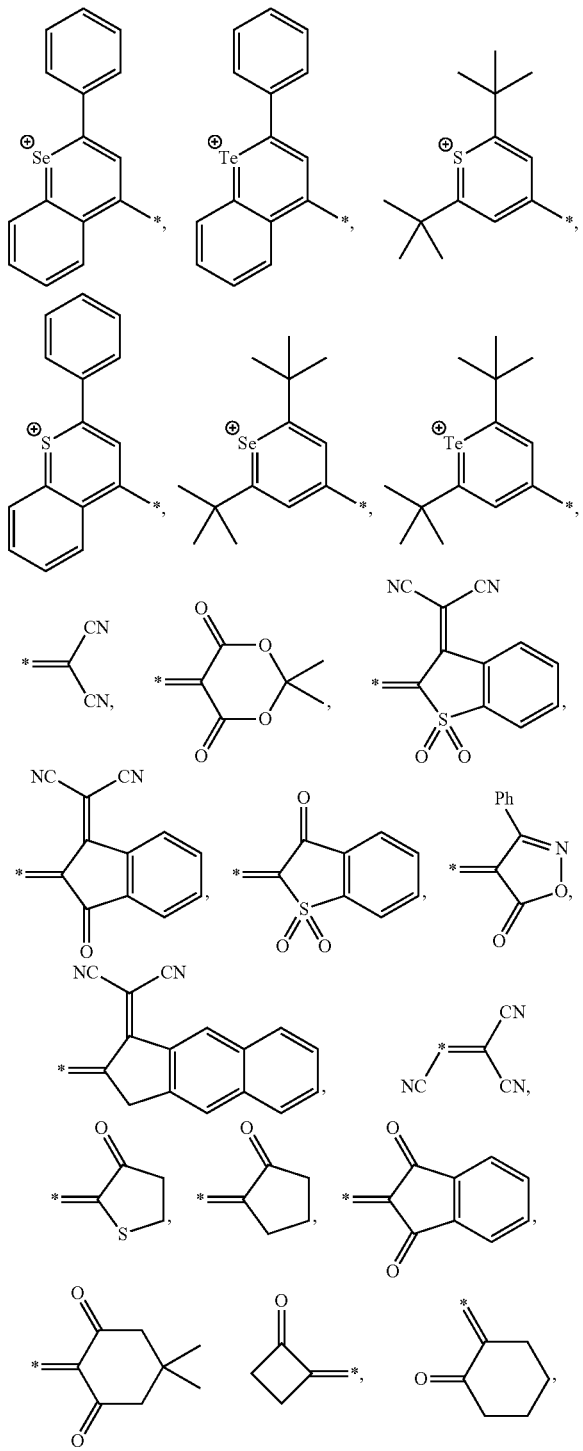

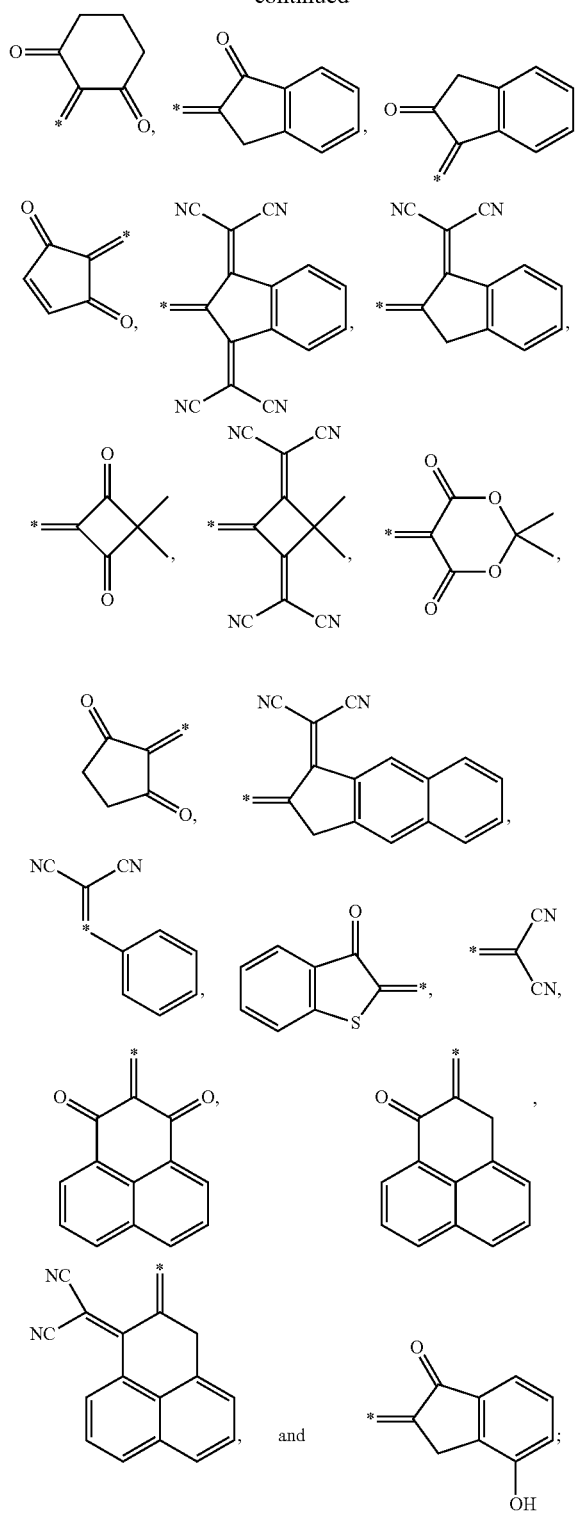

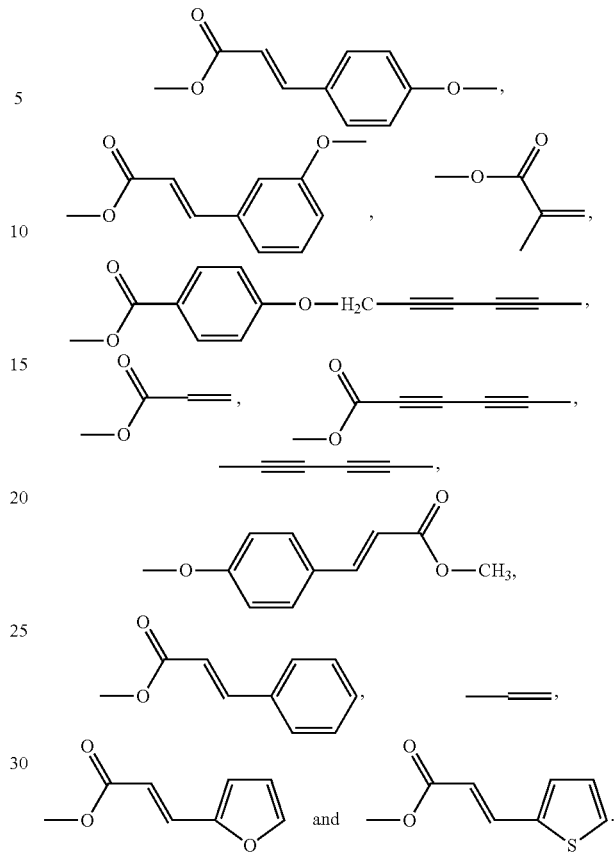

wherein the polymerizable group is selected from: vinyl; allyl; 4-styryl; acroyl; epoxide; oxetane; cyclic-carbonate; methacroyl; acrylonitrile; isocyanate; isothiocyanate; epoxides; strained ring olefins; $(-CH_2)_nSiCl_3$; $(-CH_2)_nSi(OCH_2CH_3)_3$; $(-CH_2)_nSi(OCH_3)_3$, wherein $n$ is an integer number from 0 to 25; and compounds having the following structures:

7. A polymer comprising a monomer selected from one of: the Formula 1 monomer of claim 1, the Formula 1 monomer of claim 2, the Formula 1 monomer of claim 3, the Formula 1 monomer of claim 4, the Formula 1 monomer of claim 5, and the Formula 1 monomer of claim 6.

8. A homopolymer comprising a monomer selected from one of: the Formula 1 monomer of claim 1, the Formula 1 monomer of claim 2, the Formula 1 monomer of claim 3, the Formula 1 monomer of claim 4, the Formula 1 monomer of claim 5, and the Formula 1 monomer of claim 6.

9. A copolymer comprising a monomer selected from one of: the Formula 1 monomer of claim 1, the Formula 1 monomer of claim 2, the Formula 1 monomer of claim 3, the Formula 1 monomer of claim 4, the Formula 1 monomer of claim 5, and the Formula 1 monomer of claim 6.

10. A device, comprising:
   a polymer including a compound selected from one of: the Formula 1 monomer of claim 1, the Formula 1 monomer of claim 2, the Formula 1 monomer of claim 3, the Formula 1 monomer of claim 4, the Formula 1 monomer of claim 5, and the Formula 1 monomer of claim 6.

11. The device of claim 10, wherein the polymer is included in a structure selected from: electroluminescent (EL) devices, photovoltaic cells, light-emitting diodes, field-effect transistors, phototransistors, radio-frequency ID tags, semiconductor devices, photoconductive diodes, metal-semiconductor junctions, p-n junction diodes, p-n-p-n switching devices, photodetectors, optical sensors, phototransducers, bipolar junction transistors (BJTs), heterojunction bipolar translators, switching transistors, charge-transfer devices, thin film transistors, organic radiation detectors, infra-red emitters, tunable microcavities for variable output wave- 12. A polymer layer, comprising:
a plurality of layers, wherein each layer includes a monomer having one or more central aromatic cores, wherein the central aromatic cores in the layers are stacked substantially over one another to form a one-dimensional charge transport column along the stacked central aromatic cores, wherein the monomer includes a compound selected from one of the Formula 1 monomer of claim 1, the Formula 1 monomer of claim 2, the Formula 1 monomer of claim 3, the Formula 1 monomer of claim 4, the Formula 1 monomer of claim 5, and the Formula 1 monomer of claim 6.

13. A device, comprising:
a first electrode;
a hole-transport layer disposed adjacent the first electrode;
an electron-transport layer disposed adjacent the hole-transport layer, wherein the electron-transport material is selected from one of the Formula 1 monomer of claim 1, the Formula 1 monomer of claim 2, the Formula 1 monomer of claim 3, the Formula 1 monomer of claim 4, the Formula 1 monomer of claim 5, and the Formula 1 monomer of claim 6; and
a second electrode disposed adjacent the electron-transport layer.

14. The device of claim 13, wherein the device is an organic light-emitting diode.

15. The device of claim 13, wherein the device is an organic photovoltaic cell.

16. An organic photovoltaic cell comprising:
a first electrode;
a hole-transport layer disposed adjacent the first electrode;
an electron-transport layer disposed adjacent the hole-transport layer, wherein the electron-transport material is selected from one of the Formula 1 monomer of claim 1, the Formula 1 monomer of claim 2, the Formula 1 monomer of claim 3, the Formula 1 monomer of claim 4, the Formula 1 monomer of claim 5, and the Formula 1 monomer of claim 6;
an exciton blocking layer disposed adjacent the electron-transport layer; and
a second electrode disposed adjacent the exciton blocking layer.

17. An organic field-effect transistor comprising:
a substrate;
a gate electrode disposed on a first side of the substrate;
a gate insulator disposed on a second side of the substrate;
a source electrode disposed on a first portion of the gate insulator;
a drain electrode disposed on a second portion of the gate insulator; and
an electron-transport layer disposed on a third portion of the gate insulator, the source electrode, and the drain electrode, wherein the electron-transport material is selected from one of the Formula 1 monomer of claim 1, the Formula 1 monomer of claim 2, the Formula 1 monomer of claim 3.

18. A material, comprising:
a mixture of components comprising a monomer, a polymer including the monomer, a co-polymer including the monomer, a homopolymer including the monomer, and combinations thereof; wherein the monomer is selected from one of the Formula 1 monomer of claim 1, the Formula 1 monomer of claim 2, the Formula 1 monomer of claim 3, the Formula 1 monomer of claim 4, the Formula 1 monomer of claim 5, and the Formula 1 monomer of claim 6; wherein an amount of each monomer present in the mixture is selected to control at least one property of the mixture; and wherein the property is selected from one of: volatility, solubility, crystallinity, melting point, phase transitions, shelf life, charge transport ability, and combinations thereof.

19. A material, comprising:
a mixture of components comprising a compound selected from one of the Formula 1 monomer of claim 1, the Formula 1 monomer of claim 2, the Formula 1 monomer of claim 3, the Formula 1 monomer of claim 4, the Formula 1 monomer of claim 5, and the Formula 1 monomer of claim 6; wherein an amount of each compound present in the mixture is selected to control at least one property of the mixture; wherein the property is selected from one of: volatility, solubility, crystallinity, melting point, phase transitions, shelf life, charge transport ability, and combinations thereof.

20. An organic photovoltaic cell comprising:
a first electrode;
a layer disposed adjacent the first electrode comprising of a blend containing a hole-transport material and an electron-transport material, wherein the electron-transport material is selected from one of the Formula 1 monomer of claim 1, the Formula 1 monomer of claim 2, the Formula 1 monomer of claim 3, the Formula 1 monomer of claim 4, the Formula 1 monomer of claim 5, and the Formula 1 monomer of claim 6; and
a second electrode disposed adjacent the blend layer.

* * * * *

UNITED STATES PATENT AND TRADEMARK OFFICE
CERTIFICATE OF CORRECTION

| | | |
|---|---|---|
| PATENT NO. | : 8,039,625 B2 | Page 1 of 1 |
| APPLICATION NO. | : 11/817156 | |
| DATED | : October 18, 2011 | |
| INVENTOR(S) | : Marder et al. | |

It is certified that error appears in the above-identified patent and that said Letters Patent is hereby corrected as shown below:

Column 46, line 46, the word "haying" should be "having"

Signed and Sealed this
Twenty-eighth Day of February, 2012

David J. Kappos
*Director of the United States Patent and Trademark Office*